(12) United States Patent
Maxwell et al.

(10) Patent No.: US 11,499,230 B2
(45) Date of Patent: *Nov. 15, 2022

(54) METHOD AND APPARATUS FOR FABRICATING FIBERS AND MICROSTRUCTURES FROM DISPARATE MOLAR MASS PRECURSORS

(71) Applicant: Dynetics, Inc., Huntsville, AL (US)

(72) Inventors: James L. Maxwell, Scottsboro, AL (US); Nicholas Webb, Madison, AL (US); James Allen, Huntsville, AL (US)

(73) Assignee: Dynetics, Inc., Huntsville, AL (US)

(*) Notice: Subject to any disclaimer, the term of this patent is extended or adjusted under 35 U.S.C. 154(b) by 0 days.

This patent is subject to a terminal disclaimer.

(21) Appl. No.: 17/194,839

(22) Filed: Mar. 8, 2021

(65) Prior Publication Data
US 2022/0074051 A1 Mar. 10, 2022

Related U.S. Application Data

(63) Continuation of application No. 16/901,421, filed on Jun. 15, 2020, now Pat. No. 10,947,622, which is a
(Continued)

(51) Int. Cl.
C23C 16/48 (2006.01)
C04B 35/622 (2006.01)
(Continued)

(52) U.S. Cl.
CPC ............ C23C 16/483 (2013.01); C04B 35/58 (2013.01); C04B 35/58007 (2013.01);
(Continued)

(58) Field of Classification Search
None
See application file for complete search history.

(56) References Cited

U.S. PATENT DOCUMENTS 2,124,509 A 7/1938 McKenna
2,596,469 A 5/1952 Cooper
(Continued)

FOREIGN PATENT DOCUMENTS

JP 59047424 A 3/1984
JP 1990500758 3/1990
(Continued)

OTHER PUBLICATIONS

Office action for application serial No. JP 2017-529589, with English translation, dated Jul. 3, 2018.
(Continued)

*Primary Examiner* — Shamim Ahmed
*Assistant Examiner* — Bradford M Gates
(74) *Attorney, Agent, or Firm* — Stephen H. Hall; Bradley Arant Boult Cummings LLP

(57) ABSTRACT

The disclosed methods and apparatus improve the fabrication of solid fibers and microstructures. In many embodiments, the fabrication is from gaseous, solid, semi-solid, liquid, critical, and supercritical mixtures using one or more low molar mass precursor(s), in combination with one or more high molar mass precursor(s). The methods and systems generally employ the thermal diffusion/Soret effect to concentrate the low molar mass precursor at a reaction zone, where the presence of the high molar mass precursor contributes to this concentration, and may also contribute to the reaction and insulate the reaction zone, thereby achieving higher fiber growth rates and/or reduced energy/heat expenditures together with reduced homogeneous nucleation. In some embodiments, the invention also relates to the permanent or semi-permanent recording and/or reading of information on or within fabricated fibers and microstructures. In some embodiments, the invention also relates to the fabrication of certain functionally-shaped fibers and microstruc-
(Continued)

tures. In some embodiments, the invention may also utilize laser beam profiling to enhance fiber and microstructure fabrication.

20 Claims, 45 Drawing Sheets

Related U.S. Application Data continuation of application No. 16/165,535, filed on Oct. 19, 2018, now Pat. No. 10,683,574, which is a continuation of application No. 14/827,752, filed on Aug. 17, 2015, now Pat. No. 10,167,555.

(60) Provisional application No. 62/074,739, filed on Nov. 4, 2014, provisional application No. 62/074,703, filed on Nov. 4, 2014, provisional application No. 62/038,705, filed on Aug. 18, 2014.

(51) Int. Cl.

| | | |
|---|---|---|
| *D01F 9/127* | (2006.01) | |
| *C04B 35/58* | (2006.01) | |
| *D04H 1/4242* | (2012.01) | |
| *C23C 16/44* | (2006.01) | |
| *C23C 16/08* | (2006.01) | |
| *C23C 16/20* | (2006.01) | |
| *C23C 16/50* | (2006.01) | |
| *C23C 16/52* | (2006.01) | |
| *D01F 8/18* | (2006.01) | |

(52) U.S. Cl.
CPC .. *C04B 35/58028* (2013.01); *C04B 35/62272* (2013.01); *C04B 35/62277* (2013.01); *C04B 35/62286* (2013.01); *C23C 16/08* (2013.01); *C23C 16/20* (2013.01); *C23C 16/4418* (2013.01); *C23C 16/486* (2013.01); *C23C 16/487* (2013.01); *C23C 16/50* (2013.01); *C23C 16/52* (2013.01); *D01F 8/18* (2013.01); *D01F 9/127* (2013.01); *D04H 1/4242* (2013.01); *C04B 2235/5296* (2013.01)

(56) References Cited

U.S. PATENT DOCUMENTS

| | | | |
|---|---|---|---|
| 3,253,886 A | 5/1966 | Lamprey et al. | |
| 3,269,802 A | 8/1966 | Wainer et al. | |
| 3,305,326 A | 2/1967 | Longo | |
| 3,340,020 A | 9/1967 | Neuenschwander et al. | |
| 3,352,951 A | 11/1967 | Sara | |
| 3,369,920 A | 2/1968 | Bourdeau et al. | |
| 3,399,980 A | 9/1968 | Bourdeau | |
| 3,419,415 A | 12/1968 | Dittrich | |
| 3,432,336 A | 3/1969 | Langrod et al. | |
| 3,455,682 A | 7/1969 | Barbaras et al. | |
| 3,458,341 A | 7/1969 | Diefendorf | |
| 3,472,709 A | 10/1969 | Quatinetz et al. | |
| 3,726,643 A | 4/1973 | Merzhanov et al. | |
| 3,758,662 A | 9/1973 | Tobin et al. | |
| 3,791,852 A | 2/1974 | Bunshah | |
| 3,867,191 A | 2/1975 | Galasso et al. | |
| 3,892,583 A | 7/1975 | Winter et al. | |
| 3,932,594 A | 1/1976 | Gortsema | |
| 3,979,500 A | 9/1976 | Sheppard et al. | |
| 4,067,742 A | 1/1978 | Fletcher et al. | |
| 4,180,428 A | 12/1979 | Riley et al. | |
| 4,190,439 A | 2/1980 | Gortsema | |
| 4,238,547 A | 12/1980 | Economy et al. | |
| 4,278,729 A | 7/1981 | Gibson et al. | |
| 4,283,376 A | 9/1981 | Ohsaka et al. | |
| 4,343,836 A | 8/1982 | Newkirk et al. | |
| 4,515,763 A | 5/1985 | Boudart et al. | |
| 4,604,367 A | 8/1986 | Takamizawa et al. | |
| 4,752,456 A | 6/1988 | Yoda et al. | |
| 4,784,839 A | 11/1988 | Bachelard et al. | |
| 4,812,301 A | 3/1989 | Davidson et al. | |
| 4,851,262 A | 7/1989 | McFeaters | |
| 5,169,572 A | 12/1992 | Matthews | |
| 5,336,360 A | 8/1994 | Nordine | |
| 5,340,532 A | 8/1994 | Bergstrom | |
| 5,380,688 A | 1/1995 | Dunmead et al. | |
| 5,567,662 A | 10/1996 | Dunmead et al. | |
| 5,780,154 A | 7/1998 | Okano et al. | |
| 5,786,023 A | 7/1998 | Maxwell et al. | |
| 5,997,832 A | 12/1999 | Lieber et al. | |
| 6,040,008 A | 3/2000 | Sacks | |
| 6,203,904 B1 | 3/2001 | Sacks | |
| 6,344,232 B1 | 2/2002 | Jones et al. | |
| 6,482,262 B1 | 11/2002 | Elers et al. | |
| 6,652,967 B2 | 11/2003 | Yadav et al. | |
| 7,168,935 B1 | 1/2007 | Taminger et al. | |
| 7,473,466 B1* | 1/2009 | Muradov | B01J 8/0496 428/408 |
| 7,727,591 B2 | 6/2010 | Sion et al. | |
| 8,157,948 B2 | 4/2012 | Maxwell et al. | |
| 8,361,566 B2 | 1/2013 | Maxwell | |
| 8,536,080 B2 | 9/2013 | Mohammadi et al. | |
| 8,669,164 B2 | 3/2014 | Maxwell et al. | |
| 8,894,918 B2 | 11/2014 | DiCarlo et al. | |
| 9,029,275 B2 | 5/2015 | Yano et al. | |
| 10,167,555 B2 | 1/2019 | Maxwell et al. | |
| 10,683,574 B2 | 6/2020 | Maxwell et al. | |
| 10,947,622 B2* | 3/2021 | Maxwell | C04B 35/62277 |
| 2003/0107148 A1 | 6/2003 | Davis et al. | |
| 2004/0058154 A1 | 3/2004 | Lau et al. | |
| 2004/0207133 A1 | 10/2004 | Williams et al. | |
| 2006/0046051 A1 | 3/2006 | Yano et al. | |
| 2006/0275537 A1 | 12/2006 | Maxwell et al. | |
| 2009/0061210 A1 | 3/2009 | Ruuttu et al. | |
| 2010/0055349 A1 | 3/2010 | Gaitas et al. | |
| 2010/0055352 A1 | 3/2010 | Maxwell | |
| 2012/0171098 A1 | 7/2012 | Hung et al. | |
| 2012/0171106 A1 | 7/2012 | Barker et al. | |
| 2014/0306364 A1 | 10/2014 | Naskar | |
| 2015/0004393 A1 | 1/2015 | Pegna et al. | |
| 2016/0347672 A1* | 12/2016 | Harrison | D01F 8/18 |

FOREIGN PATENT DOCUMENTS

| | | |
|---|---|---|
| WO | 8801204 | 2/1988 |
| WO | 2016/028693 A | 2/2016 |

OTHER PUBLICATIONS

Maxwell et al.; Preparation of superhard B"xC"y fibers by microvortex-flow hyperbaric laser chemical vapor deposition; Diamond and Related Materials, Elsevier, Science Publishers, Amersterdam, NL, vol. 16, No. 8, Aug. 1, 2007 (Aug. 1, 2007), pp. 1557-1564, XP025318293 [retrieved on May 25, 2007].
USPTO Office action dated May 6, 2019 for U.S. Appl. No. 14/931,564.
USPTO Office action dated Nov. 29, 2019 for U.S. Appl. No. 14/931,564.
USPTO Office action dated Jul. 16, 2020 for U.S. Appl. No. 14/931,564.
USPTO Office action dated Dec. 9, 2020 for U.S. Appl. No. 14/931,564.
American Elements "Silicon Carbide Fiber", https://www.americanelements.com/silicon-carbide-fiber-409-21-2, obtained on Nov. 2019.
Office action for application serial No. JP 2017-529589, with English translation, dated Apr. 26, 2019.
Office action for application serial No. JP 2019-143018, with English translation, dated Oct. 6, 2020.
Office action for application serial No. EP 15834368.1 dated Apr. 23, 2020.
Office action for application serial No. JP 2017-543286, with English translation, dated Aug. 27, 2019.

(56) References Cited

OTHER PUBLICATIONS

Office action for application serial No. JP 2017-543286, with English translation, dated Apr. 7, 2020.
R. A. Andrievskii, N. S. Strel 'Nikova, N. I. Poltoratskii, E. D. Kharkhardin, V. S. Smirnov, "Melting Point in Systems ZrC—HfC, TaC—ZrC, TaC—HfC," presented at the Fifth All-Union Inter Institute Seminar of the Physical Properties and Electron Structure of the Transition Metals and Their High-Melting Compounds and Alloys, Apr. 5-9, 1966, Kiev, Ukraine.
Srinivasa R. Bakshi, Vishal Musaramthota, Debrupa Lahiri, Virendra Singh, Sudipta Seal, and Arvind Agarwal, "Spark plasma sintered tantalum carbide: Effect of pressure and nano-boron carbide addition on microstructure and mechanical properties," Materials Science and Engineering A, 2011, vol. 528, pp. 1287-1295.
Kantesh Balani, Gabriela Gonzalez, Arvind Agarwal, Robert Hickman, J. Scott O'Dell, and Sudipta Seal, "Synthesis, Microstructural Characterization, and Mechanical Property Evaluation of Vacuum Plasma Sprayed Tantalum Carbide," J. Am. Ceram. Soc., 2006, vol. 89, No. 4, pp. 1419-1425.
I. G. Barantseva, V. N. Paderno, and Y. B. Paderno, "Some physical properties of alloys of the systems ZrC—NbC and TaC—HfC," Sintered Materials and Components, Institute of Materials Science, Academy of Sciences of the UkrSSR. Translated from Poroshkovaya Metallurgiya, Feb. 1967, vol. 2, No. 50, pp. 70-73.
P. H. Crayton and Marvin C. Gridly, "Vapour-Phase Synthesis of Submicron Tantalum Carbide," Powder Metallurgy, 1971, vol. 14, No. 27.
D. L. Deadmore, "Vaporization of Tantalum-Carbide-Hafnium-Carbide Solid Solutions at 2500° to 3000° K," NASA Technical Note, NASA TN D-2512, Washington, D. C., Nov. 1964, presented as a paper at the American Ceramic Society Meeting, Chicago, IL, Apr. 22, 1964.
D. L. Deadmore and I. Zaplatynsky, "The Ternary System Tantalum-Hafnium-Carbon at 2050° C," NASA Technical Note, NASA TN D-2768, Washington, D. C., Apr. 1965.
D. L. Deadmore, "Influence of Time on Vacuum Vaporization Rate and Surface Compositional Stability of Tantalum-Carbide-Hafnium Carbide Solid Solutions above 2000° C," NASA Technical Note, NASA TN D-3503, Washington, D. C., Jul. 1966.
E. N. Denbnovetskaya, "Preparation of Solid Solutions of Some Complex Carbides of the Transition Metals," Sintered Materials and Components, Institute of Materials Science, Academy of Sciences of the UkrSSR. Translated from Poroshkovaya Metallurgiya, No. 3 (51), pp. 32-37, Mar. 1967. Original article submitted Nov. 19, 1966.
J. L. Fischer, "Hot-Pressing Mixed Carbides of Ta, Hf, and Zr," American Ceramic Society Bulletin, vol. 43, No. 3, Mar. 1964.
O. G. Gaballa, "Processing development of 4TaC—HfC and related carbides and borides for extreme environments," Graduate Theses and Dissertations, Iowa State University, Paper 12635, 2012.
V. M. Maslov, A. S. Neganov, I. P. Borovinskaya, and A. G. Merzhanov, "Self-Propagating High-Temperature Synthesis as a Method for Determination of the Heat of Formation of Refractory Compounds," Chernogolovka. Translated from Fizika Goreniya i Vzryva, vol. 14, No. 6, pp. 73,82, Nov.-Dec. 1978. Original article submitted Aug. 19, 1977.
B. Matovic, D. Bucevac, V. Maksimovic, S. Nenadovic, J. Pantic, D. Gautam, and T. Yano, "Synthesis and characterization of hafnium carbide based ceramics," Key Engineering Materials, vol. 616 (2014), pp. 1-7, Trans Tech Publications, Switzerland.
L. Ramqvist, "Hot Pressing of Metallic Carbides," Powder Metallurgy, vol. 9, No. 17, Spring 1966, pp. 26-46.
A. Sayir, "Carbon Fiber Reinforced Hafnium Carbide Composite," Journal of Materials Science, vol. 39, 2004, pp. 5995-6003.
B. C. Schulz, "Processing and Characterization of Tantalum-Hafnium Carbides," Master's Thesis, Department of Metallurgical and Materials Engineering, The University of Alabama, Tuscaloosa, AL (2011).
L. Silvestroni, A. Bellosi. C. Melandri, D. Sciti, J.X. Liu, and G.J. Zhang, "Microstructure and properties of HfC and TaC-based ceramics obtained by ultrafine powder," Journal of the European Ceramic Society, vol. 31 (2011), pp. 619-627.
E. P. Simonenko, N. A. Ignatov, N. P. Simonenko, Yu. S. Ezhov, V. G. Sevastyanov, and N. T. Kuznetsova, "Synthesis of Highly Dispersed Super-Refractory Tantalum-Zirconium Carbide Ta4ZrC5 and Tantalum-Hafnium Carbide Ta4HfC5 via Sol-Gel Technology," Russian Journal of Inorganic Chemistry, 2011, vol. 56, No. 11, pp. 1681-1687.
J.-F. Antoine, C. Visa, and G. Abba, "Approximate Analytical Model for Hertzian Elliptical Contact Problems," Transactions of the ASME, 2006, vol. 128, pp. 660-664.
A. Delcamp, L. Maille, B. Rufino, S. Mazerat, R. Pailler, A. Guette, P. Weisbecker, H. Plaisantin, E. Philippe and S. Loison, "In-situ Processing of Carbon Coatings on the Surface of SiC-Based Fibers," Surface and Coating Technology, 2010, vol. 205, pp. 703-709.
A. Delcamp, L. Maille, S. Saint Martin, R. Pailler. Amd A. Guette, "Al—O—N and Al—O—B—N Thin Films Applied on Si—O—C Fibers," Composites Science and Technology, 2010, vol. 70, pp. 622-626.
A.K. Khanra, "Production of Boron Carbide Powder by Carbothermal Synthesis of Gel Material," Bull. Mater. Sci., 2007, vol. 30, No. 2, pp. 93-96.
T. Kusunose, T. Sekino, and Y. Ando, "Synthesis of SiC/BN Nanocomposite Powders by Carbothermal Reduction and Nitridation of Borosilicate Glass, and the Properties of Their Sintered Composites," Nanotechnology, 2008, vol. 19, pp. 1-9.
W. J. Lackey, J. A. Hanigofsky, G. B. Freeman, R. D. Hardin, B. N. Beckloff, D. M. Emmerich, A. Prasad, M. D. Ellenburg, J. Pugh, M. D. Langman, and J.S. Lewis, "Continuous Fabrication of SiC Fiber Tows by Chemical Vapor Deposition," Final Report, Materials Science and Technology Laboratory, Georgia Tech Research Institute, 1993.
J.A. Newell and A. A. Puzianowski, "Development of Pneumatic Spreading System for Kevlar-Based SiC-Precursor Carbon Fibre Tows," High Performance Polymers, 1999, vol. 11, pp. 197-203.
E. Pippel, J. Woltersdorf, D. Dietrich, S. Stockel, K. Weise, and G. Marx, "CVD Coated Boron Nitride on Continuous Silicon Carbide Fibres: Structure and Nanocomposition," Journal of the European Ceramic Society, 2000, vol. 20, pp. 1837-1844.
F. Rebillat, A. Guette, and C. R. Brosse, "Chemical and Mechanical Alterations of SiC Nicalon Fiber Properties Furing the CVD/CVI Process for Boron Nitride," Acta Mater., 1999, vol. 47, No. 5, pp. 1685-1696.
M. Suzuki, Y. Tanaka, Y. Inoue, N. Miyamoto, M. Sato, and K. Goda, "Uniformization of Boron Nitride Coating Thickness by Continuous Chemical Vapor Deposition Process for Interphase of SiC/SiC Composites," Journal of the Ceramic Society of Japan, 2003, vol. 111, No. 12, pp. 865-871.
Extended European Search Report and Written Opinion for Application No. 15857529.0, dated Sep. 19, 2018.
Hua Chang, Long Jeng Lee, Rong Li Hwang, Chiu Tih Yeh, M.S. Lin, J.C. Lou, T.H. Hseu, T.B. Wu, Yeong-Jgi Chen, Chia-Pin Tang, "Physical and chemical properties of the cylindrical rods SiCx (x=0.3−1.2) grown from Si(CH3)2Cl2 by laser pryolysis," Materials Chemistry and Physics 44 (1996) 59-66.
F.G. Tarntair, C.Y. Wen and L.C. Chen, J.J. Wu and K.H. Chen, P.F. Kuo, S.W. Chang, and Y.F. Chen, W.K. Hong and H.C. Cheng, "Field emission from quasi-aligned SiCN nanorods," Applied Physics Letters, vol. 76, No. 18, May 1, 2000.
Kefeng Cai, Linyong Huang, Aixia Zhang, Junlin Yin, and Hong Liu, "Synthesis, Characterization, and Electrical Properties of SiCN Nanowires," Crystal Growth & Design, 2008 vol. 8, No. 7, pp. 2144-2149.
USPTO Office action dated Sep. 28, 2018 for U.S. Appl. No. 14/931,564.
Extended European Search Report for European application serial No. 15834368.1.
Maxwell J L et al: "Growth of normally-immiscible materials (NIMs), binary alloys, and metallic fibers by hyperbaric laser chemical vapor deposition", Applied Physics A; Materials Science & Processing, Springer, Berlin, DE, vol. 91, No. 3, Mar. 19, 2008 (Mar. 19, 2008), pp. 507-514, XP019626650, ISSN: 1432-0630.

(56) References Cited

OTHER PUBLICATIONS

Fahey, M.T., "Nonlinear and Anisotropic Behavior of High Performance Fibers," MIT, Sep. 1993, dissertation, 232 pages.
Wagner, H.D., "Nanotube-polymer adhesion: A mechanics approach," Chemical Physics Letters, Jul. 24, 2002, vol. 361, pp. 57-61.
Wagner, H.D. and Lustiger, A., "Optimized toughness of short fiber-based composites: The effect of fiber diameter," Composites Science and Technology, 2009, vol. 69, pp. 1323-1325.
Georgiadi-Stefanidi, K. et al., "Numerical modelling of the pull-out of hooked steel fibres from high-strength cementitious matrix, supplemented by experimental results," Construction and Building Materials, 2010, vol. 24, pp. 2489-2506.
Ku, H. et al., "A review on the tensile properties of natural fibre reinforced polymer composites," Composites Part B: Engineering, 2011, vol. 42, No. 4, pp. 856-873.
Li, S., et al., "Random chopped fibers in reaction bonded SiC composite: Morphology, etching and reinforcing properties," Materials Science and Engineering A, 2012, vol. 551, pp. 104-109.
Devireddy, S.B.R., and Biswas, S., "Effect of Fiber Geometry and Representative Volume Element on Elastic and Thermal Properties of Unidirectional Fiber-Reinforced Composites," Journal of Composites, Nov. 18, 2014, vol. 2014, pp. 1-12.
Wicks, S.S., et al., "Multi-scale interlaminar fracture mechanisms in woven composite laminates reinforced with aligned carbon nanotubes," Composites Science and Technology, 2014, vol. 100, pp. 128-135.
Escalante-Solis, M.A., et al., "A note on the effect of the fiber curvature on the micromechanical behavior of natural fiber reinforced thermoplastic composites," eXPRESS Polymer Letters, 2015, vol. 9, No. 12, pp. 1119-1132.
Greenfield, I., and Wagner, H.D., "Nonacomposite toughness, strength and stiffness: role of filler geometry," Nanocomposites, 2015, vol. 1, pp. 3-17.
Hao, W., et Ali, "Experimental study on the fiber pull-out of composites using digital gradient sensing technique," Polymer Testing, 2015, vol. 41, pp. 239-244.
He, Q., et al., "Improving steel fiber reinforced concrete pull-out strength with nanoscale iron oxide coating," Construction and Building Materials, 2015, vol. 79, pp. 311-317.
Upadhyaya, P., and Kumar, S., "Pull-out capacity of adhesive anchors: An analytical solution," International Journal of Adhesion and Adhesives, 2015, vol. 60, pp. 54-62.
International Search Report and Written Opinion for International Application Serial No. PCT/US2015/058865.
International Search Report and Written Opinion for International Application No. PCT/US2015/045533.

* cited by examiner

FIG. 19

|  | | Outside Reaction Zone | | | | |
|---|---|---|---|---|---|---|
| | | Solid | Liquid | Gas | Critical | Supercritical |
| At Reaction Zone | Solid | | | | | |
| | Liquid | √ | √ | | | |
| | Gas | √ | √ | √ | √ | √ |
| | Critical | √ | √ | √ | | |
| | Supercritical | √ | √ | √ | √ | √ |

Multi-Encoding on a Surface Coating

Encoding with Composition

Encoding with Geometry

*FIG. 27(g)* *FIG. 27(h)* *FIG. 27(i)*
  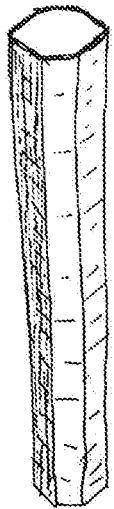
*FIG. 27(j)* *FIG. 27(k)*
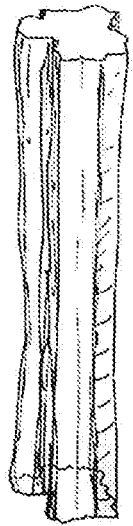 

FIG. 28(g)  FIG. 28(h)  FIG. 28(i)
  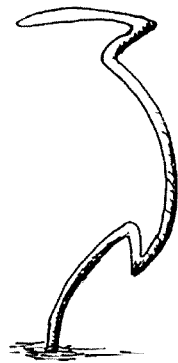  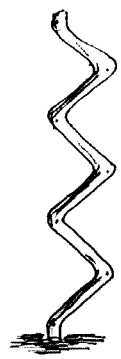
FIG. 28(j)  FIG. 28(k)  FIG. 28(l)
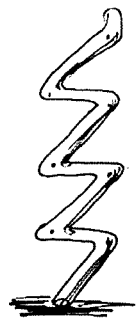  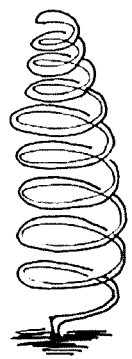  

Dataset 1 (Carbon Fiber with Distorted Circular Beam Profile, Graphite Outside)

Dataset 2 (Flat-top Profile)

CP M PiShaper 29.4 atm

| Specimen Identifier: | |
|---|---|
| Test Date: | 13 July 2015 |
| Start Time: | 11:55:56 |
| End Time: | 11:56:00 |
| Geometry: | Round |
| Diameter: | 0.024 mm |
| Area: | 0.00045 sq mm |

Analysis Results

| | |
|---|---|
| Chord Modulus | |
| Modulus | 22139436 psi |
| Offset 1 | 0.050 % |
| Offset 2 | 0.250 % |
| Load At Break | |
| Load | 15.612 g |
| Maximum Load | |
| Load | 17.388 g |
| Maximum Stress | |
| Maximum Stress | 376.94 MPa |
| Modulus of Elasticity | |
| Modulus | 12624684 psi |
| Stress At Break | |
| Stress | 338.42 MPa |

Dataset 3 (Gaussian Profile)

Cyclopentane Hexadecane

Specimen Identifier:

Test Date: 28 January 2015
Start Time: 15:20:44
End Time: 15:20:49

Geometry: Round
Diameter: 0.017 mm
Area: 0.00023 sq mm

Analysis Results

Chord Modulus
  Modulus         25318064 psi
  Offset 1        0.050 %
  Offset 2        0.250 %
Load At Break
  Load            13.835 g
Maximum Load
  Load            13.835 g
Maximum Stress
  Maximum Stress  597.72 MPa
Modulus of Elasticity
  Modulus         29710526 psi
Stress At Break
  Stress          597.72 MPa CPHD 75um/s

METHOD AND APPARATUS FOR FABRICATING FIBERS AND MICROSTRUCTURES FROM DISPARATE MOLAR MASS PRECURSORS

CROSS-REFERENCE TO RELATED APPLICATIONS

This application is a continuation of, and claims priority to, and the benefit of, U.S. application Ser. No. 16/901,421 titled "Method and Apparatus for Fabricating Fibers and Microstructures from Disparate Molar Mass Precursors," filed Jun. 15, 2020, which was a continuation of U.S. application Ser. No. 16/165,535 titled "Method and Apparatus for Fabricating Fibers and Microstructures from Disparate Molar Mass Precursors," filed Oct. 19, 2018 (now U.S. Pat. No. 10,683,574), which was a continuation of U.S. application Ser. No. 14/827,752 titled "Method and Apparatus for Fabricating Fibers and Microstructures from Disparate Molar Mass Precursors," filed Aug. 17, 2015 (now U.S. Pat. No. 10,167,555) and claimed priority to U.S. Application Ser. No. 62/038,705 titled "Method and Apparatus of Fabricating Fibers from Disparate Molecular Mass Gaseous, Liquid, Critical and Supercritical Fluid Mixtures," filed Aug. 18, 2014; U.S. Application Ser. No. 62/074,703 titled "Doped Carbon Fibers and Carbon-Alloy Fibers and Method of Fabricating Thereof from Disparate-Molecular Mass Gaseous-, Liquid, and Supercritical Fluid Mixtures," filed Nov. 4, 2014; and U.S. Application Ser. No. 62/074,739 titled "Method and Apparatus for Recording Information on Modulated Fibers and Textiles and Device for Reading Same," filed Nov. 4, 2014, the entire contents of which are herein incorporated by reference.

STATEMENT REGARDING FEDERALLY SPONSORED RESEARCH OR DEVELOPMENT

N/A

BACKGROUND OF THE INVENTION

Field of the Invention

The present invention is in the technical field of fiber and microstructure fabrication. In some embodiments, the invention also relates to the permanent or semi-permanent recording and/or reading of information on or within fibers and microstructures. In some embodiments, the invention also relates to the production of certain functionally-shaped and engineered short fiber and microstructure materials. In some embodiments, the invention may also utilize laser beam profiling to enhance fiber and microstructure fabrication.

In some aspects, this invention generally relates to production of fibers that are commonly used to reinforce composite materials. Frequently, short strands of fiber are cut from longer rolls of fiber, wire, or rolled strips to predetermined lengths, and these are then added to composite matrix materials in random or ordered arrangements. These fibers are known as "chopped fiber" in the industry and are used in a broad range of applications, from carbon-fiber reinforced polymers to sprayed-on metallic-fiber-reinforced insulation, to polymer-fiber reinforced concretes. In the composites industry, long strands of fiber are also spooled/joined into tow or ropes, which can then be used to create "fiber layups" and reinforce composite materials.

Very often, fibers provide increased strength to a composite material, while a surrounding matrix material possesses complementary properties. The overall strength of a composite material depends on both the fiber and matrix properties, but usually strength is compromised when the fibers can slip excessively relative to the matrix. Thus, one of the greatest challenges associated with fiber-reinforcement of composites is optimizing the "pull-out" strength of fibers within a matrix material. Traditionally, this has been done by: (1) increasing the adhesion or bonding strength at the interface between the fibers and matrix material, or (2) increasing the surface area for contact between the two materials.

However, the concept of optimal fibers whose shapes are engineered to minimize pull-out while allowing the composite to remain flexible and tough is essentially absent from existing techniques. One reason for this is simply that current manufacturing methods presume that the raw fiber or wire-based materials are derived from drawing the fiber material through dies; in the case of metallic strip, they are often cut from rolled metal sheeting. For many materials, it is difficult to modify the cross-section of fibers dynamically using dies or rolling processes. Thus carbon-fiber manufacturers largely produce circular cross-section carbon fiber, and metallic fiber is often chopped from cylindrical wire—all with constant cross-sections. Of course, ductile/metallic wire/strip can be rolled, indented, or bent mechanically to change its shape, but this is not practical for many higher strength (often brittle) materials that are desired for high-performance composites, such as carbon, silicon carbide, silicon nitride, boron, or boron nitride, etc. Forming processes increase the overall expense of the process and are usually limited in the potential geometries that can be created. Thus, a method of modulating the cross-section versus length of reinforcing fibers is very desirable, especially when optimal reinforcing geometries can be created.

Note that pull-out strength is not the only parameter that must be optimized for reinforcing fiber. In many situations, it is also useful to have fibers that are designed to bend, flex, twist, etc. without failure or delamination from the matrix. Creating fibers in shapes that give more isotropic properties are desired in many applications. For example, carbon fibers may have high tensile strengths in one direction while possessing poor compressive or shear strengths. This derives largely from the way in which they are processed from continuous strands—which provides particular anisotropic microstructures/orientations along the axis of the fiber. However, changing the nominal geometric orientation of the fiber itself—into non-linear geometries—can greatly improve the shear and flexure properties of the resulting composite material. This is difficult to accomplish through traditional fiber manufacturing methods.

Hyperbaric laser chemical vapor deposition has been traditionally used with simple Gaussian Laser Beam profiles to grow free-standing, three-dimensional fibers from a wide variety of materials. A Gaussian beam profile is brightest in the center of the beam, and the intensity tails off radially with distance from the central axis of the beam according to:

$$I(r) = I_o * \mathrm{Exp}(-2r^2/wo^2)$$

When focused by a positive lens onto a surface, such a Gaussian beam generates a focal spot that also possesses this same Gaussian distribution. Thus, when fibers are grown by HP-LCVD using a Gaussian beam, the fiber is heated most at the center of the fiber, but the absorbed energy drops radially. Provided the thermal conductivity of the fiber material is high, the fiber dimensions are small, and the growth rate slow, this absorbed thermal energy can conduct rapidly across the fiber tip, allowing the temperature profile within the reaction zone at the fiber tip to be fairly uniform. However for moderate-to-low thermal conductivity materials, the center of the fiber is usually at a much higher temperatures than the fiber edges.

This creates several problems for rapid fiber growth: First, as the phase and composition of the material that is grown can depend strongly on temperature, a non-uniform temperature distribution can create two or more phases or compositions of materials in the fiber. For example during the deposition of carbon fibers from ethylene, at least four possible material phases can be deposited: amorphous/fine-grained carbon, graphitic carbon, nodular carbon, and diamond-like carbon, depending on the reaction temperature. Thus, with a Gaussian laser beam at moderate laser powers, it is very common to grow carbon fibers that possess a graphitic carbon core, with an amorphous or fine-grained carbon coating. This is illustrated in FIG. 37(c). The graphitic core often consists of parabolic- or Gaussian-shaped graphite shells that are centered on the fiber axis, and run outwards toward the fiber exterior. This material configuration provides strength radially, but is not very strong along the fiber axis. This leaves the fibers with very little tensile strength along their primary axis—which is crucial for fiber reinforcement applications. To be most useful/competitive commercially, the carbon fibers grown by HP-LCVD should either be entirely amorphous/glassy, or have graphitic planes running in the same direction as the fiber axis to add strength along that direction.

In addition, many desired fibers are binary or ternary compounds or alloys that are deposited using two or more precursors. Each precursor generally exhibits its own deposition kinetics and activation energy, and hence deposits differently vs. temperature than the other precursors. When a single-temperature is present, this is not generally an issue, as the concentration of the gas-phase precursors can compensate for the difference in deposition kinetics. However, in a temperature gradient, this will lead to a varying composition of the deposit elements within the fiber. For a Gaussian beam, this means that a radial compositional gradient will exist for two or more precursors. Sometimes this can be of advantage (e.g. obtaining a protective coating over a core material in a single-step). However, often a single composition within the fiber is desired.

SUMMARY OF THE INVENTION

The invention generally relates to the synthesis of fibers from gaseous, solid, semi-solid, liquid, critical, and supercritical fluid mixtures, wherein the mixture is comprised of precursors with highly disparate molar masses. In one of its simplest forms, it uses one low molar mass ("LMM") precursor (e.g., silane), and one high molar mass ("HMM") precursor (e.g., hexamethyldisilane), and employs the thermal diffusion/Soret effect to concentrate the LMM precursor at the reaction zone where a fiber is growing. It is generally understood that the term "thermal diffusion" refers to the concentration effect, which can occur in gases, while the Soret effect is commonly understood as referring to the concentration effect in liquids; throughout this document, we will use the term "thermal diffusion" to refer to all instances of a concentration effect, regardless of the state of the fluids. It should be understood that the precursors do not necessarily have to be above or below a certain molar mass. Rather, the terms "LMM precursor" and "HMM precursor" are used to contrast the relative molar masses of the different precursors. The difference in molar mass of the precursors needs to be sufficient such that there is a substantive increase in the concentration of the LMM precursor at the reaction zone relative to the remainder of the chamber volume. Thus, a LLM precursor may have a relatively "high" molar mass so long as it is sufficiently lower than the HMM precursor molar mass to achieve the desired enhanced-concentration effect.

In a preferred embodiment, for "highly disparate molar masses," the molar mass of the HMM precursor is at least 1.5 times greater than the LMM, and can be substantially greater, on the magnitude of 3 or more times greater. For example, in one specific embodiment using alkanes, the LMM precursor could be ethane, having an approximate mass of 30 amu (atomic mass unit), and the HMM precursor could be hexane, having an approximate mass of 86 amu. In this example, the HMM is almost 3 times the mass of the LMM. In another example, methane might be used as the LMM, having an approximate mass of 16 amu, and hexadecane can be used as the HMI, having an approximate mass of 226 amu. In this example, the HMI has a mass over 14 times higher than the LMM. For many precursors, the greater the difference in mass between the HMM and LMM, the more positive effect on the fiber growth rates.

In this specification, we will assume that the term "molar mass" refers to the relative molar mass ($m_r$) of each precursor species (i.e., relative to carbon-12), as determined by mass spectrometry or other standard methods of $m_r$ determination. As the invention relies on comparative measurements of substantively large differences in molar mass to obtain substantively enhanced growth rates of fibers, the use of one method of molar mass determination versus another (or even different definitions of molar mass) will be virtually negligible in practice to the implementation of the invention. However, where the HMM or LMM species may be composed of a distribution of various species (e.g., for some waxes, kerosene, gasoline, etc.), the meaning of "molar mass" in this specification will be the mass average molar mass. Finally, it should be noted that this invention applies to both naturally occurring and manmade isotopic distributions of the molar mass within each precursor species.

The HMM precursor, in addition, preferably possesses a lower mass diffusivity and lower thermal conductivity than the LMM precursor, and the lower diffusivity and thermal conductivity of the HMM precursor than the LMM precursor, the better. This makes it possible for the HMI precursor to insulate the reaction zone thermally, thereby lowering heat transfer from the reaction zone to the surrounding gases. The HMM precursor will also provide a greater Peclet number (in general) and support greater convective flow than use of the LMM precursor on its own. This enables more rapid convection within a small enclosing chamber, which in turn tends to decrease the size of the boundary layer surrounding the reaction zone, where diffusion across this boundary layer is often the rate limiting step in the reaction. At the same time, the thermal diffusion effect helps to maintain at least a minimal diffusive region over which a concentration gradient exists, allowing the LMM precursor to be the maintained at high concentration at the reaction zone. Note that the HMM precursor can be an inert gas, whose primary function is to concentrate and insulate the LMM precursor.

Using the systems and methods described herein allows an LMM precursor to yield rapid fiber growth rates well beyond what is obtained through the use of the LMM precursor alone. In some cases, this has resulted in growth rates of one or two orders of magnitude beyond what is expected for a given laser power and reaction vessel chamber pressure. While this effect is not always observed for chemical vapor deposition (CVD) processes, it is apparent in microscale CVD processes where the heating means for the reaction is localized.

Thus, in some embodiments, one aspect of this invention is the combination of the thermal diffusion effect with the use of highly disparate molar mass precursors so as to concentrate at least one of the precursors at the reaction zone and increase the reaction rate and/or improve properties of the resulting fibers. In addition, a means of maintaining the reaction zone within a region of space inside a reaction vessel, and translating or spooling the growing fibers at a rate similar to their growth rates so as to maintain the growing end of the fiber within the reaction zone, are disclosed that may help to maintain a stable growth rate and properties of the fiber. Both short (chopped) fibers may be grown, as well as long spooled fibers. Methods are disclosed for growing and collecting short (chopped) fiber, as well as spooling long fibers as individual strands or as tows or ropes. During the growth of long fiber lengths, a fiber tensioner may also be provided to maintain the growing end of the fibers from moving excessively within this reaction zone— and so that the spooling of the fiber does not misalign the fiber to the growth zone and interfere with their growth. There are a variety of ways to provide tension to a fiber known to those in the industry. However, we are the first to develop a means of tensioning a fiber without holding the end that is growing, while holding it centered in the reaction zone. We have developed electrostatic, magnetic, fluidic, and/or mechanical centering/tensioning means that can be both passively and actively controlled.

In various embodiments discussed herein, a pyrolytic or photolitic (usually heterogeneous) decomposition of at least one precursor occurs within the reaction zone. Decomposition of the LMM precursor may result in the growth of a fiber; however, it is also possible to use an LMM precursor that will react with the HMM precursor in the region of the reaction zone—where the LMM precursor would not yield a deposit of its own accord. The decomposition reaction can be induced by either heat or light, but is normally at least partially a thermally driven process; thus the thermal diffusion effect can be present, provided that the heating means is small and the surrounding vessel is substantially cooler. In some embodiments, this invention enhances and controls this thermal diffusion effect to produce more rapid and controlled growth of fibers, which is of utility in reducing the production cost and increasing the quality of fibers grown by this method.

The thermal gradient induced by a Gaussian beam can also induce the thermal diffusion effect. As discussed herein, this typically causes the low molar mass (LMM) species which are in the gas phase to diffuse toward the center (hottest) portion of the gradient, while the heavier molar mass (HMM) species diffuse away from the center. As the by-products of the HP-LCVD reaction are always less massive than the precursors, this leads to a depletion of the precursors in the center of the reaction zone, effectively slowing the reaction rate along the center of the fiber axis (referred to as thermal diffusion growth suppression (TDGS)). This can greatly reduce the production rate of fibers by HP-LCVD.

Thus, in some embodiments, another aspect of the invention is that more than one fiber can be grown in a controlled manner simultaneously. This can be effected through the use of a plurality of heating sources, i.e. an array of heated spots or regions. For example, an array of focus laser beams can be generated to initiate and continue fiber growth. However, other sources of heating are also possible, such as through the use of induction heating of the fibers, use of an array of electric arcs, etc. As described further below, more than one heating means can be used for each reaction zone, sometimes referred to herein as a "primary" heating means(s).

Now, it should be noted that temperature rises induced by the primary heating means(s) can vary from spot to spot across an array of heated spots, and this can produce undesirable variations in growth rates and/or fiber properties from fiber to fiber. For example, in the use of an array of focused laser beams there are often deviations in the spot to spot laser power of a few percent or more. In addition, variations in the spot waist of each laser spot induce a large variation in the temperature rise from spot to spot. Thus, even with precision diffractive optics or beam splitting, a laser spot array may yield a variation in peak surface temperature of over 20% from spot to spot. These variations must be either controlled electro-optically, or compensated through other means, or the fiber growth rates will not be similar and the fiber properties will vary. Where growth rates are substantially dissimilar, it becomes difficult to maintain a common growth front for many fibers at once. In this case, some fibers will lag behind, and if the growth front is not tracked actively, they may cease growing altogether once they leave their reaction zones.

Thus, in some embodiments, another aspect of this invention is that the thermal diffusion effect need not be induced solely by a primary heating means, but can be induced and controlled by another source of heat (i.e., a "secondary" heating means), thereby providing another parameter with which to drive and control the reaction rate and fiber properties. Where only the primary heating means is employed, the flow rate of precursors, pressure, and primary heating rate are the primary tools/parameters that can be used to control the reaction and fiber properties (e.g. diameter, microstructure, etc.). If another heating means is available to independently provide heat and control the thermal diffusion gradient and size of the thermal diffusion region, an important new tool is provided that can change the growth rate and properties of the fibers independent of the primary heating means. In addition, whereas the primary heating means may be difficult or expensive to control dynamically, such as in the use of electro-optical modulation of many laser beams, the secondary heating means can be very simple—such as a resistive wire near, crossing, or around the reaction zone. Such a wire can be inexpensively heated by passing electric current through it from an amplifier and a data acquisition system that controls the temperature of the wire. Feedback of the thermal diffusion gradient and region size can be obtained optically with inexpensive CCD cameras, thereby allowing feedback control of the thermal diffusion region by modulating electric current passing to the wire. With existing technology, this can be implemented in a simple manner that is substantially less expensive than electro-optical modulation. This is especially true when attempting to grow many fibers, such as hundreds or thousands of fibers, at once. To yield a commercially viable textile or fiber tow (i.e., untwisted bundle of continuous filaments or fibers) production system with thousands of fibers via laser-induced primary heating means, where no secondary heating means is available, would be very expensive, whereas actively controlling thousands of current loops is relatively inexpensive and easy to implement. Thus, in some embodiments, the invention allows active control of a plurality of thermal diffusion regions in order to control the growth and properties of fibers. Note that modulating the thermal diffusion region also changes the background temperature of the gases, which can also influence the growth rate.

Further, in some embodiments, this invention goes beyond controlling only the thermal diffusion region within a given reaction zone, and provides virtual conduits for flow of LMM precursors from their inlet points within the vessel to each thermal diffusion region within the sea of HMM precursors. Heated wires can provide the flow conduits by creating a long thermal diffusion region throughout the length of each wire. In addition, in some embodiments, the invention provides a means of modulating this flow of LMM precursors to each reaction zone by varying the temperature of locations along the heated wires, thereby providing a thermal diffusion valve that can increase or decrease flow of the LMM precursor to the reaction zone. For example, leads can branch off the heated wire to draw current elsewhere and lower the current through the remainder of the wire. Although traditional mass flow controllers and switching valves can be used, due to the length-scales involved, the response time of one preferred method (using heated wires as virtual flow conduits) is more rapid than that obtained through traditional mass flow controllers and switching valves that often contain a large latent volumes. Switching times on the order of milliseconds or less can be effected, allowing for rapid control of properties. These wires, if they are continued beyond the reaction zone, also provide a way to remove undesired byproducts from the reaction zone and prevent them from mixing substantially with the surrounding gases. Pressure at the inlet point(s) of the virtual conduits can promote flow along the conduits to and beyond the reaction zone.

During fiber growth from fluidic precursors, jets of heated gases (often by-products or precursor fragments) can sometimes be seen leaving a heated reaction zone. In one embodiment, heated wires emanating from the reaction zone(s) can channel these heated gases away from the reaction zone(s) and fiber tip, in desired directions, allowing more rapid growth.

In another embodiment, the wires/filaments/electrodes used to control the thermal diffusion region can also be charged relative to the fibers being grown to generate a discharge between the fibers and the wires/filaments/electrodes. Electrostatics and electromagnetics can be used to channel precursor(s), intermediate(s), and by-product species to/from the fiber and/or to thermal diffusion channels.

One aspect of this invention generally relates to the permanent or semi-permanent recording of information on/within fibers and textiles using the fabrication techniques and methodology described herein. By modulating the fibers' composition, geometry, or surface coatings, information can be recorded on/within these fibers. In addition, many fibers can be grown at once, thereby enabling massively-parallel recordings. The invention also provides a means of reading out this information with a simple scanning apparatus.

The disclosed systems and methods can create archival recordings on/within high-temperature, oxidation-resistant materials, to prevent data loss from fire, flood, natural disasters, and/or electromagnetic pulses. In addition, it provides a means to place random access memory or data ubiquitously on a wide range of everyday products, such as in/on clothing, luggage, composite materials, etc. Information can also be written in such a way as to contain no non-linear junctions, magnetic films, or metallic components that can be easily detected as electronics or as recording media by sophisticated security systems. Data also can be encrypted in a variety of physical manners, e.g. by switching between recording modes (i.e. composition, geometry, properties, etc. over time.) Without the proper reader, it would be very time consuming to decode.

This invention can be implemented in a variety of ways. The encoded data can take many different forms—e.g. being represented within the composition, geometry, or physical/chemical properties of the fibers.

One aspect of the invention generally relates to the production of certain functionally-shaped and engineered short fiber materials in a wide variety of shapes, configurations, orientations, and compositions. Another aspect of the invention relates to various systems and methods to collect, recycle, and/or store manufactured fibers.

In another aspect, some embodiments of the invention utilize laser beam profiling and control of the thermal diffusion region to enhance fiber and microstructure fabrication. In some embodiments, a reaction zone is created within a reaction vessel to decompose at least one precursor, the decomposition resulting in growth of a solid fiber in the reaction zone. The reaction zone is induced by a temperature regions being generated by a heating means, and the temperature regions being controlled to have specific induced temperature rises at surface vs. position and time at the surfaces of the solid fibers and within the solid fibers. As such, the fibers can be grown having specific microstructural properties by controlling the induced temperature rise at surface.

BRIEF DESCRIPTION OF THE DRAWINGS

It should be noted that identical features in different drawings are generally shown with the same reference numeral. Various other objects, features and attendant advantages of the present invention will become fully appreciated as the same becomes better understood when considered in conjunction with the accompanying drawings.

FIG. 19 is a table of likely combinations of different material states that may be used in various embodiments of the invention.

FIGS. 27(a)-(k) show additional fiber shapes and configurations that can be manufactured using the disclosed systems and methods (various/variable cross-sectional shapes).

FIGS. 28(a)-(l) show additional fiber shapes and configurations that can be manufactured using the disclosed systems and methods (non-linear orientations and complex examples).

DETAILED DESCRIPTION OF THE INVENTION

FIGS. 1 through 40 illustrate various views and embodiments of the present invention, and supporting graphs and data. Various embodiments may have one or more of the components outlined below. Component reference numbers used in the Figures are also provided.

Figure 1:
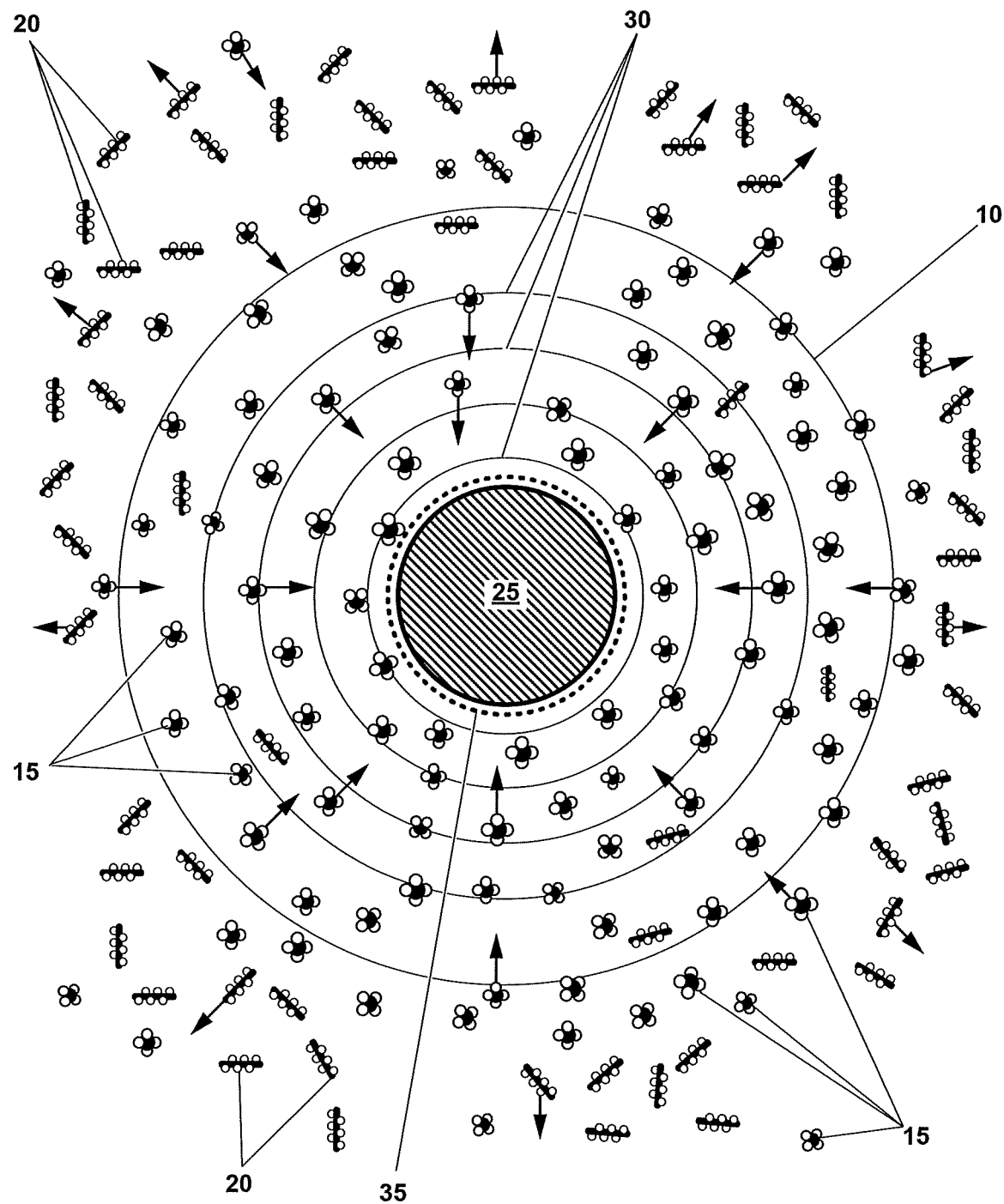
FIG. 1 shows a thermal diffusion region, reaction zone, fiber, and presence of LMM precursor and HMM precursor of one embodiment of the invention.

10 thermal diffusion region
15 low molar mass (or LMM) precursor
20 high molar mass (or HMM) precursor
25 fiber
30 concentration gradient
35 reaction zone
40 primary heating means
45 tensioner
47 tension adjustment device
50 spooling device/mandrel
55 coaxial tube
60 low molar mass (or LMM) precursor tube
65 high molar mass (or HMM) precursor tube
70 precursor planar flow sheets
75 gas bubble
80 internal thermal diffusion region
85 external thermal diffusion region
90 fluid (internal in two phase system)
95 vessel seals
100 vessel walls
101 solid source of HMM precursor (e.g. wax)
102 liquid source of HMM precursor
105 nozzle
110 secondary heating means
112 return conductor
115 single partial loop
120 coils
125 elongated thermal diffusion region
130 LLM precursor supply source
135 wire hot portion
140 wire manifold
145 switch connections
147 control signal 150 outlet manifold
155 HMM precursor supply source
156 feedback means
160 controller
165 multi-output analog amplifier
170 motor controller driver
200 the vertical axis
205 the horizontal axis
210 growth rate data for mixtures of LMM and HMM precursors
215 curve fit to data
220 Result #1 ($CH_4$ at 15 PSI with Xenon)
225 Result #2 ($CH_4$ at 30 PSI with Xenon)
230 Result #3 ($CH_4$ at 45 PSI with Xenon)
235 wool-like webbing
240 baffle
280 first material
285 second material
290 transition portion
300 mandrel/drum
310 wiper
315 fiber bin
320 substrate
330 window
400 smaller diameter sections
405 larger diameter sections
410 first composition sections
415 second composition sections
420 fiber coating
425 first coating composition section
430 second coating composition section
450 sensing means (or sensors)
455 translation means
460 holes/apertures
465 sensor support surface (or sensing means support surface)
470 analog/digital and/or multiplexing system
495 fiber tip
500 laser beam
505 focusing lens(es)
510 focused profiled laser beam
515 beam intensity profile
520 induced temperature rise at surface
525 amorphous carbon
530 graphitic carbon
540 beamlets
545 diffractive optics
560 first beam
565 second beam
570 third beam
575 aperture
580 nozzles
585 focusing reflective or refractive optics
590 beam splitter FIG. 1 depicts a thermal diffusion region (sometimes also referred to as a "thermodiffusion region") 10 surrounding a fiber 25, showing the concentration gradient 30 that occurs when a mixture of two highly disparate molar mass precursors are mixed together near the fiber 25. The concentration gradient 30 is not shown in all the figures. The LMM precursors 15 (usually) tend to concentrate at the region of greatest temperature, which in this case surrounds the reaction zone (sometimes also referred to as the growth zone) 35. The HMM precursor 20 species (usually) tend to be displaced away from the reaction zone 35 at the outside of the thermal diffusion region 10, and as a result, tends to thermally insulate the reaction zone 35. As depicted in FIG. 1, some LMM precursor 15 may exist outside of the thermal diffusion region 10, and some HMM precursor 20 may exist in the thermal diffusion region 10. In addition, it should be noted that those of skill in the art recognize that there is often not a well-defined boundary where the thermal diffusion region 10 ends, but that the concentration gradient 30 may taper off gradually.

One aspect of some embodiments of this invention is that the reaction zone 35 is thermally insulated by the HMM precursor 20, thereby greatly reducing heat losses to the surrounding fluids. Much greater growth rates have been observed with vastly reduced input to the power of the primary heating means 40. Thus, one aspect of the invention's utility is that it makes the growth of many fibers 25 at once much more efficient and feasible. For example, in the growth of 10,000 fibers at once, where each heated spot receives 200 mW of incident power (as is common in traditional laser induced fiber growth), the total energy entering the vessel will be 2 kW. This substantial heat budget must be dealt with or the temperature in the surrounding gases will rise over time. This invention greatly decreases the power required at each reaction zone 35. Thus, for example, where only 40 mW may be required at each reaction zone 35 with the HMM precursor 20 and LMM precursor 15 mixture, the total energy entering the vessel is now only 400 W, which requires significantly less external cooling and provides energy savings making the process more economically viable.

Note that to prevent excessive homogeneous nucleation, the gases in the thermal diffusion regions 10 may generally be at a lower temperature than the threshold for rapid (complete) decomposition of the precursors, but this is not required. Since the thermal diffusion regions 10 and reaction zones 35 overlap close to the growing fiber 25, the thermal diffusion regions 10 may exceed this temperature. In some cases, it may even be useful to induce homogeneous nucleation to provide fresh nucleation sites at the fiber 25 tip, and this invention can provide an extended heated region where this can occur.

The reaction takes place inside a reaction vessel, which is any enclosure that will contain the precursors for the desired life of the system and withstand any heat from the primary or secondary heating means(s) 40 or 110. The reaction vessel may be rigid or flexible. For example, the reaction vessel could be lithographically-patterned microfluidic structures in silicon, a molded polymeric balloon, or a machined stainless steel vessel—there are many possible means to implement the vessel/enclosure. The reaction vessel may include any number of pressure controlling means to control the pressure of the reaction vessel. Non-limiting examples of pressure controlling means include a pump, a variable flow limiter, a piston, a diaphragm, a screw, or external forces on a flexible reaction vessel (that change the reaction vessel internal volume), or through the introduction of solids that also effectively change the available internal volume (e.g., the introduction of HMM precursor 20 in solid form).

As described further herein, the precursors can be introduced in a wide variety of different ways and configurations. As non-limiting examples, the LMM precursor 15 and HMM precursor 20 can be: (1) flowed jointly (pre-mixed) into the reaction vessel; (2) flowed co-axially and directed at a reaction zone(s); (3) flowed in alternating sheets and directed at a reaction zone(s); (4) flowed from alternating sources and directed at a reaction zone(s); (5) flowed from separate sources and directed tangential to the reaction zone; and (6) flowed from separate sources and directed at an angle relative to each other.

A wide variety of different LMM precursors 15 and HMM precursors 20 can be employed in combination in order to obtain the desired thermal diffusion region and controlling effects. For example, for silicon boride deposition, silane and diborane can be used as LMM precursor 15 gases, while HMM precursor 20 gases such as tetraiodosilane, $SiI_4$, or decaborane, $B_{10}H_{14}$, can be used. This list is not intended to be exhaustive, and it is only for explanatory purposes. It is the substantive difference in mass and/or diffusivity that is important to achieve the best results. Other examples of LMM precursors 15 and HMM precursors 20 are outlined in the cross-referenced applications, including U.S. Application Ser. No. 62/074,703, incorporated by reference herein.

The HMM precursor 20 species can be introduced as gases, liquids, critical/supercritical fluids, solids, semi-solids, soft plastic solids, glassy solids, or very viscous liquids. Depending on the precursor chosen, the HMM precursor 20 may liquefy, evaporate, or sublime near the reaction zone(s) 35. The HMM precursor 20 species can vary widely depending on the type of fiber being produced. As non-limiting examples, HMM precursors 20 can be silanes, boranes, organo-aluminum, organo-silicon, organo-boron, metal halide, organometallics, hydrocarbons, fluorocarbons, chlorocarbons, iodocarbons, bromocarbons, or halogenated hydrocarbons species or mixtures thereof. The HMM precursor 20 may also be inert and not decompose, or have very limited decomposition, at the reaction zone 35. The HMM precursor 20 may also physically or chemically inhibit the formation of clusters and particulates near the reaction zone(s) 35.

Similar to the HMM precursors 20, the LMM precursor 15 species can vary widely depending on the type of fiber being produced, and can be introduced as gases, liquids, critical/supercritical fluids, solids, semi-solids, soft plastic solids, glassy solids, or very viscous liquids. As non-limiting examples, LMM precursors 15 can be silanes, methylsilanes, boranes, organo-aluminum, organo-silicon, organo-boron, metal halide, organometallics, hydrocarbons, fluorocarbons, chlorocarbons, iodocarbons, bromocarbons, or halogenated hydrocarbon species or mixtures thereof. Depending on the HMM precursor 20 and the LMM precursor 15, the LMM precursors 15 may (a) react with at least one HMM precursor 20, causing the LMM precursor to deposit, or partially decompose, such that a new "derived precursor species" will be formed and will be concentrated at the reaction zone(s) 35 (and this derived precursor decomposing, resulting in the growth of the fiber); or (b) act as a catalyst that decomposes the HMM precursor 20 to a derived precursor species (having a lower molar mass than the HMM precursor) that will be concentrated at the reaction zone(s) 35 (and this derived precursor species decomposing, resulting in the growth of the fiber).

Depending on the desired fiber characteristics, and HMM precursor 20 and LMM precursors 15 used, the precursors can be in a variety of states. For example: (1) the precursors can all be in a gaseous state; (2) the precursor(s) concentrated at the reaction zone 35 may be in a gaseous state while the precursor(s) outside of the reaction zone 35 are in a critical, liquid, or solid state; (3) the precursor(s) concentrated at the reaction zone 35 may be at the critical point while precursor(s) outside of the reaction zone 35 are in a liquid or solid state; (4) the precursor(s) concentrated at the reaction zone 35 may be in a supercritical state, while precursor(s) outside of the reaction zone 35 are in a supercritical, critical, liquid, or solid state; (5) all precursors are at the critical point or are in the supercritical fluid state, or (6) the precursor(s) concentrated at the reaction zone 35 may be in a liquid state while the precursor(s) outside of the reaction zone 35 are in a liquid or solid state. Of course, this is not intended as an exhaustive list. The "liquid" state above can include very viscous liquids or glasses, while the "solid" state can include soft plastic solids or semisolids. See generally, FIG. 19, which is a table of likely combinations of different material states.

In some embodiments, an intermediate molar mass ("IMM") precursor may also be introduced into the reaction vessel. Depending on the fiber desired, and the LMM precursor 15 and HMM precursor 20 used, an IMM precursor may be introduced to further separate, react with, or break down the LMM precursor 15 and/or HMM precursor 20. For example, where the HMM precursor is hexadecane ($C_{16}H_{34}$) [molar mass=226.45 g/mol] and the LMM precursor is methane ($CH_4$) [molar mass=16.04 g/mol], an IMM precursor such as carbon tetrafluoride ($CF_4$) [molar mass=88.00 g/mol] could be added to react with both the methane and hexadecane, to produce a carbon fiber product and hydrogen+hydrogen fluoride by-products. In some embodiments, the IMM precursor is introduced to primarily react with, and break down, the HMM precursor 20 species. For example, where the HMM is icosane ($C_2OH_{42}$) [molar mass=282.56 g/mol] and the LMM is silane ($SiH_4$) [32.12 g/mol], an IMM precursor such as bromine ($Br_2$) [molar mass=159.80 g/mol] can be introduced to react with the hydrogen in the icosane to produce carbon as a product (i.e., deposited as part of the fiber) and hydrogen bromide as a byproduct. While the silane, concentrated at the center of the thermal diffusion region will deposit spontaneously at low temperatures without bromine being present, the decomposition of icosane is enhanced through the reaction with bromine. Generally, the molar mass of the IMM precursor is between that of the LMM precursor and HMM precursor.

Just as examples, and not as limitations, the following types of fibers can be fabricated using the system and methods described herein: boron, boron nitride, boron carbide, carbon, aluminum oxide, aluminum nitride, silicon carbide, silicon nitride, silicon borocarbide, silicon oxynitride, nickel, iron, titanium, titanium carbide, tantalum carbide, hafnium carbide, tungsten, and tungsten carbide fibers, to name just a few. Other examples are outlined in the cross-referenced applications, including U.S. Application Ser. No. 62/074,703, incorporated by reference herein.

Figure 2:
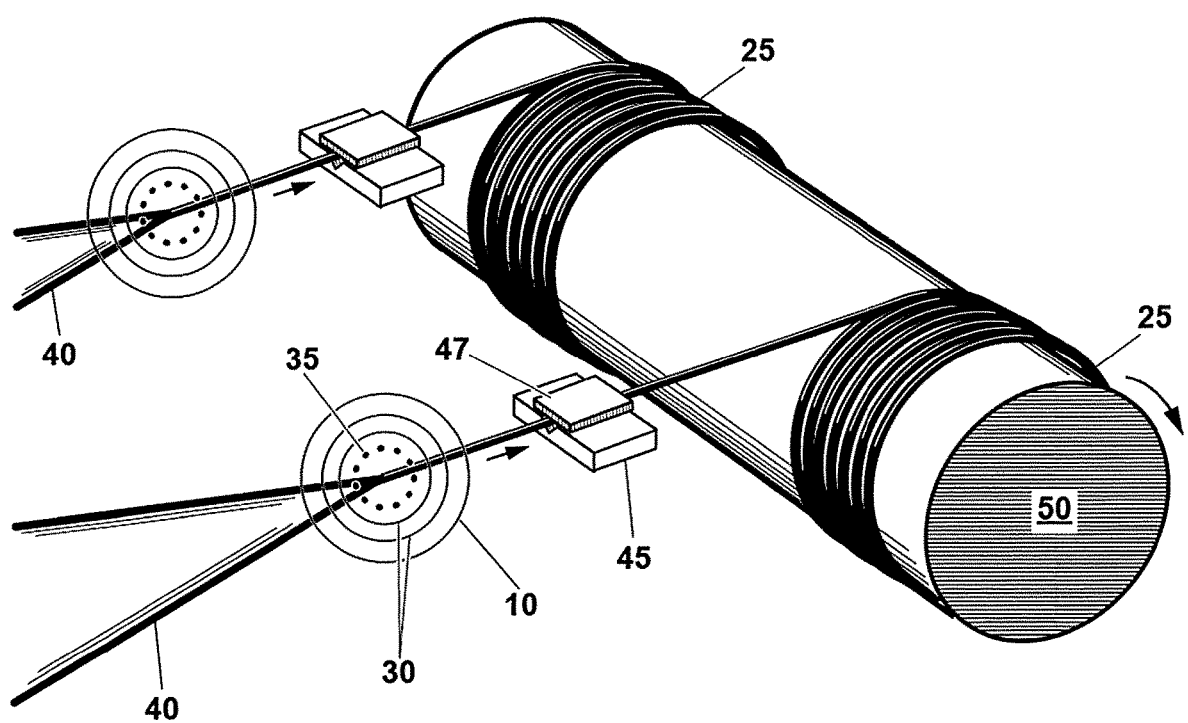
FIG. 2 is one embodiment of the invention showing an array of thermal diffusion zones, reaction zones, and fibers, together with fiber tensioners and spooling device/mandrel.

FIG. 2 depicts one embodiment of the invention; which includes an array of thermal diffusion regions 10, reaction zones 35, primary heating means 40, tensioners 45, a tension adjustment device 47, and a spooling device/mandrel 50. The primary heating means 40 is applied to create the reaction zone 35 and thermal diffusion region 10. The spooling device/mandrel 50 rotates to wind the grown fibers 25 onto the spooling device/mandrel 50. Individual spooling devices/mandrels 50 could be used for each fiber 25, or many fibers 25 can be wound onto a single spooling device/mandrel 50 to create tow. While shown as an array of growing fibers 25, a similar configuration could be used for growing a single fiber 25. The optional tensioners 45 can be used to add sufficient tension and alignment to the fibers 25 as they are wound on the spooling device/mandrel 50. Other methods for gathering fibers 25 are known to those of skill in the art. However, we have developed new methods of tensioning the fiber without holding the end that is growing, while maintaining it centered in the reaction zone. We have developed electrostatic, magnetic, fluidic, and/or mechanical centering/tensioning means that can be both passively and actively controlled.

Note that the primary heating means 40 can be any number of options known to those of skill in the art able to create localized reaction zone(s) 35 and thermal diffusion region(s) 10 (either alone or in combination with other primary heating means). As non-limiting examples, primary heating means 40 may be one or more focused spots or lines of laser light, resistive heating (e.g., passing electrical current through contacts on the fiber), inductive heating (e.g. inducing current in the fiber by passing current through coiled wires near or surrounding the fiber), high pressure discharges (e.g. passing current through the precursors from electrodes to the fibers), focused electron beams, focused ion beams, and focused particle bombardment (e.g. from a particle accelerator). For reference, radiative primary heating means 40 can also use soft X-ray, ultraviolet, visible, infrared, microwave, millimeter-wave, terahertz, or radio frequency radiation (e.g. within electromagnetic cavities) to create reaction zones. The primary heating means 40 in FIG. 2 are focused laser beams.

Secondary heating means are not shown explicitly in FIG. 2, but could be used. As described previously, secondary heating means 110 allow further control and enhancement of the thermal diffusion region 10. This, in turn, allows the real-time modulation and control of the concentration of LMM precursor 15 species at the reaction zone 35, and hence real-time modulation and control of fiber geometry and material properties. As non-limiting examples, secondary heating means 110 may be energy sources focused into/onto the precursor fluids, such as one or more focused spots or lines of laser light, focused electron beams, focused ion beams, or focused particle bombardment (e.g. from a particle accelerator); secondary heating means may also take the form of resistive heating of the precursor fluids (e.g., passing electrical current through a wire), inductive heating of the precursor fluids, or high pressure discharges through said precursor fluids. Any of these secondary heating means 40 can be used individually or in combination with one or more other secondary heating means 40.

Figure 3:
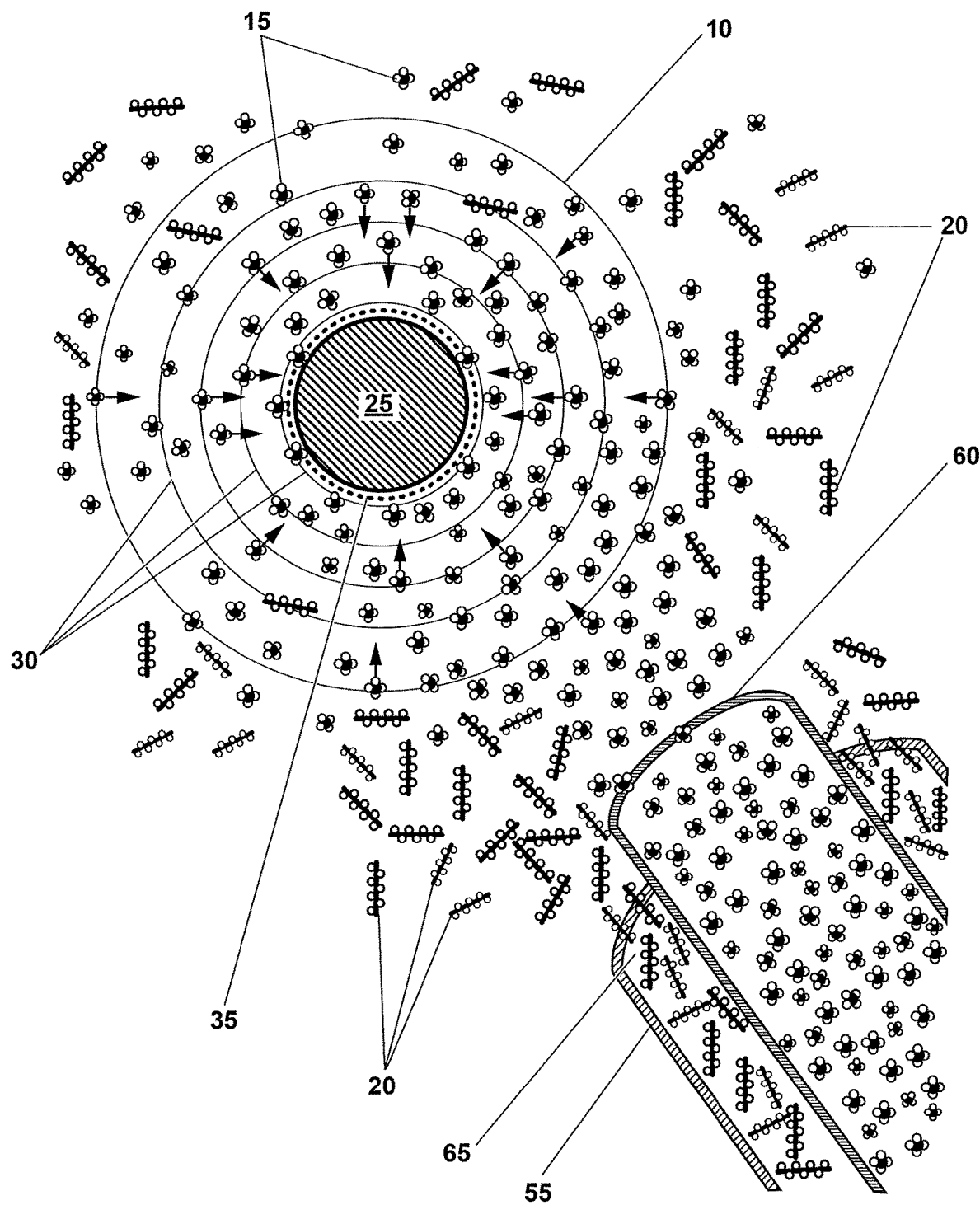
FIG. 3 is one embodiment of the invention showing precursors flowed co-axially toward the reaction (or growth) zone.

FIG. 3 depicts one embodiment of the invention where two highly disparate molar mass precursors are flowed coaxially through a coaxial tube 55, having a LMM precursor tube 60 and a HMM precursor tube 65, directing flow toward the reaction zone 35. In other embodiments, the LMM precursor 15 and HMM precursor 20 can be pre-mixed. This implementation can directly feed the center of the thermal diffusion region 10, increasing the growth rate of the fiber 25 by reducing the precursors' transport time through the fluid. Again, the LMM precursor 15 usually tends to concentrate at the region of greatest temperature surrounding the reaction zone 35. The HMM precursor 20 species tends to be displaced away from the reaction zone 35 at the outside of the thermal diffusion region 10, and as a result, tends to thermally insulate the reaction zone 35. Thus, the LMM precursor 15 is decomposed in the reaction zone 35 and deposits, resulting in fiber growth.

Thus, in one embodiment of the invention that uses the methods of FIGS. 2 and 3 to fabricate fibers, at least one LMM precursor 15 is flowed into a reaction vessel and at least one HMM precursor 20 is introduced to the reaction vessel. As described above, the HMM precursor 20 preferably has a molar mass 1.5 to 3 times greater, and more preferably 3 or more times greater, than the LMM precursor 15, and preferably a thermal conductivity substantively lower than that of the LMM precursor 15. One or more reaction zone(s) 35 are created within the reaction vessel by one or more primary heating means 40, resulting in the decomposition of at least one precursor species. The decomposition results in the growth of a solid fiber(s) 25 at each reaction zone(s) 35. The solid fibers 25 have a first end at or near the reaction zone(s) 35 and a second end that is drawn backward through a tensioner 45 and spooling device/mandrel 50 at a rate to maintain the first end within the reaction zone(s) 35. One or more thermal diffusion region(s) 10 are established at/near said reaction zone(s) 35 to partially or wholly separate said LMM precursor 15 species from said HMM precursor 20 species using the thermal diffusion effect, thereby concentrating the LMM precursor 15 species at each reaction zone(s) 35. In this embodiment, the concentrated LLM precursor 15 substantively enhances the growth of the solid fiber(s) 25 and the HMM precursor 20 species decreases the flow of heat from the reaction zone(s) 35, relative to that which would occur using the LMM precursor 15 species alone.

Figure 4:
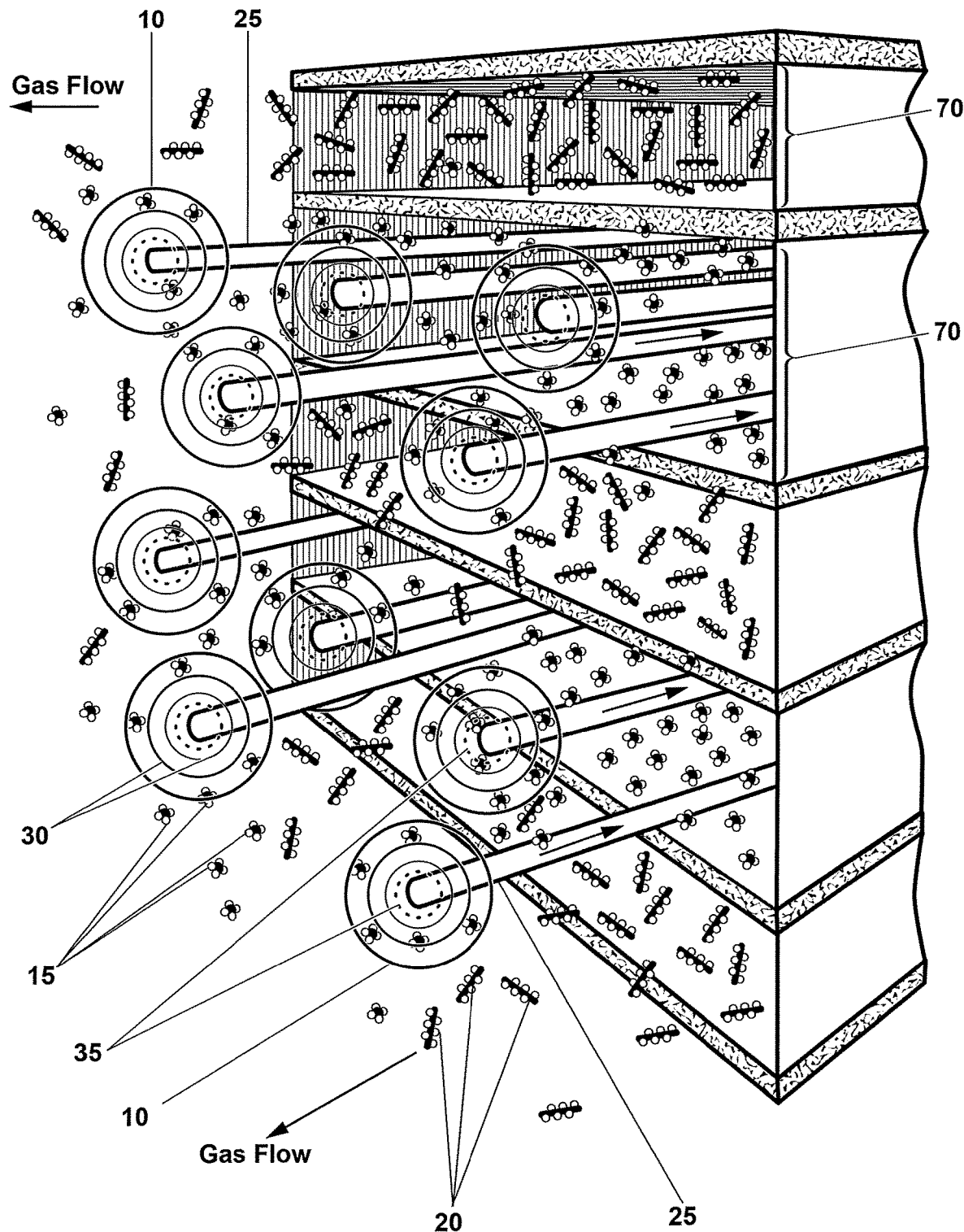
FIG. 4 is one embodiment of the invention showing precursors flowed in planar sheets toward the reaction (or growth) zones and an array of fibers.

FIG. 4 shows another embodiment of the invention, where two highly disparate molar mass precursors are flowed in precursor planar flow sheets 70 toward the reaction zones 35 of an array of fiber(s) 25. This implementation can also directly feed the center of the thermal diffusion regions 10 in the array, increasing the growth rate of the fiber(s) 25 by reducing the precursor's transport time through the fluid. The fibers 25 are drawn backward (as shown by the arrows) as the reaction zones 35 and thermal diffusion regions 10 remain substantially stationary in space. For practical considerations, this arrangement of stationary reaction zones and thermal diffusion regions is often preferred, but not required. Again, the LMM precursor 15 usually tends to concentrate at the regions of greatest temperature surrounding the reaction zones 35. The HMI precursor 20 species tends to be displaced away from the reaction zone 35 at the outside of the thermal diffusion regions 10, and as a result, tends to thermally insulate the array of reaction zones 35. Again, the LMM precursor 15 is decomposed in the reaction zone 35 and deposits, resulting in fiber growth.

As shown in FIG. 4, the planar sheets 70 may alternate between LMM precursor 15 and HMM precursor 20, where the LMM precursor 15 flows directly into the thermal diffusion region 10. Any number of fibers 25 can be grown in this configuration. And any of the alternate primary heating means discussed above can be used, but are not shown in FIGS. 3 and 4.

Thus, from FIGS. 3 and 4, one can see that precursors can be introduced in a wide variety of different ways and configurations, including but not limited to (1) flowed jointly (pre-mixed) into the reaction vessel; (2) flowed co-axially and directed at a reaction zone(s) 35; (3) flowed in alternating sheets and directed at a reaction zone(s) 35; (4) flowed from alternating sources and directed at a reaction zone(s) 35; (5) flowed from separate sources and directed tangential to the reaction zone 35; and (6) flowed from separate sources and directed at an angle relative to each other. IMM precursors may also be used, and introduced as described above. As discussed above, depending on the desired fiber characteristics, a wide variety of HMM precursors and LMM precursors in can be used. The reaction vessel may also optionally include the pressure controlling means discussed above.

It is important to note that the thermal diffusion region 10 need not only be in the gas phase, but may also occur within liquid precursors, critical or supercritical fluids, or combinations of the same. Thus, a mixture of LMM precursor 15 and HMM precursors 20 can enter the reaction vessel as a liquid and remain so within the thermal diffusion region 10 within the liquid. However, in another implementation, the liquid mixture of HMM precursors 20 and LMM precursors 15 can transform locally into a gas at each reaction zone 35, thereby producing a thermal diffusion region 10 within a gas bubble, and a secondary thermal diffusion region 10 in the liquid. Alternatively, one or more precursors, often the HMM precursors 20, can be driven into the reaction vessel as viscous liquids (e.g. silicone oils), viscoelastic polymers (e.g. pitch, rosin), and plastic solids (such as waxes or pitch), which, upon heating, will evaporate and surround each reaction zone 35, thereby creating a thermal diffusion region 10 at each reaction zone 35. In this case, the LMM precursors 15 can be provided as part of the solid or viscous liquid, or they can be flowed into the reaction vessel separately.

Figure 5:
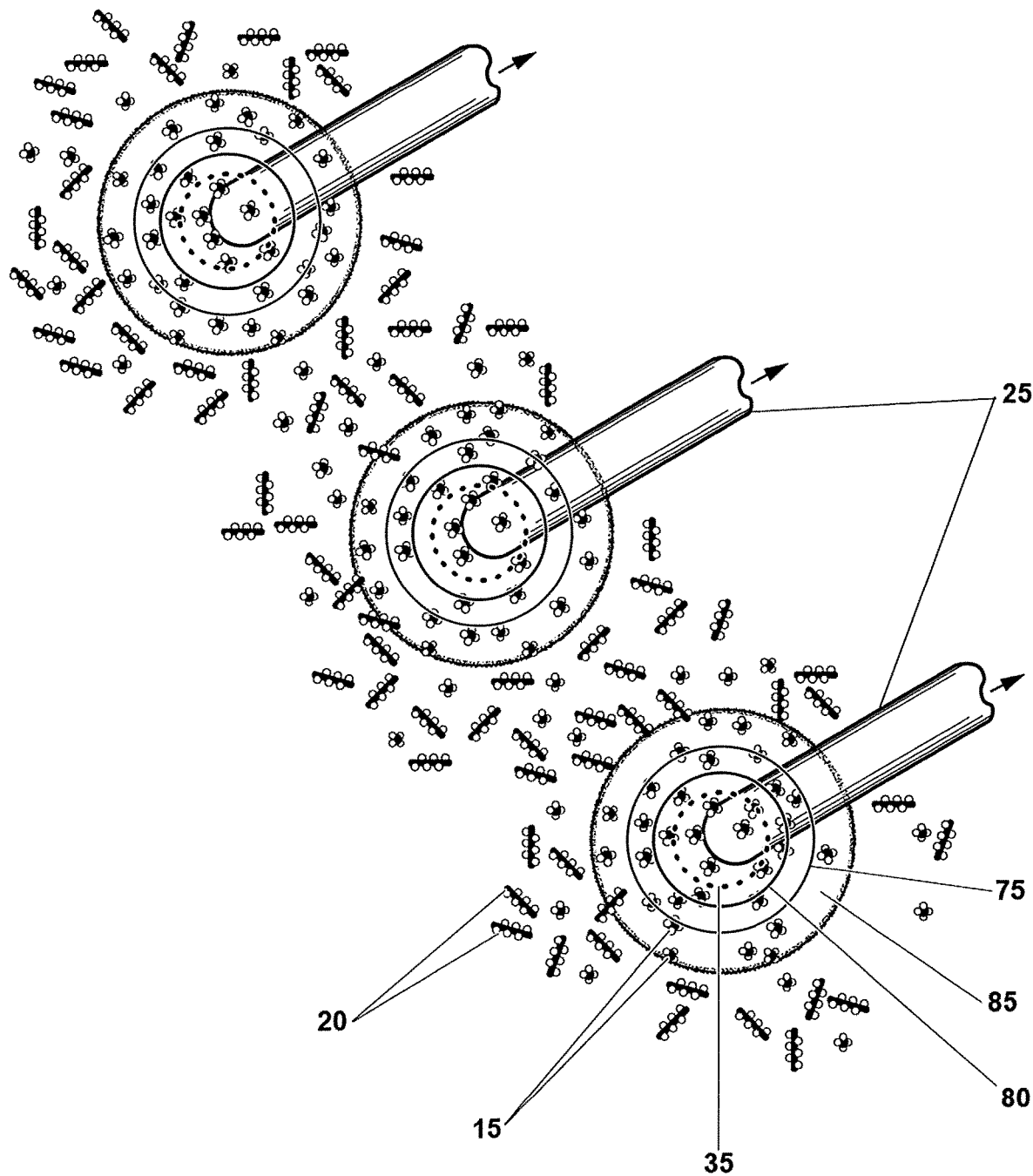
FIG. 5 is one embodiment of the invention depicting a two-phase (e.g. a gas+liquid) system, having two thermal diffusion regions around each fiber.

For example, FIG. 5 shows another embodiment of the invention having thermal diffusion regions that exist in a two-phase, gas+liquid system. In this embodiment, a gas bubble 75 is created. Within the gas bubble 75, there is an internal thermal diffusion region 80 and a reaction zone 35. Also, within the liquid there will be a second, external thermal diffusion region 85. Separation between the HMM and LMM precursors can occur in both regions 80, 85, and the properties of the precursors (including mass) determine the degree of separation in each. Again, the fiber(s) 25 are drawn backwards (shown by the arrow) in this embodiment, while the gas bubbles 75, the thermal diffusion regions 80, 85, and the reaction zones 35 remain substantially stationary in space.

Figure 6:
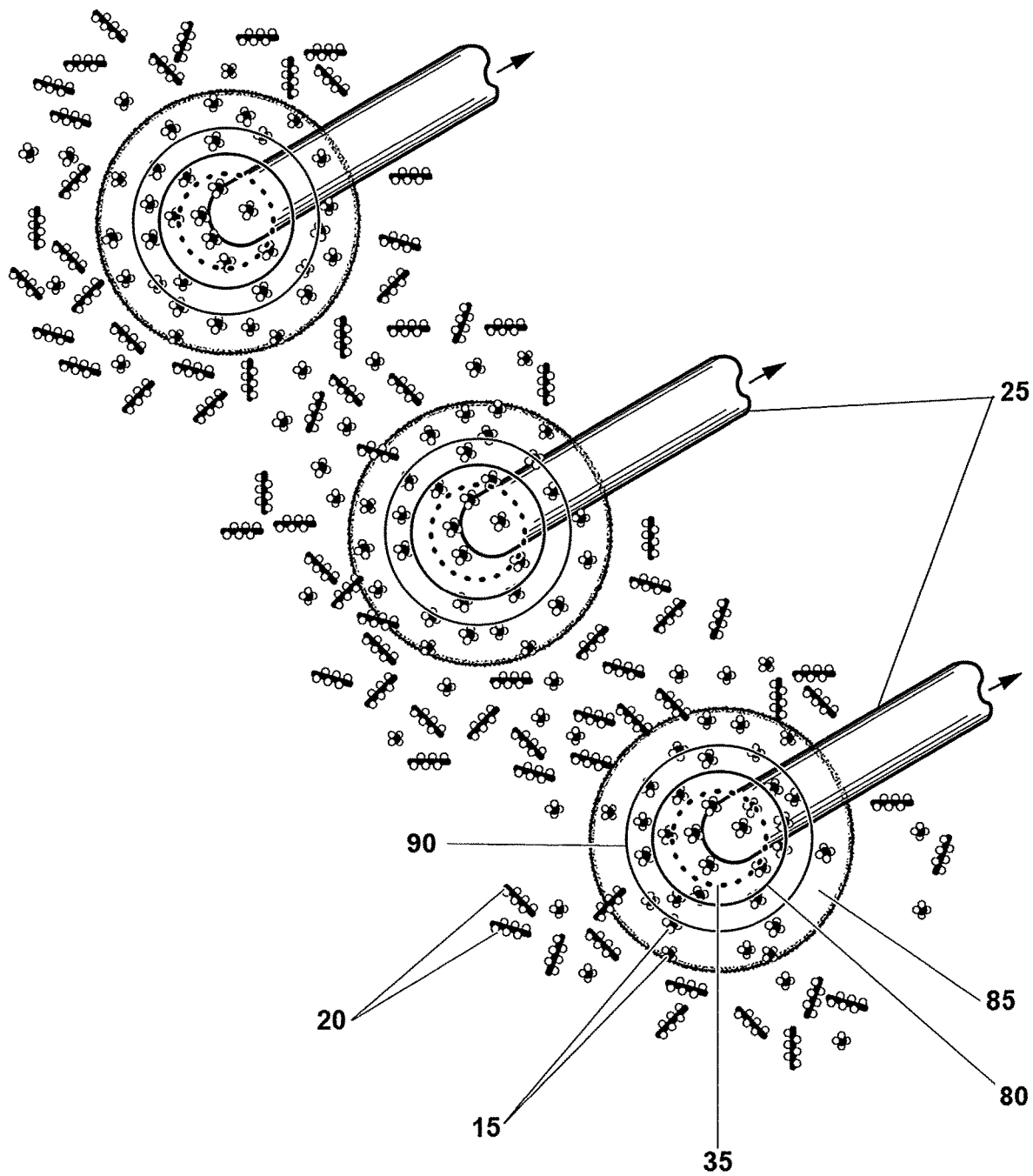
FIG. 6 is one embodiment of the invention depicting a two-phase (e.g. fluid+fluid/solid) system, having two thermal diffusion regions around each fiber.

FIG. 6 shows another embodiment of the invention having two thermal diffusion regions 10 that exist in a "two-phase" system, where one fluid 90 (e.g. a critical/supercritical fluid), can be present around the reaction zone 35, and an internal thermal diffusion region 80 can exist within this fluid 90. Outside of the internal thermal diffusion region 80, another external thermal diffusion region 85 can exist within another fluid or solid phase. Separation can occur in both regions 80, 85, and the properties of the precursors (including mass) determine the degree of separation in each. This embodiment may be utilized, for example, when a highly pressurized liquid or solid precursor mix is heated by one or more primary heating means 40.

Figure 7A:
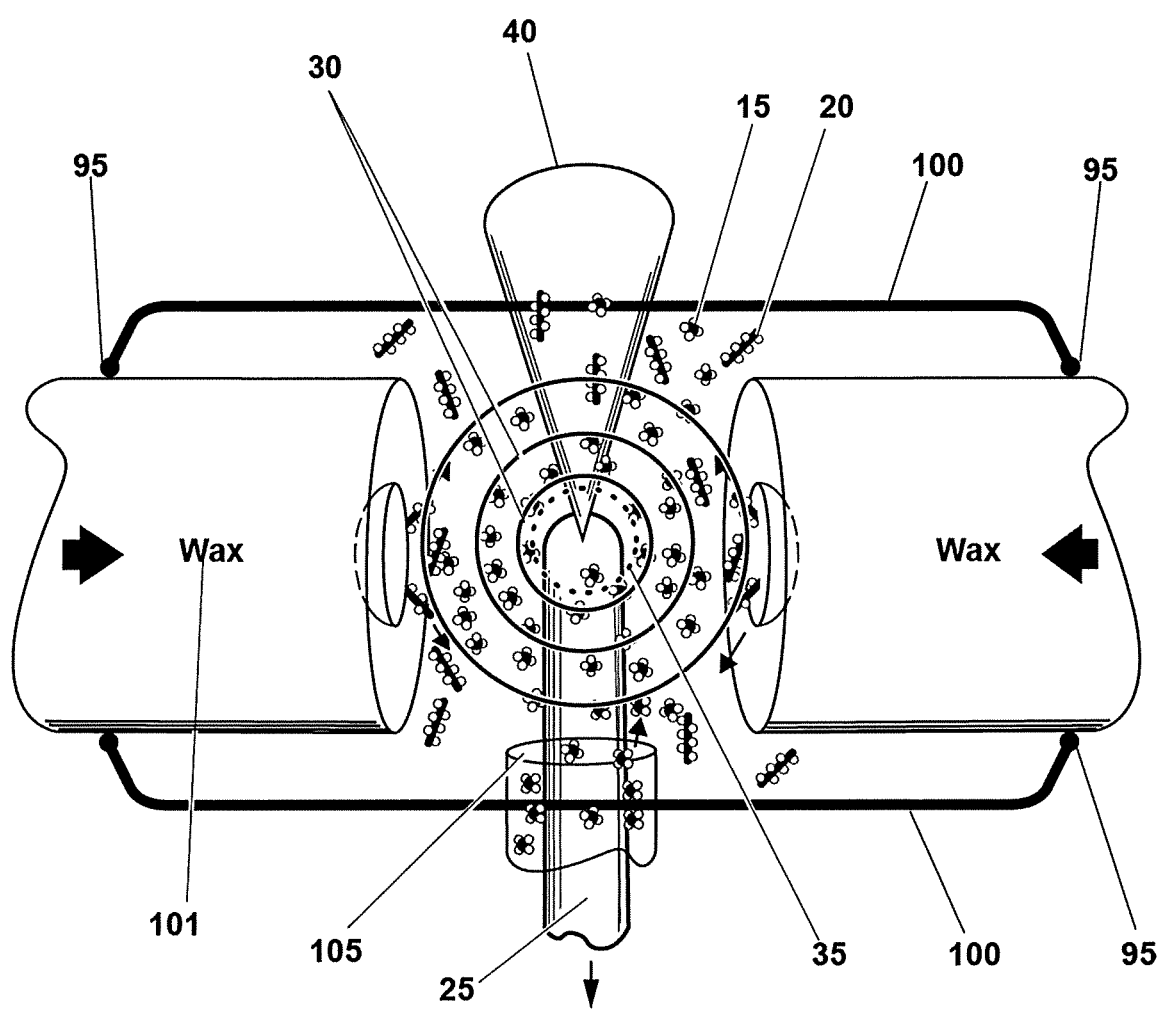
FIG. 7(a) shows one embodiment of the invention using a solid source of HMM precursor.

FIG. 7(a) shows one embodiment of the invention where a solid source (wax in FIG. 7(a)) of HMM precursor 20 is evaporated by one or more primary heating means 40 or secondary heating means 110 (not shown) near a gaseous thermal diffusion region 10. This solid source can be introduced at or near the thermal diffusion region 10 in numerous ways including extrusion through vacuum/pressure seals 95 in the vessel walls 100. Again, the reaction zone 35 and thermal diffusion region 10 remain stationary in this embodiment, while the fiber 25 is drawn backwards (as shown by the arrow). The LMM precursor 15 can be flowed separately through a nozzle 105 to the reaction zone 35, and can be placed in multiple possible orientations, including through a tube in the solid source of HMM precursor 20 (not shown). It is also possible to entrap the LMM precursor 15 within the HMM precursor 20 solid, and to release both at the thermal diffusion region 10.

Figure 7B:
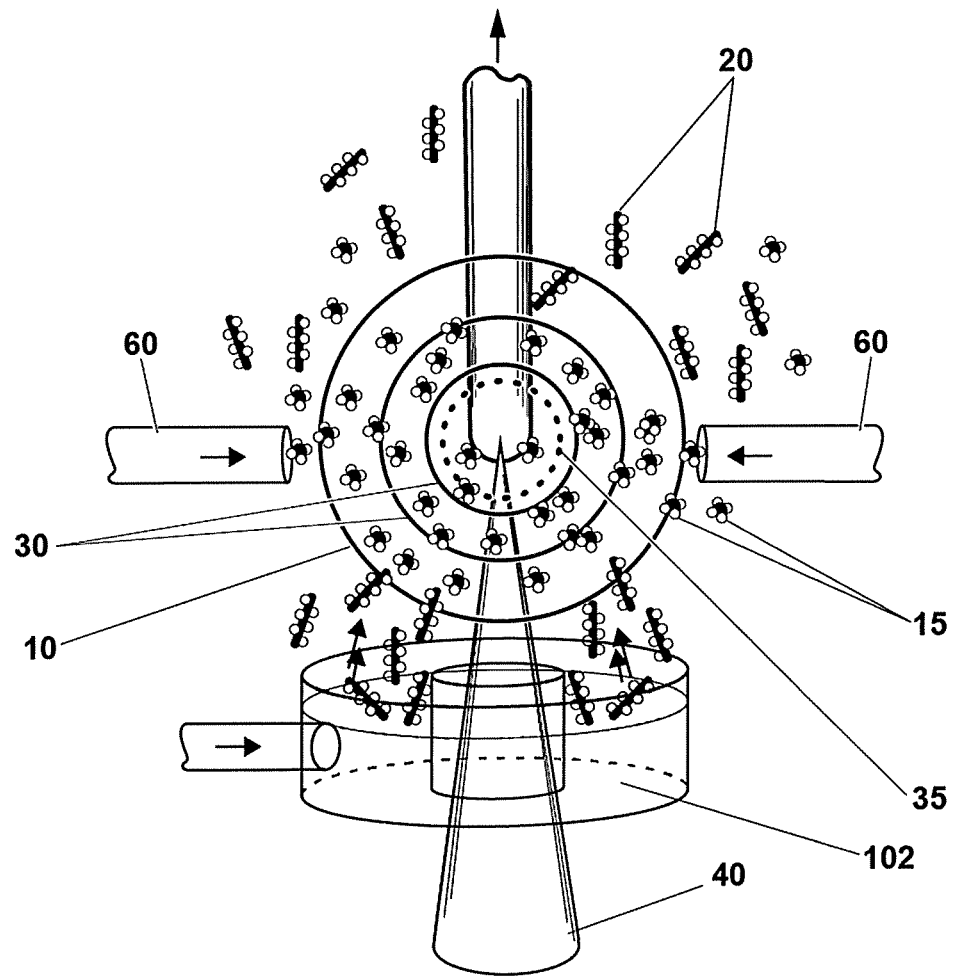
FIG. 7(b) shows one embodiment of the invention using a liquid source of HMM precursor.

FIG. 7(b) shows another embodiment of the invention using a liquid source of HMI precursor 102. The liquid source can be stationary or flowing below the thermal diffusion region 10, where the liquid evaporates to provide the HMM precursor 20. Also shown is a LMM precursor tube 60 for introducing the LMM precursor 15. It is also possible to dissolve or entrap the LMM precursor 15 within the HMM precursor 20 liquid, and to release both at the thermal diffusion region 10.

In the embodiments shown in FIGS. 7(a) and (b), the primary heating means 40 is depicted as a focused laser beam. As discussed herein, other primary heating means 40 can be used, and secondary heating means 110 (not shown) can be employed to control the thermal diffusion region.

Figure 8A:
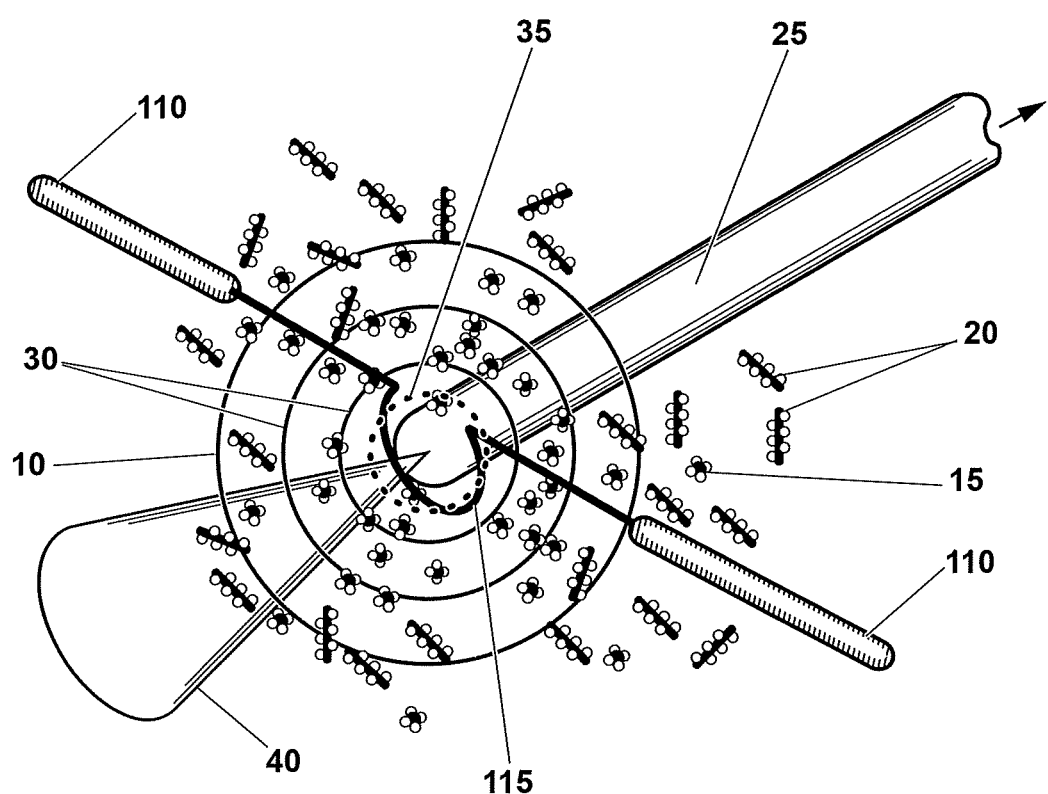
FIG. 8(a) shows one embodiment of the invention using a primary heating means and secondary heating means, namely a wire, having a partial loop.

FIG. 8(a) shows another embodiment of the invention using a secondary heating means 110 (a resistive wire) to heat the thermal diffusion region 10 at the reaction zone 35 of the fiber 25. In this embodiment, the secondary heating means 110 in the thermal diffusion region 10 is a resistive wire preferably of fine diameter, and of resistance sufficient to provide a desired heating rate for the voltage applied. Outside of this region, it could be of larger diameter and/or conductivity to reduce heating elsewhere. In one embodiment, shown in FIG. 8(a), the secondary heating means 110 (wire) has a single partial loop 115. The secondary heating means 110 and single partial loop 115 use resistive heating to heat the fiber and surrounding gas to create and/or enhance a thermal diffusion region 10 and reaction zone 35 around the tip of the fiber 25. FIG. 8(a) also shows the use of a primary heating means 40, which in this embodiment, is a focused laser beam.

Figure 8B:
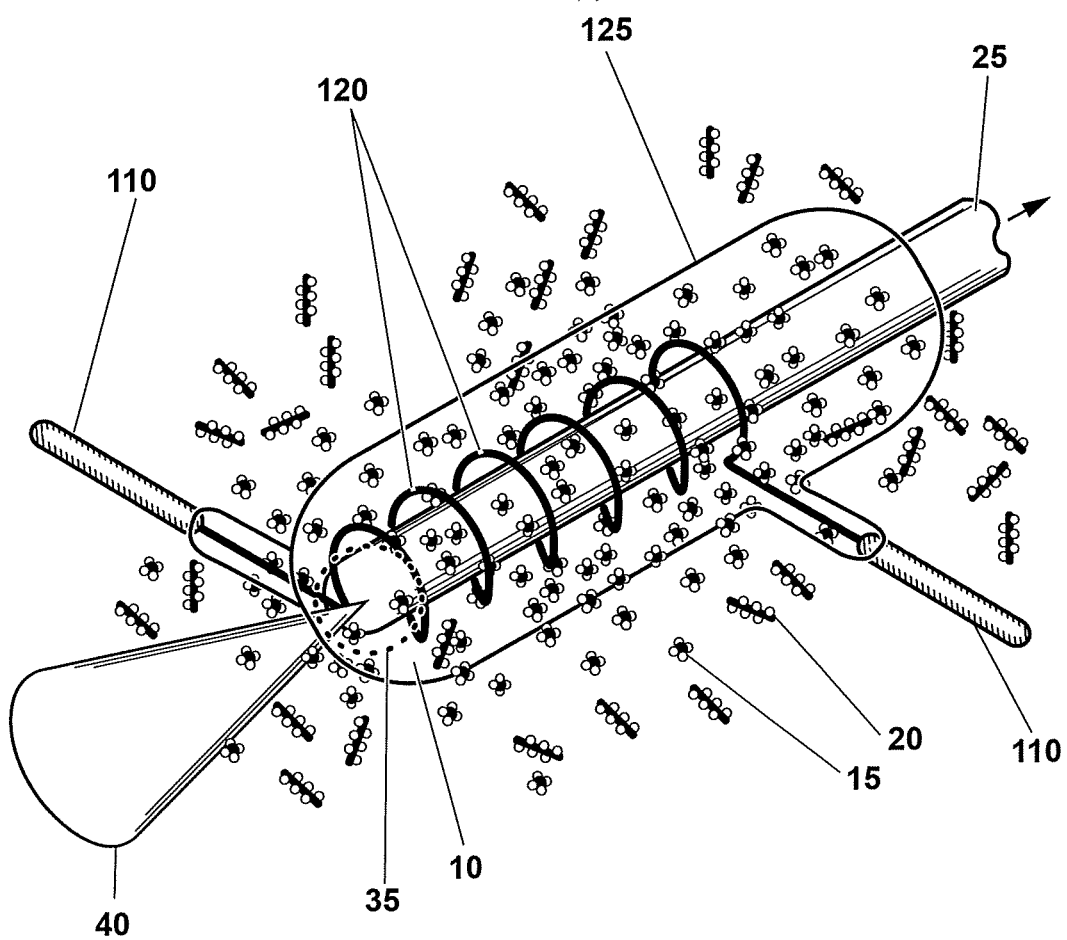
FIG. 8(b) shows one embodiment of the invention using a primary heating means and secondary heating means, namely a wire, having coils.
Figure 9A:
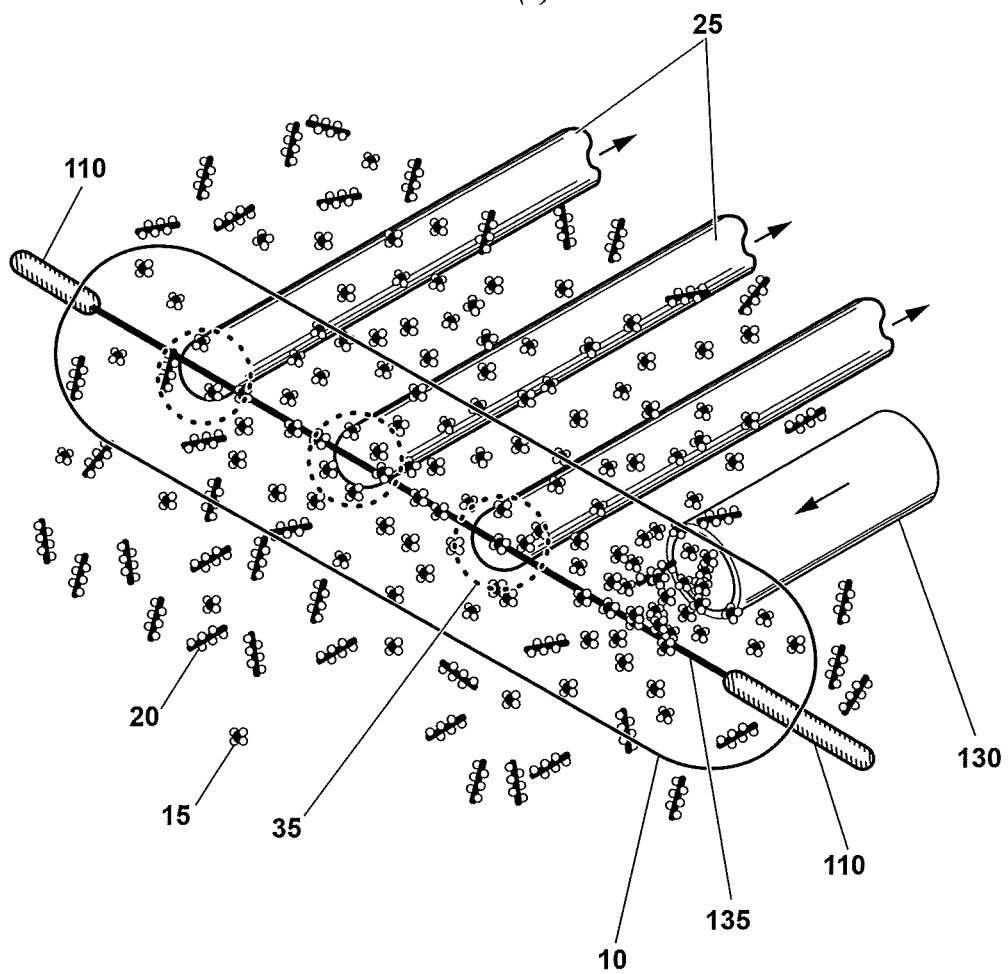
FIG. 9(a) shows one embodiment of the invention using a wire near or in front of an array of growing fibers.
Figure 9B:
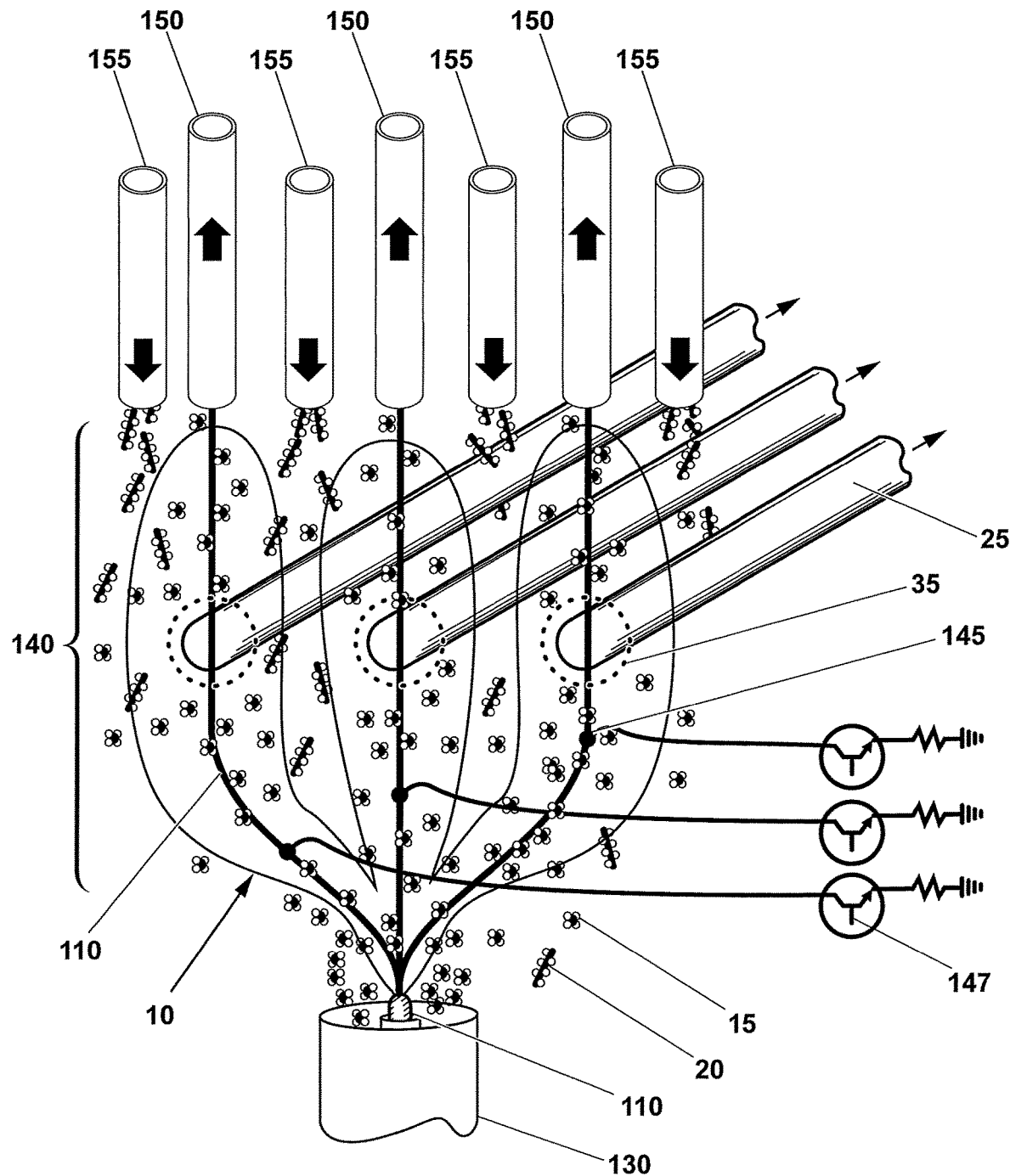
FIG. 9(b) shows one embodiment of the invention using a wire manifold and individual wires that can be modulated.

FIG. 8(b) shows another embodiment of the invention using a secondary heating means 110 comprised of a wire coil 120 surrounding a fiber 25. This allows the creation of an elongated thermal diffusion region 125. This wire coil 120 could also be considered a primary heating means, if it were to raise the temperature of the fiber and reaction zone through inductive heating.

Thus, in many embodiments (as shown in FIGS. 8 (a) and (b)), both primary and secondary heating means 40 and 110 are commonly used. In general, we distinguish a primary heating means 40 as the primary driving force that induces decomposition of the precursor at a reaction zone 35; while a secondary heating means generally drives/controls the fluid temperature and thermal diffusion region 10 surrounding a fiber 25. In practice, a primary heating means 40 can also influence the temperature of the fluid and the thermal diffusion region 10 through heat conduction to the fluid from the fiber, and a secondary heating means 110 can influence the temperature of the fiber 25 (and reaction zone 35) through heat conduction to the fiber from the gas. However, in most implementations, the temperature at the reaction zone is higher than that of the surrounding fluids, and heat tends to flow from the fiber to its surroundings, which allows the primary heating means (incident on the fiber) to dominate the local temperature of the reaction zone 35, and the secondary heating means to dominate control of the size, shape, and gradient of the thermal diffusion region 10 (which extends outward from the fiber). Careful design and placement of the secondary heating means can enhance this control.

As mentioned before, when a secondary heating means is used, in addition to influencing the thermal diffusion region, it can partially decompose the HMM precursor 20 or LMM precursor 15 near the reaction zone 35, thereby creating another set of precursor species of even lower molar mass (which we denote as a "derived precursor species").

Thus, in one embodiment of the invention for fabricating fibers, at least one LMM precursor 15 is flowed into a reaction vessel and at least one HMM precursor 20 is introduced to the reaction vessel. As described above, the HMM precursor 20 preferably has a molar mass 1.5 to 3 times greater, and more preferably three or more times greater than the LMM precursor 15, and preferably a thermal conductivity substantively lower than that of the LMM precursor 15. One or more reaction zone(s) 35 are created within the reaction vessel by one or more primary heating means 40, resulting in the decomposition of at least one precursor species. The decomposition results in the growth of a solid fiber(s) 25 at each said reaction zone(s) 35. The solid fibers 25 can have a first end at or near the reaction zone(s) 35 and a second end that is drawn backward through a tensioner 45 and wound on a spooling device/mandrel 50 at a rate to maintain the first end within the reaction zone(s) 35. Other means can be used to remove the fiber from the reaction zone. One or more thermal diffusion region(s) 10 are established at/near said reaction zone(s) 35 to partially- or wholly-separate said LMM precursor 15 species from said HMM precursor 20 species using the thermal diffusion effect, thereby concentrating the LMM precursor 15 species at each reaction zone(s) 35. In this embodiment, a secondary heating means 110 using a heated wire is passed through or configured in proximity to the reaction zone 35 to further concentrate the LMM precursor 15 species at/near said heated wire(s) and reaction zone(s) 35, and the concentrated LLM precursor 15 substantively enhances the growth of the solid fiber(s) and the HMM precursor 20 species decreases the flow of heat from the reaction zone(s) 35, relative to that which would occur using the LMM precursor 15 species alone. Although one wire is shown in FIGS. 8(*a*) and (*b*), multiple wires can be used. Also, the wire can encircle the reaction zone 35. The term "encircle" is used to describe that the wire surrounds the reaction zone, but not necessarily in a circular configuration. For example, the wire can "encircle" the reaction zone in a star configuration, square configuration, circle configuration, or other desired shape. In this implementation, IMM precursors may also be used. As discussed above, depending on the desired fiber character- istics, a wide variety of HMM precursors 20 and LMM precursors 15, in various forms (gas, liquid, solid, critical, supercritical, etc.) can be used. The reaction vessel may also optionally include the pressure controlling means discussed above. In some related embodiments, each reaction zone 35 has only one primary heating means 40, while in other embodiments, each reaction zone has two or more primary heating means 40.

FIG. 9(*a*) shows another embodiment of the invention used to fabricate solid fiber(s). Generally, at least one LMM precursor 15 species is introduced, or flowed into a vessel, in proximity to at least one secondary heating means 110 (e.g. the heated wire shown), and at least one HMM pre- cursor 20 species is introduced into the vessel. As discussed above, the HMM precursor 20 preferably has a mass sub- stantively greater than the LMM precursor 15 species, and preferably of thermal conductivity substantively lower than that of the LMM precursor 15 species. The HMM precursor 20 can be provided by any of the other methods discussed herein. In this implementation, the thinner, hot portion of the wire 135, creates an elongated thermal diffusion region 10; this elongated thermal diffusion region geometry provides a preferred conduit that follows the secondary heating means 110 (wire in this embodiment), along which the LMM precursor 15 will flow to reach reaction zones 35. The array of reaction zones 35 are created within the vessel by one or more primary heating means 40 (not shown for clarity), and decomposition of at least one of the precursor species occurs; this decomposition results in the growth of solid fiber(s) 25 at each said reaction zone(s) 35. The solid fibers 25 have a first end at the reaction zone(s) 35 and a second end that is drawn backward (shown by the arrow). The second end can be drawn backward by a spooling device/ mandrel 50 (not shown) and may include a tensioner 45 (not shown). Preferably, the second end(s) are drawn at a rate to maintain the first end(s) within the reaction zone(s) 35.

In a related implementation to FIG. 9(*a*), at least one thermal diffusion region 10 is created or established at/near the reaction zone(s) to partially or wholly separate the LMM precursor 15 species from the HMM precursor 20 species using the thermal diffusion effect, thereby concentrating the LMM precursor 15 species at each reaction zone(s) 35. A secondary heating means 110 (wire in this embodiment) is passed or configured in proximity to the reaction zone(s) 35, to further concentrate the flow of LMM precursor 15 species along the heated wire(s) and into the reaction zone(s) 35 using the thermal diffusion effect, thereby creating a selec- tive conduit to flow the LMM precursor 15 species to the reaction zone(s) 35. By concentrating the LMM precursor 15 species as described, it substantively enhances the growth of solid fiber(s) 25, and the HMM precursor 20 species substantively decreases the flow of heat from said reaction zone(s) 35, relative to that which would occur using the LMM precursor 15 species alone.

FIG. 9(*b*) shows another embodiment and implementa- tion, where one or more sources of LMM precursor 130 supply LLM precursor 15 to a manifold of thermal diffusion conduits 140, where the LLM precursor 15 branches and flows along individual thermal diffusion conduits, created by individual secondary heating means 110 (wires) that can be electrically-modulated via switches (represented by the tran- sistor symbol). As the electrical current can be switched away from the reaction zones 35 to the transistors, the switch connections 145 acts as "thermal diffusive valves" that modulate the instantaneous flow of the LLM precursor 15 to (or away from) each fiber 25. In FIG. 9(*b*), the HMM precursor 20 is provided by a HMM precursor supply source 155, but the HMM precursor 20 can be provided by any of the other methods discussed herein. In addition, the byprod- ucts of the reaction are also carried along the secondary heating means 110 (wire), and given the general flow direction, tend to be removed at separate outlet manifolds 150. In this way, the thermal diffusion regions 10 and secondary heating means 110 "conduits" can be used to remove byproducts that can otherwise affect the reaction. Thus, in some embodiments, byproduct species from the decomposition are flowed away from the reaction zone 35 along one or more of the secondary heating means 110, thereby removing the byproduct species from the reaction zone 35, and dispersing them into the reaction vessel, or allowing them to be removed from the reaction vessel altogether (for example, via an outlet manifold 150). Sepa- rate inlets are provided for the HMM precursor supply source 155, as shown.

Also remember that using the embodiment of FIG. 9(*b*), the electrical current in the wire can be controlled to modulate the concentration of LMM precursor 15 and HMM precursor 20 present at the reaction zone 35, thereby con- trolling the decomposition and growth of the solid fiber 25 independent of the primary heating means 40 (not shown for clarity). By modulating the concentration of the precursors, solid fibers can be grown with desired geometries, diam- eters, microstructures, compositions, physical properties, chemical properties, coatings (including presence, absence, or thickness of the coating), and growth rates (collectively referred to herein as "fiber characteristics").

In a similar embodiment to the invention of FIG. 9(*a*), each secondary heating means 110 (wire) may be comprised of two or more thin wire sections, with a thicker (less resistive) short section in-between. This in-between section may be heated by a laser beam (or other heating means) to modulate the flow of the LMM precursor 15 to the reaction zone 35, effectively creating a structure similar to a "thermal diffusion transistor." In another implementation, one or more sections may have attached cooling fins that may be heated resistively and used to modulate the flow of the LMM precursor 15 to the reaction zone 35 (another form of a thermal diffusion switch/transistor). In another implementation, one or more of the secondary heating means 110 (wire) sections may also have attached dispersion wires that may be heated resistively to disperse the LMM precursor 15 species elsewhere and used to modulate the flow of LMM precursor 15 species in real-time to the reaction zone(s) 35 (i.e., the dispersion wires act as an inverse thermal diffusion valve). The heated wires may also be in the form of a microtube that is heated by passing hot fluid through the microtube.

In most embodiments, the invention incorporates feedback means to measure characteristics of the fibers 25 being fabricated, and then use this feedback to control one or more aspects of the fabrication process and ultimately fiber characteristics/properties. Measurements of the geometry, microstructure, composition, and physical properties of the fibers can be made as they are grown. This feedback can be used to control the primary heating means(s) 40 and/or secondary heating means 110. For example, in FIG. 9(*b*), the electrical current through the secondary heating means 110 (which form the conduits of manifold 140) can be controlled to alter the ongoing fabrication of the fibers 25. This can be done independently, or at least partially independently, of any primary heating means 40 being used. For example, if the feedback means detects a composition of a fiber that results from a less-than-optimum LMM precursor concentration at the reaction zone 35, the current through the wire can be increased, thereby increasing the temperature of the wire, and flowing additional LMM precursor through the conduit to obtain the desired fiber composition.

The feedback means (not shown in FIG. 9(*b*)) include electromagnetic sensing devices and can be of various types known to those of skill in the art. A non-exhaustive list of examples of feedback means include real-time FT IR spectroscopy, Raman spectroscopy, fluorescence spectroscopy, X-ray analysis, two and three color pyrometry measurements, and optical, UV, and IR imaging, narrow band detection of emission/absorption lines, reflectivity/absorption measurements, etc. Similarly, feedback means for the concentration/density of LMM precursors 15 and HMM precursors 20 species in the thermal diffusion regions 10 and/or reaction zones 35 can be obtained using real-time shadowgraphy, Schlieren techniques, and spectroscopy techniques. In other embodiments, the feedback means can be acoustic sensing devices. This is not intended as an exhaustive list. Various feedback means can be used individually or in combination.

Other devices and methodologies can also be used to obtain feedback of the process, and control the fabrication. In some embodiments, either together with one or more of the options discussed above, or by itself, the thermal diffusion regions 10 and/or the reaction zone 35 can be measured with real-time shadowgraphy or Schlieren imaging techniques to obtain feedback on the relative concentration/densities of the LMM precursors 15 species relative to the HMM precursor 20 species. Thus, in this embodiment, the feedback means is measuring the thermal diffusion region 10 and/or the reaction zone 35, rather than the fiber characteristics. This feedback can be used as input to control one or more aspects of the fabrication process, for example, modifying the primary heating means 40 or secondary heating means 110 to obtain solid fibers at a desired rate with desired fiber characteristics.

Figure 10:
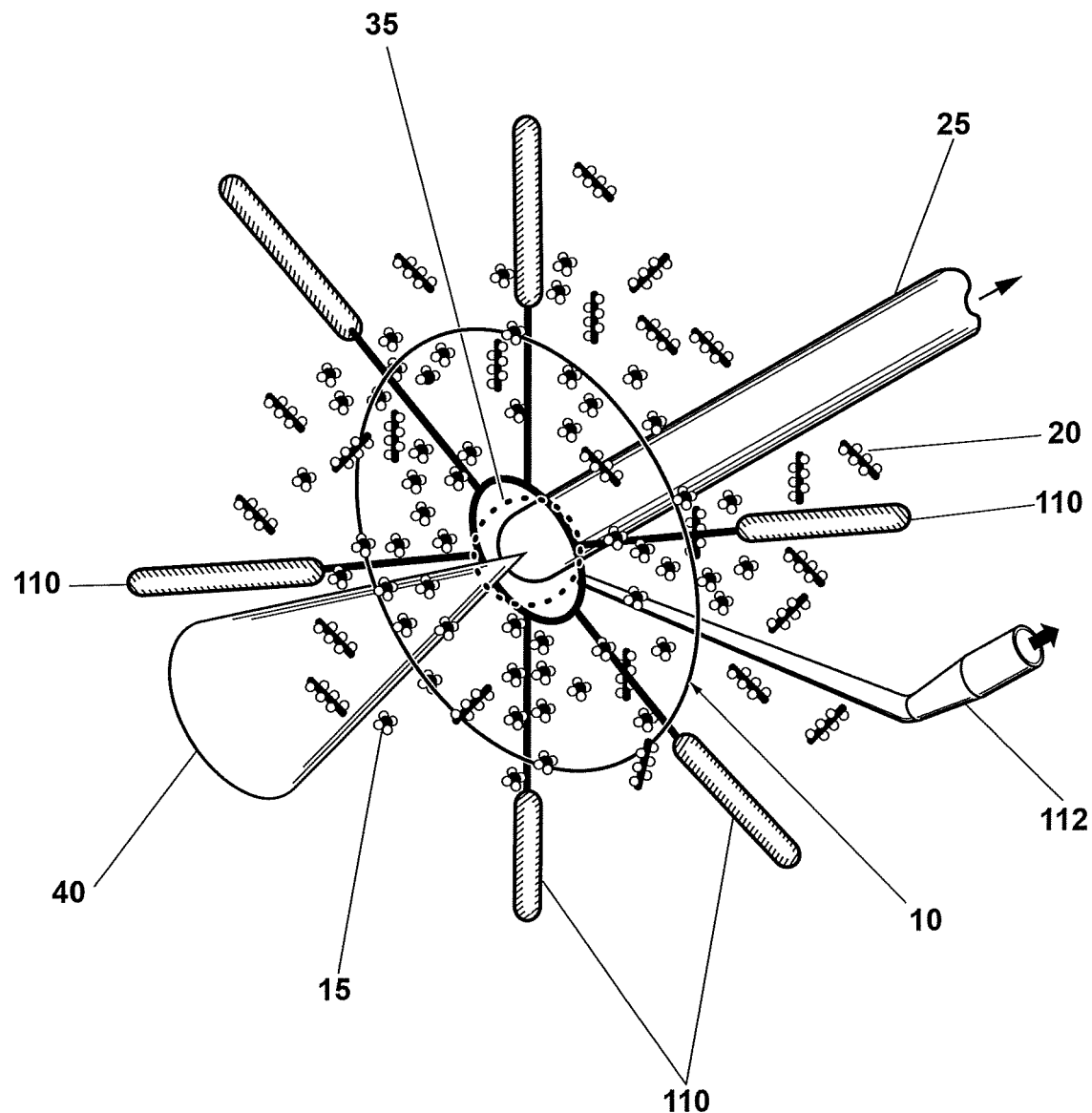
FIG. 10 shows one embodiment of the invention having a series of wires near or in front of a fiber.

FIG. 10 shows another embodiment of the invention. In this embodiment, a series of secondary heating means 110 (in the form of wires) are connected to a current source (not shown) and converge on and surround the reaction zone 35 of fiber 25. The flow of current through any particular wire 110 can be regulated to control the heating rate of that wire. In one embodiment where the LMM precursor 15 and HMM precursor 20 are in a gas mixture, the concentration of the LMM precursor 15 can be varied by modulating the amount of current in the wires 110. When all the wires 110 are heated, the LMM precursor 15 is drawn out of the surrounding gas mixture and is concentrated at the reaction zone 35. When the wires are turned off, the concentration of LMM precursor 15 is diminished. The primary heating means 40 in this embodiment is a focused laser beam. The return conductor 112, provides a return path for the current from wires 110.

Figure 11:
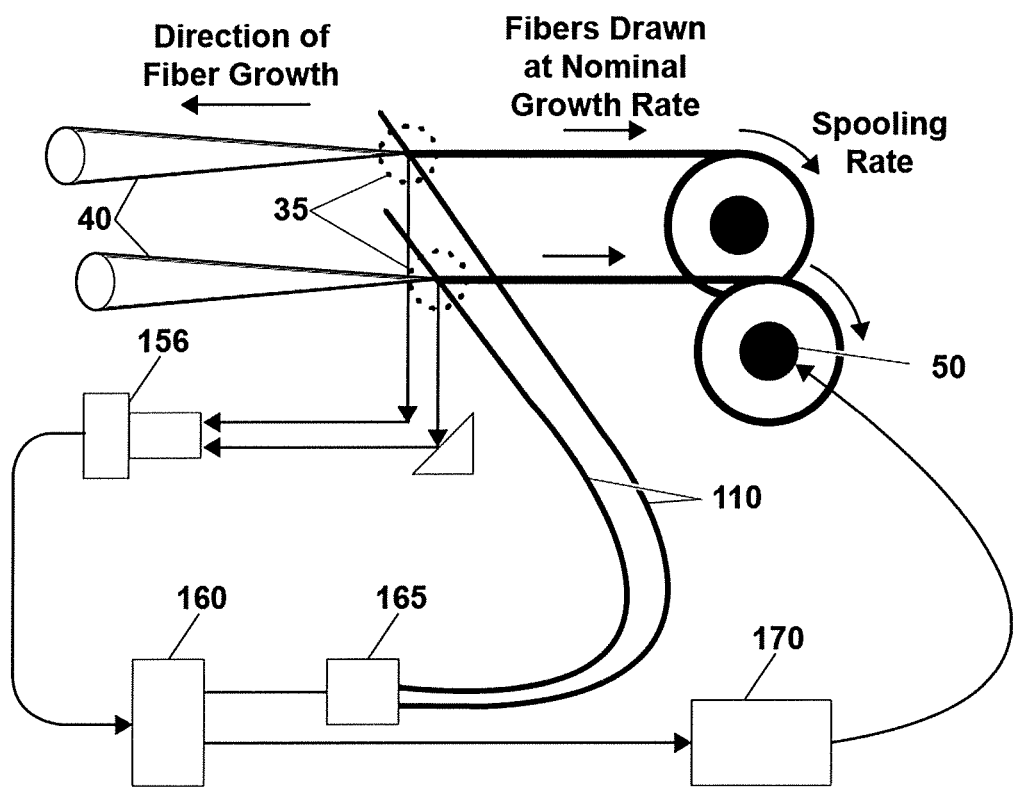
FIG. 11 shows a flow diagram of one embodiment of the invention.

FIG. 11 shows a flow diagram of one embodiment of the invention with feedback means 156 which are used to control the growth of multiple fibers, by modulating the reaction zones 35 (shown) and thermal diffusion regions 10 (not shown). In this particular implementation, a vision system is used as the feedback means 156, which can track the growth and characteristics of many fibers at once. Based on the input from the vision system, a controller 160 determines what parameter changes in the fabrication process need to be made, if any, to achieve the desired fiber growth rates and properties; the controller 160 contains the necessary hardware and software to receive the vision system inputs and pass appropriate signals to a multi-output analog amplifier 165 and/or motor controller driver 170. Here, the analog amplifier 165 provides current to the secondary heating means 110 (which are in the form of wires). The current in the wires control the thermal diffusion region (not shown) and concentration of LMM precursor in reaction zones 35. The return path for the current in each wire is not shown. With input from controller 160, the motor controller driver 170 controls the spooling device/mandrel 50, and the winding rate of the fiber. In this way, controller 160 can modulate/control the fiber growth rate and properties, such as diameter, composition, microstructure, and bulk material properties—as well as process parameters such as precursor concentrations, flow rates, pressures, and induced temperatures. The controller 160 and its various configurations and interactions with the other elements used to control fiber growth and properties may be referred to herein as "controlling means."

Thus, in one embodiment, the invention comprises a system for fabricating solid fiber(s) 25 having one or more reaction vessels, each reaction vessel containing or having an associated one or more primary heating means 40 and one or more secondary heating means 110. In use, the primary and secondary heating means create one or more reaction zones 35 and thermal diffusion regions 10 in each reaction vessel where fibers 25 are grown. The system can incorporate one or more spooling devices/mandrel 50 and tensioners 45 for grown fibers 25. The system can also include one or more precursor inlet channel(s), and one or more byproduct outlet channels. In practice, a precursor inlet channel allows the flow of LMM precursor 15 and HMM precursor 20 to flow into the reaction vessel. The primary heating means 40 can remain activated and can provide a relatively steady temperature in the reaction zone 35 and thermal diffusion region 10. The secondary heating means 110 can then be used to modulate/control the concentration of the LMM precursor 15 relative to the HMM precursor 20 at the thermal diffusion region(s) 10 and reaction zones 35. As before, any of the heating means discussed herein can be used for the primary heating means 40 and for the secondary heating means 110.

In one embodiment, the secondary heating means 110 is chosen from the group of: resistively heated wire(s), or focused infrared-, microwave-, millimeter-wave-, terahertz-, or radio-frequency electromagnetic radiation. If a resistively heated wire is used, in some embodiments, the heated wire(s) passes through, or encircles, the reaction zone(s) 35. In other embodiments, heated wires are interconnected to create at least one thermal diffusive valve. In some embodiments, the heated wire extends to the precursor inlet channel, creating a thermal diffusive conduit to the reaction zone 35 and thermal diffusion region 10, and/or the heated wire extends to the byproduct outlet channel thereby creating a thermal diffusive conduit (for example, see FIG. 9(b)). The same feedback means and control devices discussed above can be used to control the process (for example, the secondary heating means) to control the fiber characteristics of the fibers 25 being fabricated.

Figure 12:
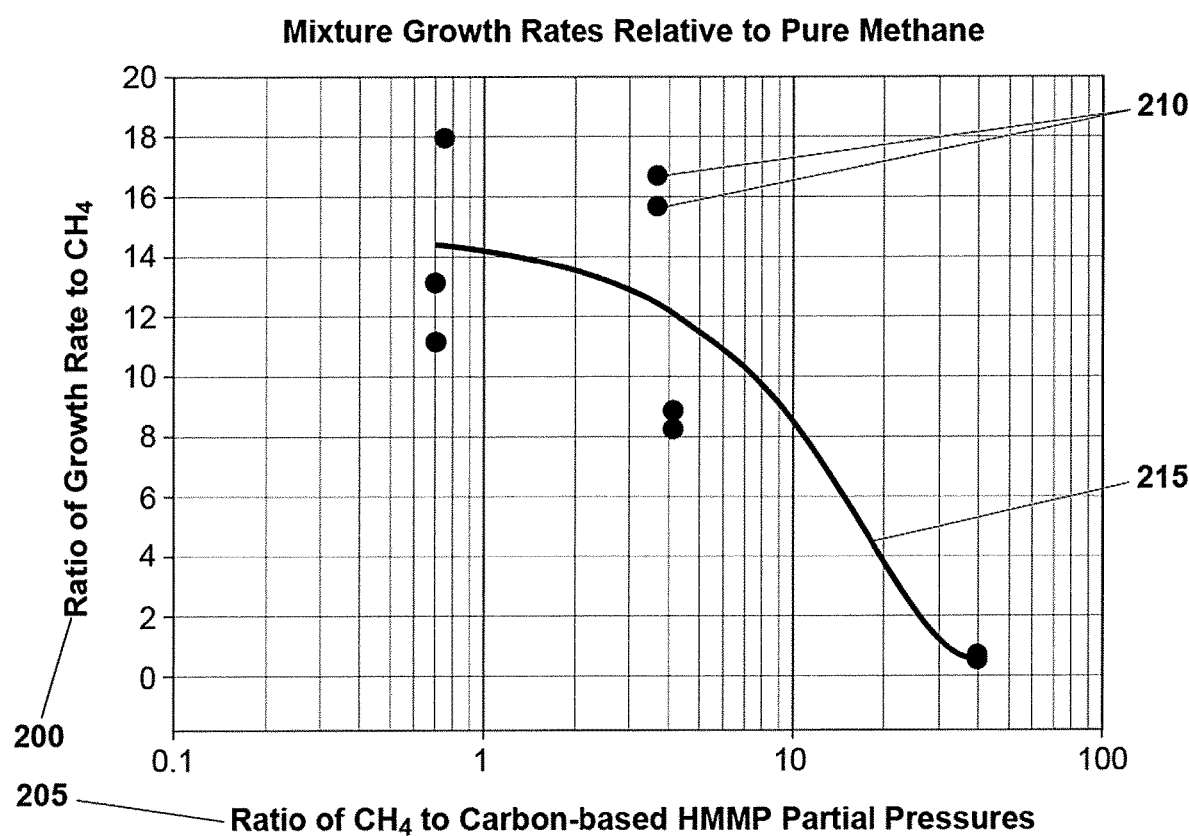
FIG. 12 is a graph showing the growth rate chart of a particular embodiment of the invention using methane as the LMM precursor and various more massive hydrocarbon HMI precursors at different LMM:HMM partial pressures.

FIG. 12 is a graph showing the growth rate chart of a particular embodiment of the invention using methane as the LMM precursor 15 and various more massive hydrocarbon HMM precursors 20, at different LMM:HMM partial pressures. The vertical axis 200 represents the growth rate of the fiber relative to the expected growth rate of pure methane at the same methane partial pressure. The horizontal axis 205 represents the ratio of methane to the hydrocarbon HMM precursor partial pressures. The data 210 shows that when the partial pressure of the HMMP precursor is large enough (i.e. $>¼^{th}$ that of the methane), a growth enhancement of at least one order of magnitude occurs relative to that of pure methane. The line 215 is curve fit to this data, and approaches the growth rate of pure methane as the HMMP partial pressure approaches zero.

Figure 13:
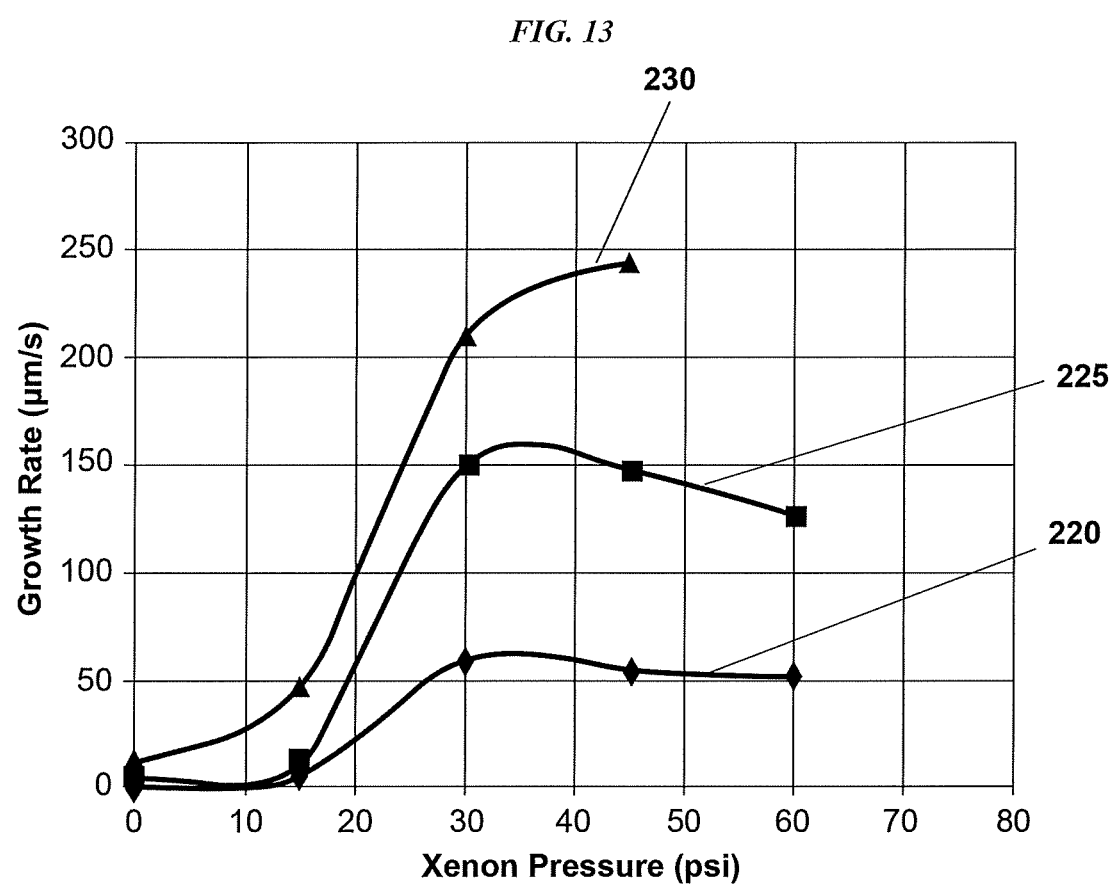
FIG. 13 is a graph showing the growth rate chart of a particular embodiment of the invention using methane as the LMM precursor and Xenon (inert gas) as the HMM precursor, at different pressures.

FIG. 13 is a graph showing the growth rate chart of a particular embodiment of the invention using methane as the LMM precursor 15 and Xenon as the HMM precursor 20, at different pressures. Result #1 220 shows the graph for $CH_4$ at 15 PSI, Result #2 225 shows the graph for $CH_4$ at 30 PSI, and Result #3 230 shows the graph for $CH_4$ at 45 PSI. The vertical axis shows the growth rate of the fiber 25 in μm/s and the horizontal axis shows the Xenon pressure in PSI. This result also shows a large enhancement in the growth rate of methane, simply by adding an inert HMM precursor that is much more massive than the LMM precursor.

Figure 14:
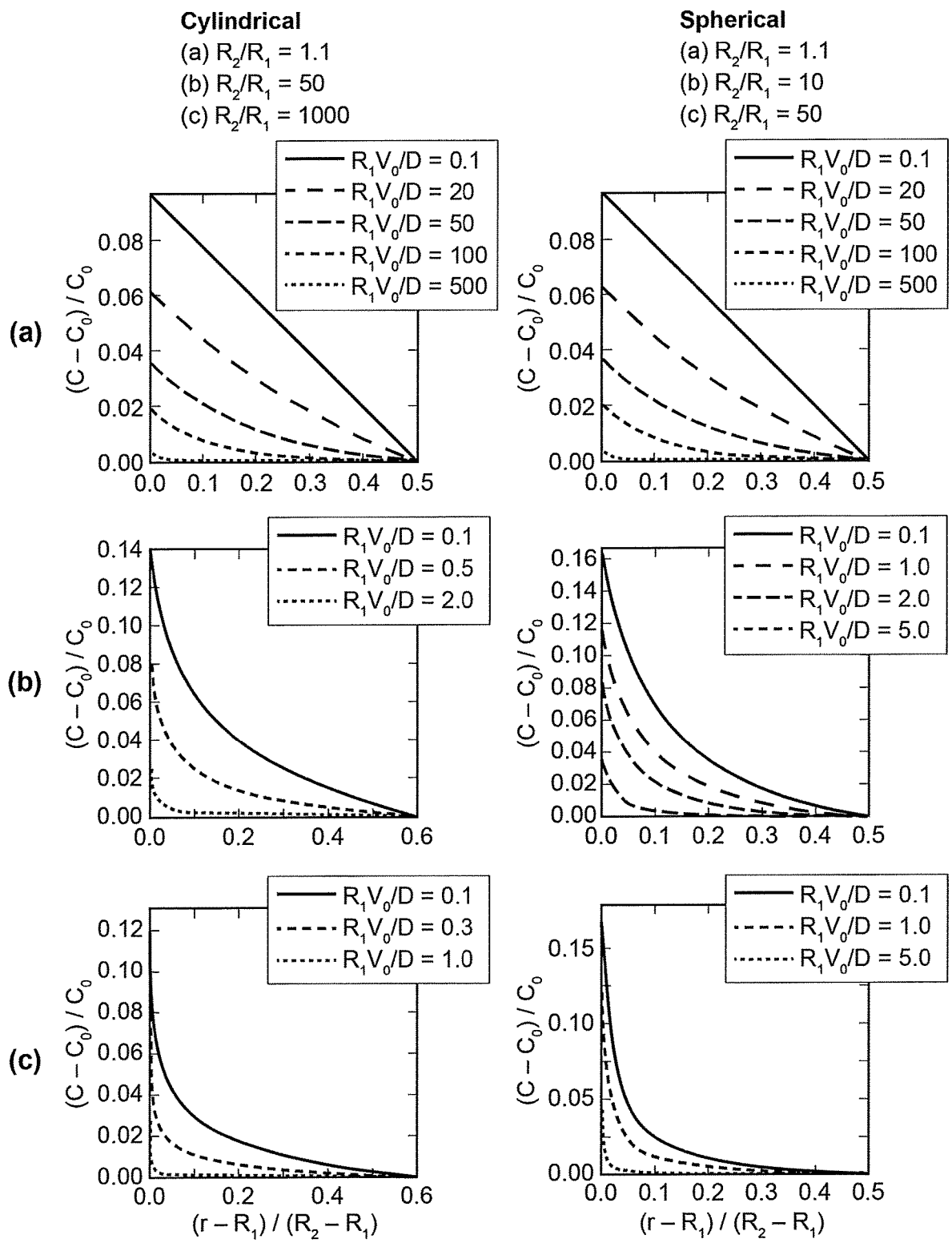
FIG. 14 shows expected thermal diffusion region separation graphs for gases for different geometries.

FIG. 14 shows expected thermal diffusion region separation graphs for gases. These graphs provide a (normalized) measure of the expected separation during fiber growth, given gaseous precursors of different masses (one LMM precursor 15, one HMM precursor 20), with a constant flow velocity. Two thermal diffusion region 10 geometries are provided (cylindrical and spherical) with various sized thermal diffusion regions 10 (which depend on pressure and the induced temperature by the primary heating source 40 as well as the secondary heating source(s) (e.g. wires 110)). Changing the size of the thermal diffusion region 10 directly affects the concentration of LMM and HMM precursors near/at the reaction zone 35, which will in turn affect the growth rate of the fiber(s) 25.

Figure 15:
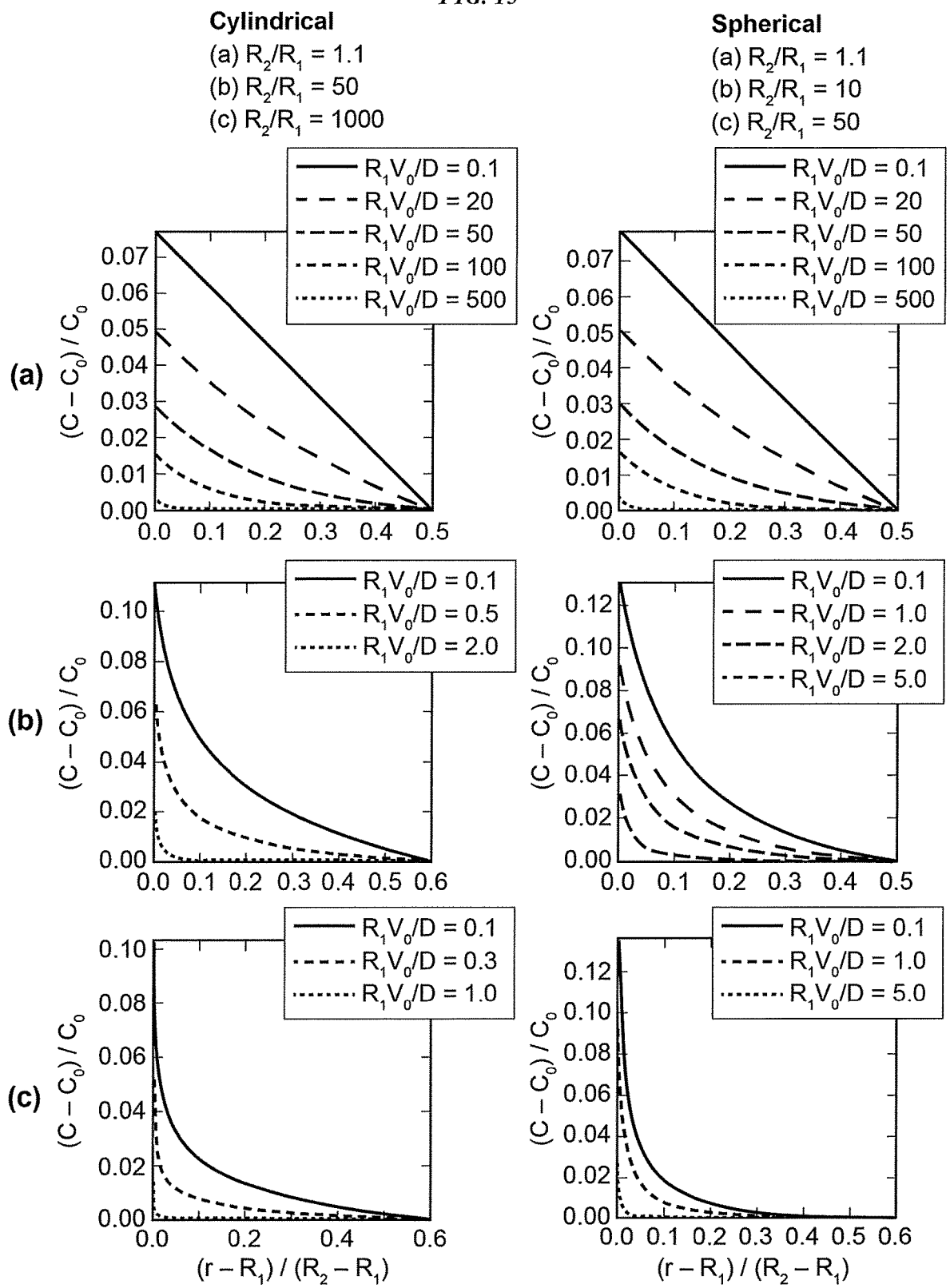
FIG. 15 shows expected thermal diffusion region separation graphs for liquids for different geometries.

FIG. 15 shows expected thermal diffusion region separation graphs for liquids. These graphs provide a (normalized) measure of the expected separation during fiber growth, given liquid precursors of different masses (one LMM precursor 15, one HMM precursor 20), with a constant flow velocity. Two thermal diffusion region 10 geometries are provided (cylindrical and spherical) with various sized thermal diffusion regions 10 (which depend on pressure and the induced temperature by the primary heating means 40 as well as the secondary heating means (e.g. wires 110)). Changing the size of the thermal diffusion region 10 directly affects the concentration of LMM and HMM precursors near/at the reaction zone 35, which will in turn affect the growth rate of the fiber(s) 25.

Figure 16:
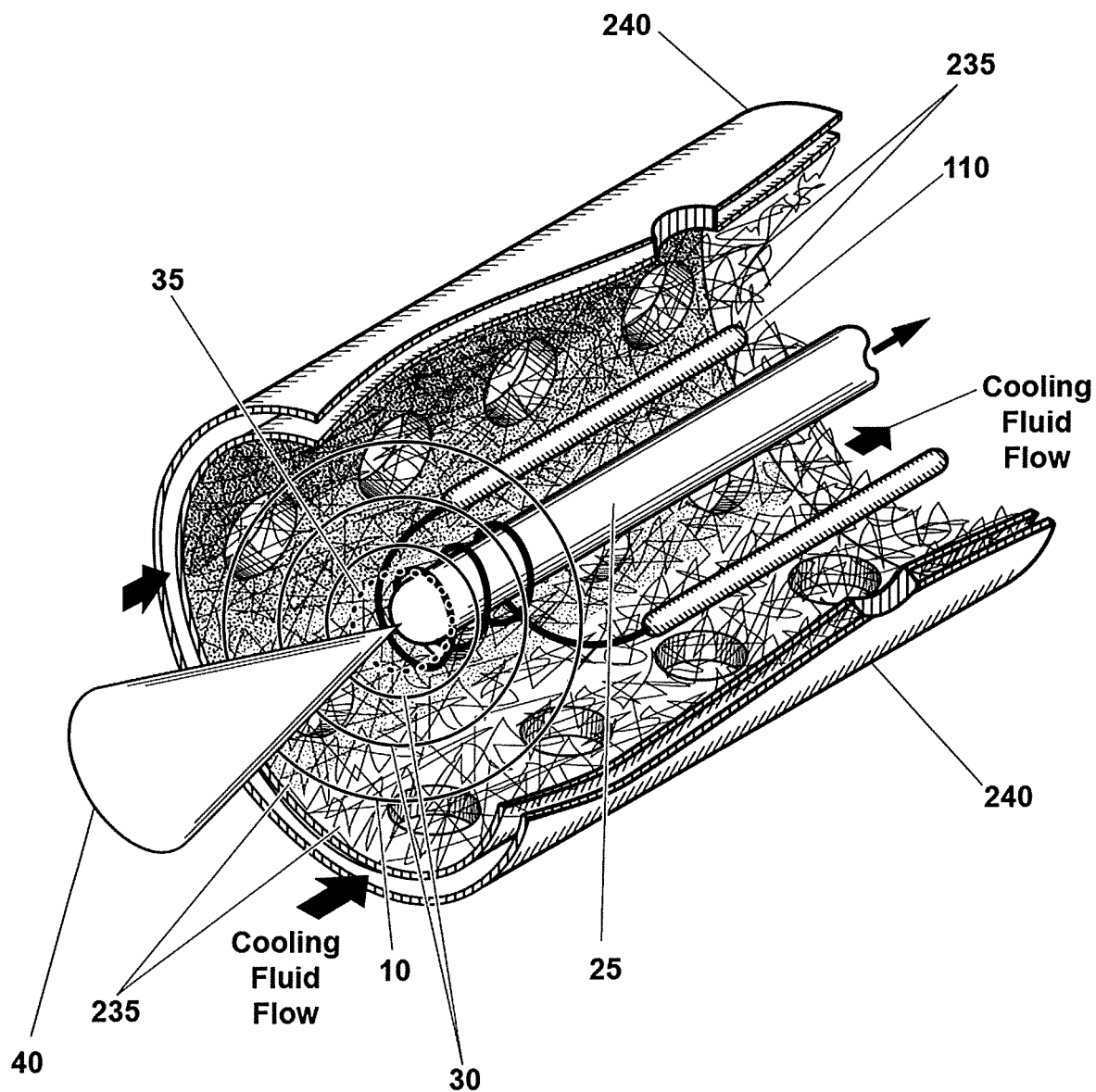
FIG. 16 shows one embodiment of the invention using a baffle.

FIG. 16 shows one embodiment of this invention using a baffle. In this embodiment, the thermal diffusion region 10 can be protected by a wool-like webbing 235 and/or baffle 240 that prevents advection from overcoming the thermal diffusion region 10. The baffle 240 may be a solid structure, or can be a solid structure with holes or perforations. In the embodiments using a wool-like webbing 235 with a baffle 240 "conduit," the wool-like webbing 235 can be on the outside or the inside of the baffle 240 "conduit". A means for cooling the gas in the outer region of the thermal diffusion region 10, or outside of the thermal diffusion region 10, can also be used, including use of a heat sink, heat pipe, or actively cooled porous surface place near/at the boundary of a thermal diffusion region 10. FIG. 16 shows a cooling fluid flow through a channel in the baffle 240 for cooling.

Figure 17:
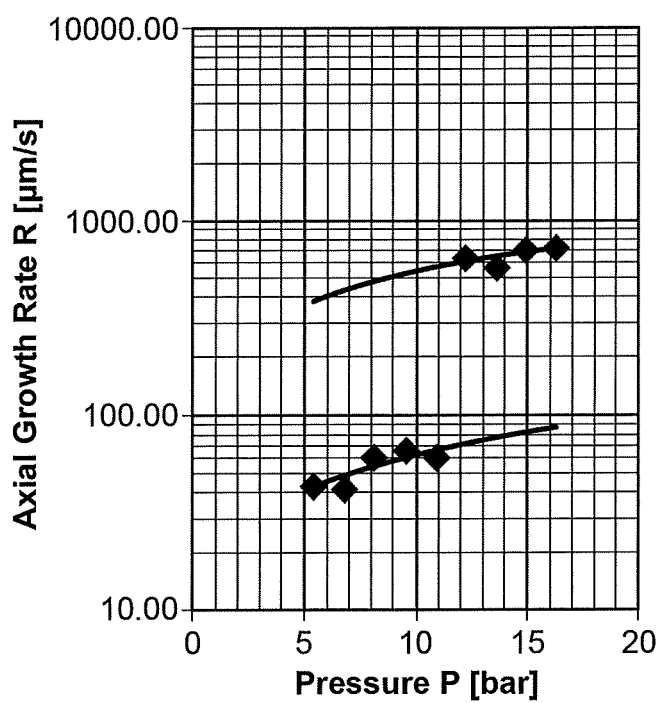
FIG. 17 is a graph showing the axial growth rate of carbon fibers using methane as the precursor, at different pressures.

FIG. 17 is a graph a graph showing the axial growth rate of carbon fibers using pure methane as the precursor, at different pressures.

Figure 18:
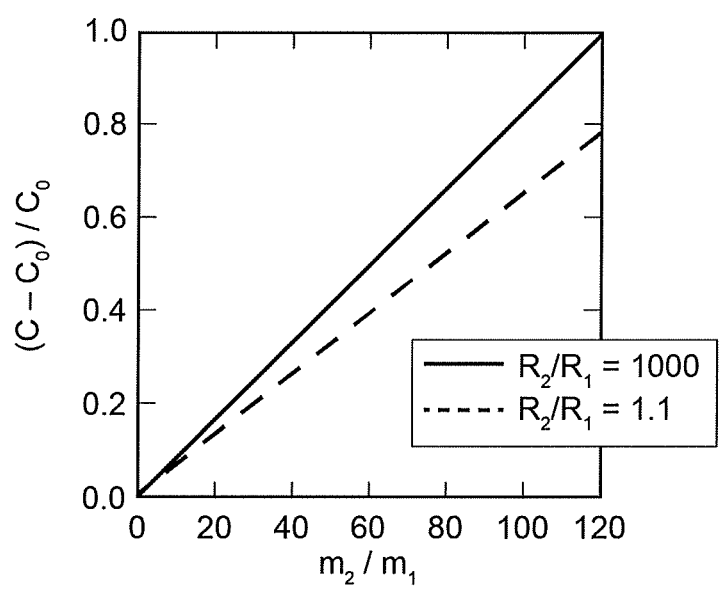
FIG. 18 shows a graph depicting thermal diffusion region separations by mass difference.

FIG. 18 is a graph depicting thermal diffusion region separations by mass difference. This provides a (normalized) measure of the separation that would be expected during fiber growth, given a spherical geometry, with all precursors as gases in the thermal diffusion region, and with constant flow. This model assumes all precursors are ideal gases and that the thermal diffusion constant (alpha) is independent of temperature, intermolecular forces, etc. Note that very large separations can occur as the ratio of the HMI mass to LMM masses increases.

FIG. 19 depicts a table of likely combinations of different material states that may be used in various embodiments of the invention. This does not consider those combinations that are practically impossible to implement due to the usual shape of the P-T phase diagram for most materials.

While the disclosure above primarily discusses decomposition and disassociation of the precursors using various heating means, it should be recognized that other methods can also be used. For example, the precursors can be decomposed chemically, using x-rays, gamma rays, neutron beams, or other systems and methodologies. Additionally, while many embodiments discuss drawing the fiber backward during fabrication, and largely keeping the reaction zone stationary, it should be recognized that the fiber could remain stationary, and the reaction zone 35 and/or thermal diffusion region 10 moved. For example, the placement of the primary heating means(s) 40 can be moved. In one embodiment using a stationary fiber, if a laser beam is used as a primary heating means 40, the direction/orientation of the laser beam can be changed, the laser can be placed on a moveable, translatable mount, or various optics and lenses can be used to alter the focus of the laser. Similarly, if heated wires are used as the primary heating means 40, the wires can be moveable and translatable such that the thermal diffusion region 10 and/or reaction zone 35 can be moved.

Additionally, while the disclosure primarily relates to and utilizes LMM precursors and HMM precursors having highly disparate molar masses, the modulation of the thermal diffusion region 10 and/or reaction zone 35, can still be utilized, and highly beneficial, for many different types of precursors, even when their respective molar masses are not substantively different.

Recording Information on Modulated Fibers, Microstructures, and Textiles and Device for Reading the Same As further described herein in some embodiments, methods and systems are disclosed for recording and reading information stored on or within modulated fibers, microstructures, and textiles. It should be noted that while the HMM precursor species and LMM precursor species discussed above can be used as precursors for recording information on modulated fibers as discussed below, depending on the desired characteristics of the fibers, the precursors need not share the same characteristics discussed above with respect to the difference between the HMM precursor and LMM precursor. Indeed, some embodiments of the systems and methods for recording information on fibers and microstructures do not require use or manipulation of a thermal diffusion region. Any number of systems and methods can be used to decompose and grow fibers, including high pressure laser chemical vapor deposition and chemical vapor deposition, hyperbaric laser chemical vapor deposition, electron beam deposition, ion beams, photolysis, and various focused energy sources. Recording and reading information in a fiber-based format is novel in itself.

Figure 20A:
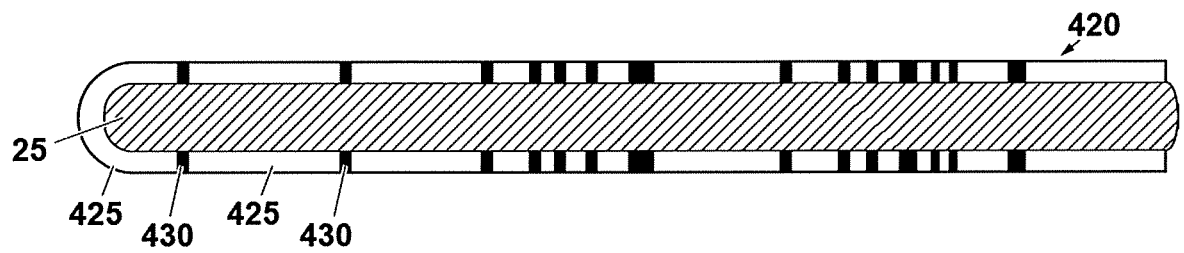
FIGS. 20 (a)-(c) show three embodiments of the invention for encoding information in or on fibers.
Figure 20B:
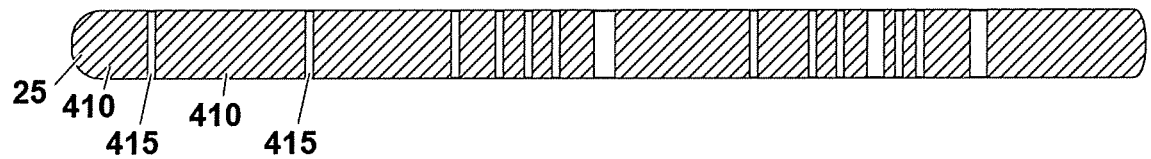

FIG. 20 depicts different means of encoding information in or on fibers 25. In one implementation, data can be represented as discrete or analog changes in a surface coating on a fiber (FIG. 20($a$)). For instance, a "0" can be represented by a first coating composition section 425, and a "1" by a second coating composition section 430. In one embodiment, only one coating composition is used on only portions of the fiber; data can be encoded through the presence/absence of a surface coating or through the variable properties of a surface coating on the fibers—which was created during or subsequent to the growth of fibers. For example, the difference in activation energies between two precursors can cause them to selectively grow in a fiber. But, depending on the radial distribution of the primary heating means (relative to the axis of the fiber), one material can grow at the core of the fiber, while the other is concentrated as a coating on the outside of the core. Through careful manipulation of the radial distribution of heating, the coating can be made to appear and to disappear. This can also be accomplished through the use of another heating means (for example, behind the first), so that the core grows only one material, but the second material is added (or not) as a coating over the first.

In another embodiment of the coating method of FIG. 20($a$), two or more coating composition sections can be utilized. These can be grown from different precursors over existing fibers, or from multi-precursor mixtures, where two coating compositions are alternately preferred on the surface of the fiber as the primary (or secondary) heating means are varied. In another embodiment the precursors are supplied in nozzles and alternated rapidly to induce alternating coatings.

Importantly, in all of these methods of FIG. 20, the lengths of the coating composition sections can also vary, which can also represent digital or analog values. Also note that although the primary embodiments shown in the figures are encoded as digital patterns, the information could also be encoded in analog compositional gradients or geometric gradients (e.g. coating composition changing slowly along the length). In addition more than two materials or geometries can be used to encode information.

In another implementation, shown in in FIG. 20($b$), the composition of the fiber itself can be varied in discrete or blended (analog) ways. For instance, a "0" can be represented by a first composition section 410, and a "1" can be represented by a second composition section 415. A specific example would be a first composition section 410 comprised of silicon and a second composition section 415 comprised of silicon carbide. Many other materials could be used; this example is for explanatory purposes only. In addition, more than two types of composition sections can be utilized, and the lengths of the composition sections can vary.

One means of encoding alternating materials vs. length is where two precursors are used to grow fibers simultaneously (as disclosed in above, and in provisional U.S. Application No. 62/074,703, entitled "Doped Carbon Fibers and Carbon-Alloy Fibers and Method of Fabricating Thereof from Disparate-Molecular Mass Gaseous, Liquid, and Supercritical Fluid Mixtures", filed on Nov. 4, 2014, and incorporated by reference herein), and these decompose at different temperatures (e.g. through a difference in rate constants or activation energies), a change in temperature can select for one material over another. For example, a silicon precursor, such as disilane ($Si_2H_6$), can be used to grow silicon fibers, but a carbon precursor, e.g. benzene, can be used to provide silicon carbide deposits. Disilane begins to decompose appreciably at 690-920 K, while benzene decomposes between 950-1200 K. Varying the reaction zone temperature during growth gives differing amounts of carbon in the deposit versus length. And since the length scale of the reaction zone is small, this temperature can be changed rapidly (on the order of femtoseconds to milliseconds). For example, in some embodiments using a laser as a primary heating means, the timing of the laser beam (or the power of the laser beam) can be controlled to change the temperature. In a similar implementation, a single precursor that bears two or more elements can be used to deposit one element at one temperature and another element at a higher temperature. For example, the precursor ferrocene, $Fe(C_5H_5)_2$, is comprised of an iron atom with two attached cyclopentadienyl ligands ($C_5H_5$). At a low temperature, the iron is separated from the $C_5H_5$ ligands and is deposited without decomposition of $C_5H_5$ ligands themselves. At a higher temperature, however, the $C_5H_5$ ligands will also decompose, adding carbon to the iron deposits. In another implementation, two precursors with widely different masses or diffusive properties can be used to select one material over another by having a high concentration of the desired material at the reaction zone during writing (e.g., fiber creation) and excluding the other. For instance, since disilane has a molecular mass of 78 amu, and methane has a molecular mass of 16 amu, one could use their differing thermal diffusivities to select for methane at the reaction zone through the thermal diffusion effect. These same characteristics of different reactions at different temperatures, differing masses, and differing thermal diffusivities exist with the different precursors disclosed above, and provisional U.S. Application No. 62/074,703, entitled "Doped Carbon Fibers and Carbon-Alloy Fibers and Method of Fabricating Thereof from Disparate-Molecular Mass Gaseous, Liquid, and Supercritical Fluid Mixtures", filed on Nov. 4, 2014, and can be used herein depending on the specific characteristics desired.

The composition-variation approach (FIGS. 20 ($a$) and ($b$)) can lead to multiple means of encoding and reading information, through the changing properties of the material. For instance, the change in composition could lead to bits/bytes encoded as specific electrical conductivities, dielectric constants, thermal conductivity/capacity, optical transmittance, reflectance, and/or absorbance, or selective chemical reactivity/bonding, dangling bonds, or wetting characteristics at the surface of the fibers. It could also be implemented to add small dopants into semiconducting fibers, where small additions of dopants lead to very large changes in local electrical conductivities. These various material properties would obviously need to be read in different ways, including: optically, capacitively, resistively, inductively, chemically, mechanically, etc. And more than one read-out method can be used to improve the read accuracy. The changes in composition need only be sufficient to cause detectable differences in the desired characteristic. For example, if electrical conductivity is the characteristic to be read, the materials deposited as part of the fiber preferably have sufficiently different electrical conductivities to allow for detection. The same is true for the other property characteristics, e.g., dielectric constants, thermal conductivity/capacity, optical transmittance, reflectance, and/or absorbance, or selective chemical reactivity/bonding, dangling bonds, or wetting characteristics at the surface of the fibers.

It is also possible during use of one or more precursors to induce a change in the microstructure of a fiber locally, e.g. to create more sp3-bonded carbon versus sp2-bonded carbon that can be read in various means, e.g. optically by their relative Raman peaks. Graphite (reflective) and glassy carbon (absorptive) also possess different optical properties that can be read optically. There are many different means through which changes in microstructure can be used to encode information.

Figure 20C:
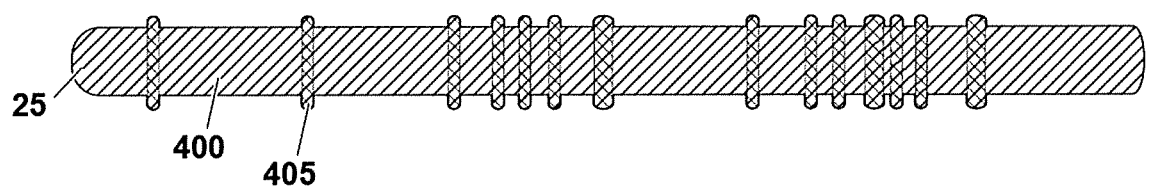

As shown in FIG. 20(c), the fiber 25 geometry can also be utilized to encode discrete or analog information, for example by creating varying fiber diameters along its length; for example, smaller diameter sections 400 can represent "0," and larger diameter sections 405 can represent "1." Alternatively, different geometry configurations can be used, for example using a circular cross-section in one section, and a square cross section in another section. Any of the different types of geometries discussed herein can be utilized. Other discrete geometric representations could also be used, e.g. specified diameters for representations of the integers between 0-255 (i.e. one diameter=1 byte of 8-bit binary data), or specified diameters for a decimal encoding system for the integers between 0 9, or representing certain letters (e.g., a, b, c. etc.). Thus, entire bytes of data can be stored in a single diameter, not just bits. Tolerances can be placed on these diameters, such that small variations in diameter will not lead to erroneous measures, similar to the CMOS or TTL voltage specifications for microelectronics signals.

A given length can be provided for each bit or byte, similar to the clock timings of microelectronic data, and start and stop bits can be created that have unique diameters or lengths to periodically re-register the length measurement so that errors do not accumulate. An analog method of data representation can also be implemented that can encode the equivalent to analog voltages versus time as fiber diameters versus length. Again, a calibrating start/stop bit can be used to more accurately read out such data. In this implementation, only a single precursor to manufacture the fiber may be required, although it is possible to employ two or more precursors to provide fibers with binary or more complex compositions. Similar analog and/or digital representations can be implemented for fibers having specific compositions and/or coatings.

Encoding in circular or spiral patterns on fibers can also be used (as coatings, compositions, or geometries), which can increase data density, although these can be more challenging to read-out. Another means of achieving data encoding in fibers is to zig-zag the fibers discretely or in a gradual fashion to represent numbers. In this case, the axis of the fiber is shifted as it is grown, relative to a known reference axis, and the distance, orientation, or angle relative to the reference axis provides the indication of which number is represented. This approach, however, generally results in a lower encoding rate than diameter modulation.

It is important to note that a secondary heating means (in addition to the primary means) can be used to heat the gases locally and change the outcome of the fiber deposition in a rapid way. Thus, for instance, a focused laser beam can be combined with a heating coil; the laser beam induces the primary growth, while the coil can change the composition, microstructure, or geometry locally by heating the fiber inductively. In this example, the coil could perform grain refinement to change the microstructure, or zone refinement of a dopant within the fiber or as a coating on the fiber. Due to the small size of the fibers, these processes can occur rapidly. A secondary heating means can take many forms, including: wire(s), electrode(s), laser beams(s), etc. Several possible implementations of heating means are shown in FIGS. 21-24. The secondary heating means, if provided as a coiled wire geometry, can also induce magnetic fields, which can be encoded into the orientation of the material within/on a growing fiber (or coating).

Figure 21:
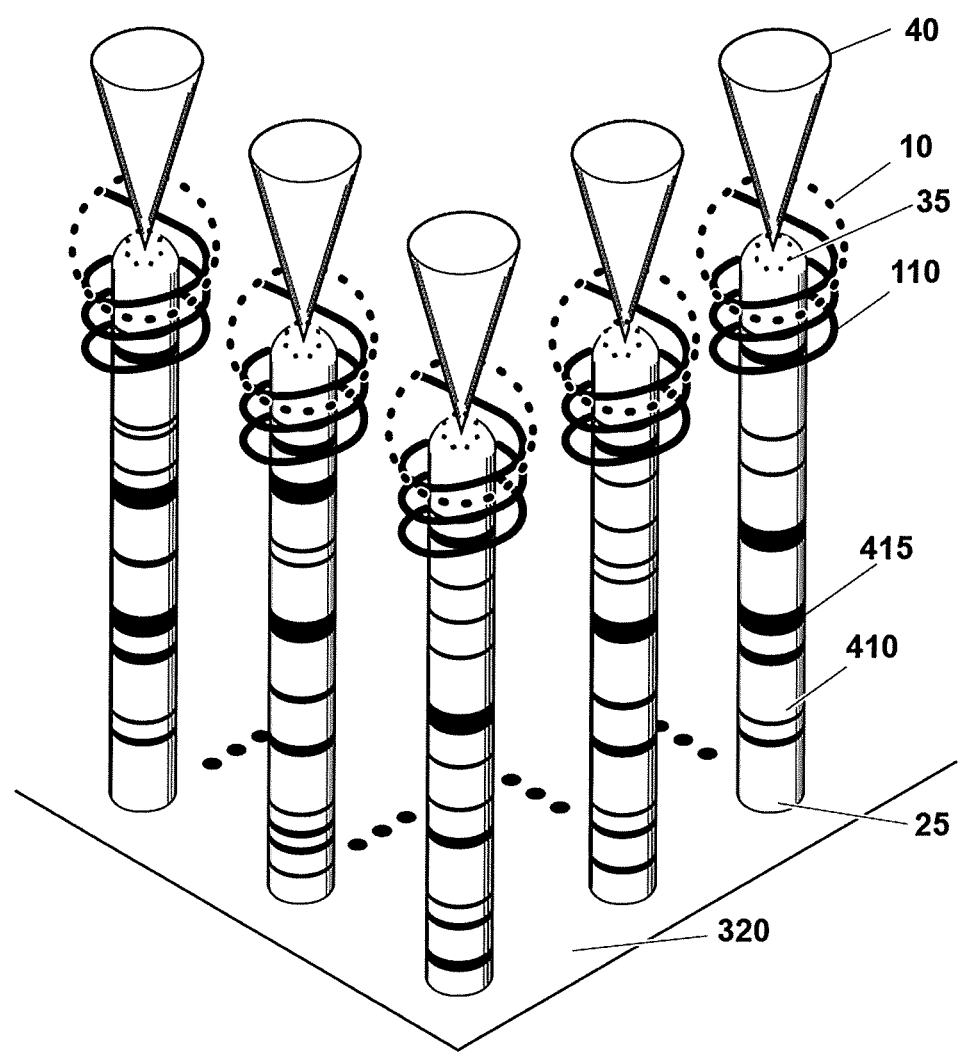
FIG. 21 shows one embodiment of the invention using a laser as the primary heating means and a secondary heating means (wire) to create a fiber where the composition of the fibers is modulated along the lengths of fibers to record information.

For example, FIG. 21 shows one embodiment of the invention using a laser as the primary heating means 40 and a wire 110 as a secondary heating means 40 to create a fiber 25 where the composition of the fibers is modulated along the lengths of fibers to record information. In FIG. 21, the fiber 25 composition is altered along its length utilizing a first composition sections 410 and a second composition sections 415. One end of the fibers 25 is attached to a substrate 320, with the other end in the reaction zone 35. The substrate 320 can optionally be detached, if the relative position of the fibers is maintained in some other fashion.

Figure 22:
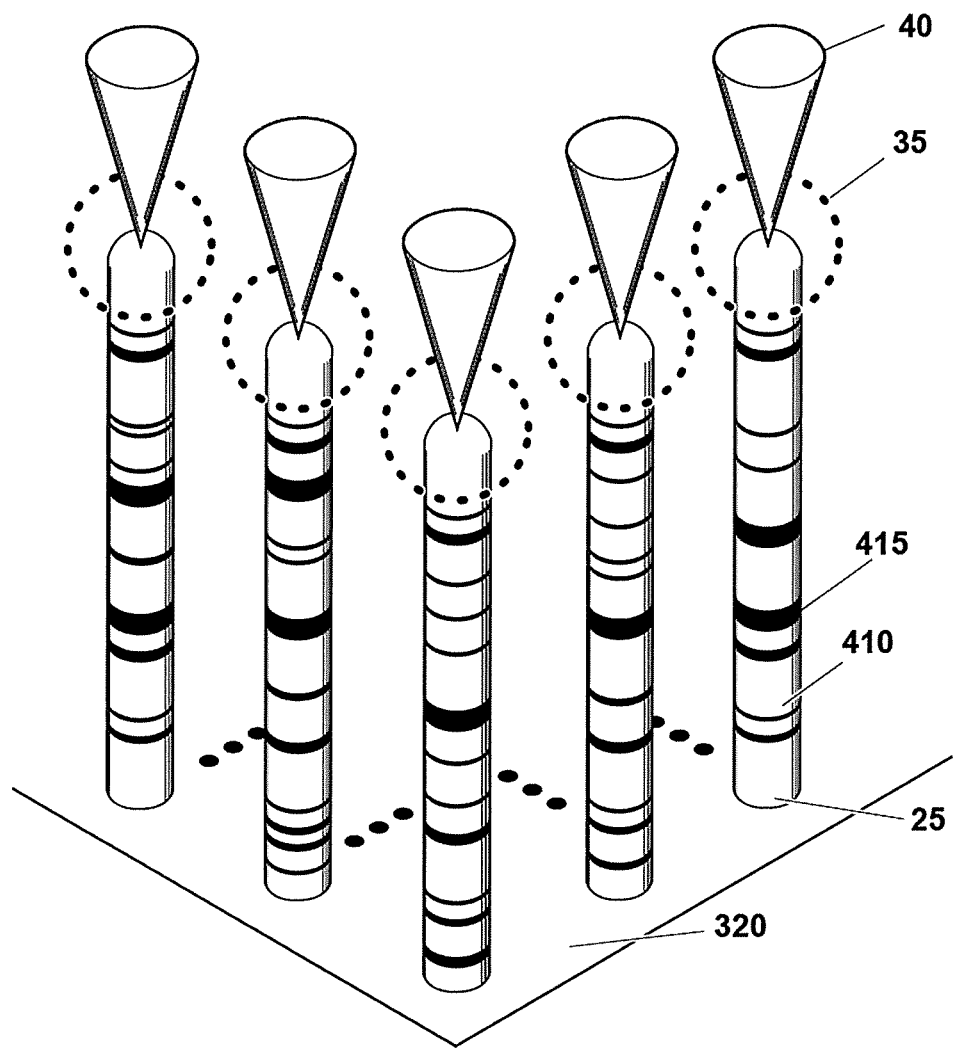
FIG. 22 shows one embodiment of the invention using a laser as the primary heating means to create a fiber where the composition of the fibers is modulated along the length of the fibers to record information.

FIG. 22 shows an embodiment of the invention using a laser as the primary heating means 40 to create a fiber 25 where the composition of the fibers is modulated (by the laser) along the length of the fibers to record information. In FIG. 22, the fiber 25 composition is altered along its length utilizing a first composition sections 410 and a second composition sections 415. One end of the fibers 25 is attached to a substrate 320, with the other end in the reaction zone 35. The substrate 320 can optionally be detached, if the relative position of the fibers is maintained in some other fashion.

Figure 23:
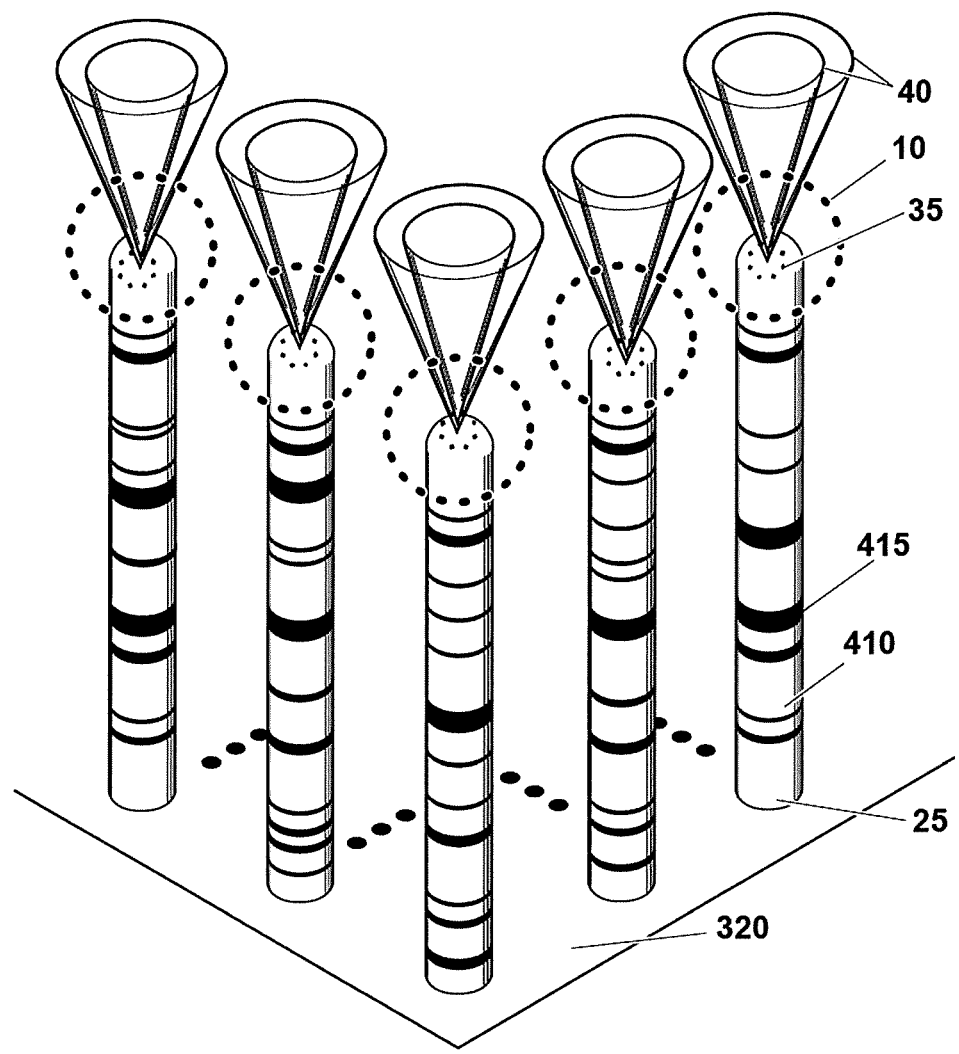
FIG. 23 shows one embodiment of the invention using a laser as the primary heating means and a laser as the secondary heating means to create a fiber where the composition of the fibers is modulated along the length of the fibers to record information.

FIG. 23 shows one embodiment of the invention using a laser as the primary heating means 40 and a laser as the secondary heating means 40 to create a fiber 25 where the composition of the fibers is modulated along the length of the fibers to record information. In FIG. 23, the fiber 25 composition is altered along its length utilizing a first composition sections 410 and a second composition sections 415. One end of the fibers 25 is attached to a substrate 320, with the other end in the reaction zone 35.

Figure 24:
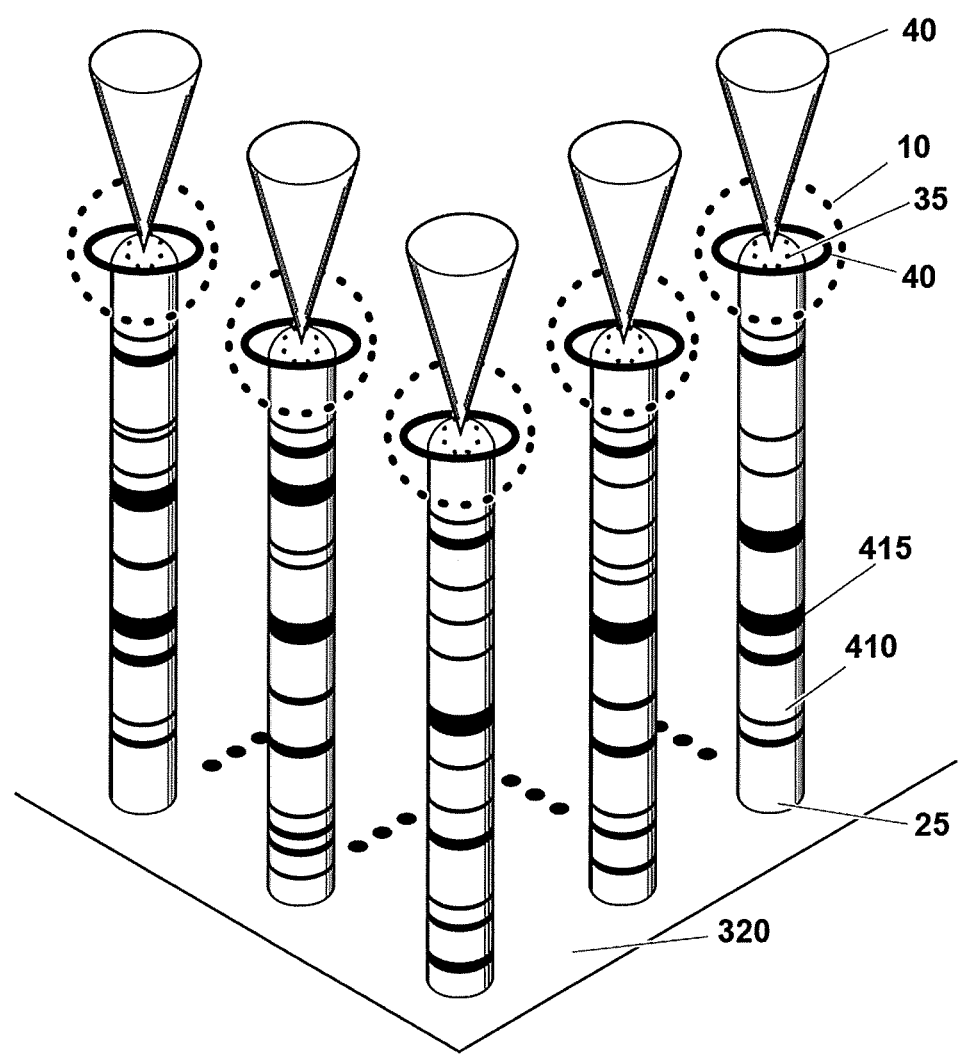
FIG. 24 shows one embodiment of the invention using a laser as the primary heating means and a secondary heating means using high pressure discharge heating with an electrode to create a fiber where the composition of the fibers is modulated along the length of the fibers to record information.

FIG. 24 shows one embodiment of the invention using a laser as the primary heating means 40 and a secondary heating means 40 using a high pressure discharge heating with an electrode to create a fiber 25 where the composition of the fibers is modulated along the length of the fibers to record information. In FIG. 24, the fiber 25 composition is altered along its length utilizing a first composition sections 410 and a second composition sections 415. One end of the fibers 25 is attached to a substrate 320, with the other end in the reaction zone 35. In any of the embodiments shown in FIGS. 21-24, varying characteristics other than the composition of the fiber can be utilized, for example, the geometry of the fibers could be altered, or a coating to the fiber can be added as described above.

One implementation that speeds up the data-encoding rate uses at least one LMM precursor (e.g. silane, $SiH_4$), and at least one HMM precursor (e.g. n-icosane, C20H42, or n-tetracontane, C40H82). It can also employ massive reactive gases (e.g. iodine) that are not intended to add a deposit element/compound to the reaction, but can modify the microstructure or geometry of the fibers by their presence, e.g. the formation of sp3- vs. sp2-bonded carbon. This particular implementation employs the thermal diffusion effect to concentrate the LMM precursor at the thermal diffusion region 10 and reaction zone 35 discussed above. Any of the various embodiments disclosed above (e.g., FIGS. 1-11) can be utilized for recording information on fibers, including but not limited to primary and/or secondary heating means used to control the reaction and fiber characteristics (e.g. diameter, microstructure, etc.).

In some embodiments, another aspect of the invention is that each fiber may (optionally) contain a calibration code, located at a designed place on the fiber, that allows it to be unique from the other fibers, but enables it to be read accurately. This also provides another means of encrypting data, and making it harder for unauthorized personnel to read-out the data. The calibration code can provide information on the type of characteristics that are to be read, sensed, or measured to decipher the code, e.g., the electrical conductivities, dielectric constants, thermal conductivity/capacity, optical transmittance, reflectance, and/or absorbance, or selective chemical reactivity/bonding, dangling bonds, or wetting characteristics at the surface of the fibers, or the length of each byte, start/stop bits, fiber diameters v. length, a calibrating start/stop bit, etc. It can also include a code key (discussed below). The calibration code and/or code key can be located in a pre-defined location in or along the fiber so that the calibration code and/or code key can be detected and read.

To Applicant's knowledge, sequential recording of information on or in fibers has not been done prior to this invention, including recording using active control a plurality of thermal diffusion regions.

Any of the various embodiments disclosed above that use or implement modulation in or around the reaction zone or thermal diffusion region or the flow of precursor using the selective conduits or switches/valves can be utilized for recording information on fibers. Examples of the modulation in or around the thermal diffusion region or the flow of precursor are shown and discussed in reference to FIGS. 9(a),(b), and 10 as examples. The ability to switch the thermal diffusion valves rapidly provides the means for rapidly modulating the composition and/or geometry of the growing fibers, especially where the fibers are also growing rapidly on the order of millimeters per second. Thus, it is possible to encode information into/onto the fibers as they are grown, providing a permanent or semi-permanent record of that information solely with the secondary heating means. This can also be done using only the primary heating means. Where hundreds and thousands of fibers are grown simultaneously, a parallel system of encoding/writing information becomes feasible. For example, where the thermal diffusion valves are modulated at 1 ms intervals, and the fibers are 8-bit diameter-encoded fibers growing at 2 mm/s, and 20,000 fibers are growing simultaneously, information can be encoded/written at a rate of 320 Mb per second. This may be slower than some hard drives available today, but approaches USB data transfer rates, and can be written in a more permanent archival form than magnetic or magneto-optical drives.

Importantly, data can be encoded on extremely stable materials, both physically and chemically, to preserve an archival record of information. For example, in the composition-encoding approach, fibers comprised of tantalum carbide, with a melting point of 3153-4100 K can be encoded with variations in the carbon concentration within the deposit of up to 2:1 (TaC versus TaC0.5). Or titanium oxide fibers can be grown, with varying concentrations of oxygen that change the opacity of the fibers to light—and the data can be read optically. Or the same system can be read by measuring the dielectric constant or resistivity of the deposit versus length.

A wide variety of different LMM precursors and HMM precursors can be employed in combination in order to obtain the desired thermal diffusion region and controlling effects. For example, for silicon deposition from an LMM precursor, hydrides could be used, including silane and disilane. While for HMM gases, precursors such as tetraiodo methane, or waxes can be used. This list is not intended to be exhaustive, and it is only for explanatory purposes. For instance, there are dozens of possible silicon precursors and wax combinations. Again, uses of LMM precursors and HMM precursors are optional.

Figure 25:
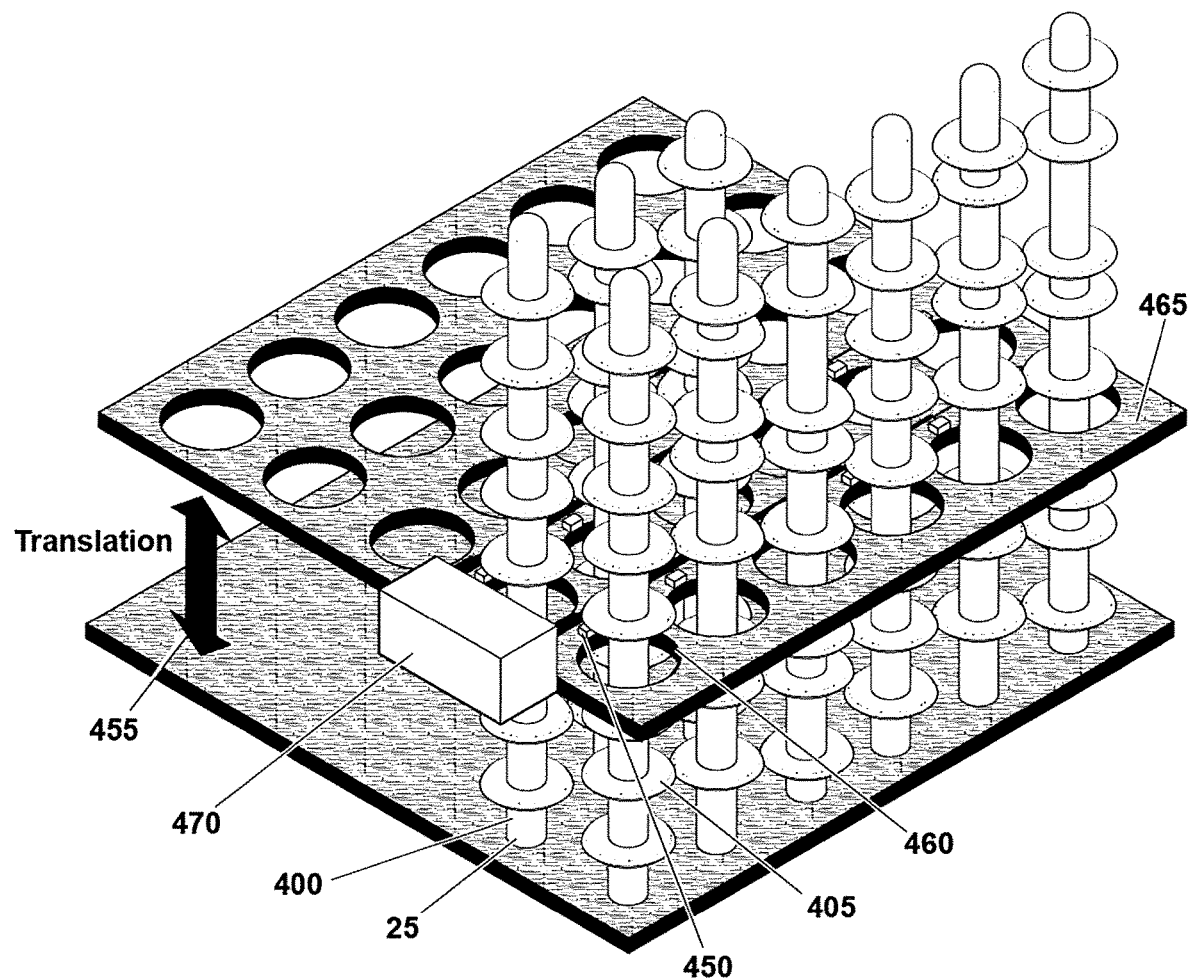
FIG. 25 shows one embodiment for a system for reading fiber states.

A device to read-out the information recorded or encoded on the fiber is also disclosed. In some embodiments, an example of which is shown in FIG. 25, the read-out system includes a sensing means (or sensors) 450, a translation means 455 (represented by the arrows) to move the sensor support surface 465, holes/apertures 460 for fibers to pass through, a sensor support surface 465 (e.g., some type of plane, surface or grid to support the sensors), and an analog/digital ("A/D") system 470 for recording the data for later use. The sensing means (or sensors) 450 can be any known or future developed sensor that can sense, detect, or read the various characteristics of the fibers discussed herein, for example, sensors or detectors that can sense, detect, read, or measure the electrical conductivity, dielectric constant, thermal conductivity/capacity, optical transmittance, reflectance, and/or absorbance, or selective chemical reactivity/bonding, dangling bonds, or wetting characteristics at the surface of the fibers, or the length or diameter of the fibers. The sensing means 450 can be electrically connected to the analog/digital system 470 or utilize other means to communicate readings to the analog/digital system 470. Examples of various sensing means were discussed above (and described as "feedback means" in the context of fabrication of the fibers), but may be different when utilized to read already-manufactured fibers than the sensing means (or feedback means) utilized for the fabrication of the fibers. The analog/digital system 470 can be computer hardware, software, or firmware that can interpret and decode the readings from the sensing means (or sensors) 450, and would be well understood to those of skill in the art. For example, if differing conductivities is used for the encoded information, the analog/digital system 470 might interpret a reading between values A and B to be a "0" and a reading between values C and D to be a "1" (in a binary application). The same is true for measurements related to dielectric constant, thermal conductivity/capacity, optical transmittance, reflectance, and/or absorbance, or selective chemical reactivity/bonding, dangling bonds, or wetting characteristics at the surface of the fibers, or the length or diameter of the fibers, and the other embodiments. As discussed above, any other discrete representations can be utilized and implemented by the analog/digital system 470, e.g., certain values or readings can be associated with, or represented by integers between 0-255 (i.e. one diameter=1 byte of 8-bit binary data), decimal encoding for the integers between 0-9, or representing certain letters (e.g., a, b, c. etc.). The analog/digital system 470 can have non-transitory memory, and be programmable, storing the values, numbers, or letters associated with particular readings from the sensing means (or sensors) 450, also referred to as a "code key." In this embodiment, the sensing means 450 are on a sensor support surface 465, which has holes/apertures 460 through which the fibers 25 can pass. The fibers 25 can be translated or moved such that different portions of the fibers 25 pass by or in the detection area of the sensing means 450. The readings from the sensing means 450 are then provided to the analog/digital system 470 for further processing. Obviously, other configurations for reading fibers are possible, for example, where the fiber is passed by the sensing means 450 without passing through a hole 460 in the sensor support surface 465.

The various code keys (if utilized) can also be utilized in the manufacture of the fibers, and in connection with the feedback means and controlling means, when depositing the encoded information. The appropriate control systems for the fiber manufacture alter the operating parameters to encode the desired information using the code key. For example, if differing electrical conductivity is used, the code key might provide that an electrical conductivity between values A and B represents a "0" and an electrical conductivity between values C and D represents a "1". If the user wants to deposit encoded information representing a data string of 010010011, the control systems of the manufacturing process (for example, the laser power, primary heating means, secondary heating means, amount of precursors, flow of precursor to the reaction zone, pressure, etc.) would be manipulated to ensure that the appropriate material is deposited at the appropriate locations that would trigger the appropriate a sensor reading. The code key can also be fabricated onto the fibers themselves for reading and use by the analog/digital system 470.

Thus, in one embodiment, a recording media is provided comprising fibers wherein the fibers have specific fiber states along the length of said solid fibers, the fiber states having known lengths (corresponding to a time duration of a signal), wherein values of said fiber states represent digital or analog values (corresponding to signal amplitudes), and wherein the combination of said known lengths and values of said fiber states encodes digital or analog information sequentially along said solid fibers. The "fiber states" can be a variety different characteristics, including (1) fiber geometries, (2) fiber diameters, (3) fiber composition, (4) fiber microstructures, (5) fiber microstructures and fiber composition, (6) physical properties, (7) chemical properties, and (8) presence, absence, or thickness of coatings on the surfaces of said solid fibers, or any combination of the foregoing.

In the embodiment wherein the "fiber state" is fiber geometry, various alternatives are available, including (a) the slopes of the surfaces of said solid fiber relative to the fiber axis; (b) the azimuthal position of the fiber growth direction relative to a known axis; and/or (c) the orientation of the fiber growth direction relative to a known axis.

In the embodiment wherein the "fiber state" is fiber composition, various alternatives are available, including (a) fiber compositions include two or more different elements/compounds, including wherein said different elements/compounds being deposited from two or more precursors with disparate decomposition rates versus temperature (b) fiber compositions include two or more different elements/compounds, including wherein said different elements/compounds being deposited from at least one multi-element-bearing precursor that yields disparate elements/compounds versus temperature.

In the embodiment wherein the "fiber state" is fiber microstructures, various alternatives are available, including where the fiber microstructures include (a) two or more allotropes; and (b) two or more solid phases.

In the embodiment wherein the "fiber state" is fiber physical properties, various alternatives are available, including optical, electrical, thermal, acoustic, physisorptive, adhesive, or mechanical properties.

In the embodiment wherein the "fiber state" is chemical properties, various alternatives are available, including chemisorptive, oxidative, reductive, reactive, bonding-, dandling bond-, or wetting-properties.

In another embodiment, a method of recording digital and/or analog information onto fibers and/or an array of fibers is provided, comprising (1) creating an array of reaction zone(s) within a vessel, wherein decomposition of at least one precursor species occurs; said array of reaction zone(s) being created by a primary heating means, the decomposition resulting in the growth of solid fiber(s) at each said reaction zone(s); (2) said solid fiber(s) having a 1st end at said reaction zone(s) and a 2nd end that is drawn backward through a tensioner 45 and spooling device/mandrel 50, at a rate to maintain the 1st end within (or near) said reaction zone(s); (3) said decomposition being modulated over time by a controlling means to create specific fiber states versus length along the growth direction of said solid fibers; (4) said fiber states having known lengths (corresponding to a time duration of a signal); (5) wherein values of said fiber states represent digital or analog values (corresponding to signal amplitudes); (6) wherein the combination of said known lengths and values of said fiber states encodes digital or analog information sequentially along said solid fibers. Thus, in some embodiments, the solid fibers can form an array that allows for massively parallel encoding of digital and/or analog information.

In another embodiment, a method of recording digital and/or analog information onto fibers and/or an array of fibers is provided, comprising (1) introducing at least one low-molecular mass (LMM) precursor species into a vessel; (2) introducing at least one high-molecular mass (HMM) precursor species into said vessel, of mass substantively greater than the LMM precursor species, and of thermal conductivity substantively lower than that of the LMM precursor species; (3) creating an array of reaction zone(s) within a vessel by a primary heating means, wherein decomposition of at least one precursor species occurs; (4) establishing thermal diffusive regions (TDRs) at/near said reaction zone(s) by a secondary heating means, to partially- or wholly-separate the LMM precursor species from the high molecular mass precursor species using the thermal diffusion effect; (5) said decomposition resulting in the growth of solid fiber(s) at each said reaction zone(s); said solid fibers being comprised of at least one element from said precursor species; (6) said solid fiber(s) having a 1st end at said reaction zone(s) and a 2nd end that is drawn backward through a tensioner 45 and spooling device/mandrel 50, at a rate to maintain the 1st end within (or near) said reaction zone(s); (7) said decomposition being modulated over time to create specific fiber states versus length along the growth direction of said solid fibers; said modulation occurring by controlling said TDRs by said secondary heating means (independent of said primary heating means); (8) said fiber states having known lengths (corresponding to a time duration of a signal); (9) wherein values of said fiber states represent digital or analog values (corresponding to signal amplitudes); and (10) wherein the combination of said known lengths and values of said fiber states encodes digital or analog information sequentially along said solid fibers.

The primary heating means can be a focused laser beam, an array of focused laser beams, inductive heating of the solid fibers, high-pressure electric discharges (e.g., plasma) and electric current through the precursor(s), focused line of laser light, and any combination of the foregoing. Other primary heating means are known to those of skill in the art and discussed herein.

The secondary heating means can be heated wire(s), wherein said heated wire(s) are heated resistively by flowing electrical currents through said wires. The secondary heating means can also be a focused laser beam, array of focused laser beams, high-pressure electric discharges and/or electric current through the precursors. Other secondary heating means are known to those of skill in the art and discussed herein. In some embodiments, the heated wires can be used to "flow" by-product species from decomposition in the reaction zone(s). The heated wires can take a variety of configurations, including but not limited to (a) where the heated wire(s) are comprised of at least two joined, but electrically separate sections, wherein the current through one said section is used to modulate the flow of low-molecular mass precursor species in real-time to the reaction zone(s), (i.e. the said section acts as a thermal diffusive valve); (b) where at least one section of said heated wire(s) is heated by a laser beam, and is used to modulate the flow of low-molecular mass precursor species in real-time to the reaction zone(s), (i.e. the said section acts as a thermal diffusive valve); (c) where at least one section of said heated wire(s) has attached cooling fins that may be heated resistively at their base, and is used to modulate the flow of low-molecular mass precursor species in real-time to the reaction zone(s), (i.e. the said fins act as a thermal diffusive valve); and (d) where at least one section of said heated wire(s) has attached dispersion wires that may be heated resistively to disperse the low-molecular mass precursor species along the thermal diffusive conduit, and is used to modulate the flow of low-molecular mass precursor species in real-time to the reaction zone(s), (i.e. the said dispersion wires act as an inverse thermal diffusive valve).

In some embodiments, the vessel in which precursors are introduced can also have a pressure controlling means as described above. As discussed above, the species introduced into the vessel can be in various forms. In some embodiments, all species are in the gaseous state. In other embodiments, the species concentrated at the reaction zone(s) are in the gaseous state, while all other species are in the liquid state. In other embodiments, the species concentrated at the reaction zone(s) are at the critical point or in the supercritical state, while all other species are in the liquid or solid state. In other embodiments, all species are at the critical point or are in the supercritical fluid state.

As discussed above, the sensing means (or sensors) can be used to obtain feedback of the decomposition of the precursors and the growth of the fibers, and to control secondary heating means to control the decomposition, growth, and composition of the solid fibers to encode digital and/or analog information. The sensing means (or sensors) can be of a wide variety of sensing devices/spectrometers known to those of skill in the art, including acoustical, mechanical, optical, ultraviolet, infrared, and X-ray.

In yet another embodiment, an apparatus for reading information from one or more of an array of solid fibers is provided, wherein (a) the fibers have specific fiber states along the length of said solid fibers; (b) the fiber states having known lengths (corresponding to a time duration of a signal); (c) wherein values of said fiber states represent digital or analog values (corresponding to signal amplitudes); (d) wherein the combination of said known lengths and values of said fiber states encodes digital or analog information sequentially along said solid fibers; (e) wherein said apparatus has a multiplicity of sensors located in a surface/grid; (f) said surface/grid having holes/passages through which fibers may pass; (g) said surface/grid being translatable (forward or backwards) along the length of said solid fibers (along the direction of fiber growth); and (h) said multiplicity of sensors being electrically connected to a computer or data acquisition system; wherein all said sensors can be read at a rate exceeding the Nyquist sampling criterion as said surface is translated. In some embodiments, the translation can be oscillated, to obtain multiple readings of said fibers.

Functionally-Shaped and Engineered Short Fiber and Microstructure Materials

In one aspect, this invention utilizes a new, highly flexible manufacturing process to grow short fibers from precursors. Precision, functionally-shaped, and engineered short fibers can be created through control of the process properties, e.g. heating means properties, precursor flow geometries and flow rates, local pressures, etc. as discussed herein. It should be noted that while the HMM precursor species and LMM precursor species discussed above (along with use of thermal diffusion regions) can be used as precursors for creating precision, functionally-shaped, and engineered fibers, depending on the desired characteristics of the fibers, the precursors need not share the same characteristics discussed above with respect to the difference between the HMM precursor and LMM precursor. Indeed, some embodiments of the systems and methods for creating precision, functionally-shaped fibers and microstructures do not require use or manipulation of a thermal diffusion region. Any number of systems and methods can be used to decompose and grow fibers, including high pressure laser chemical vapor deposition and chemical vapor deposition, hyperbaric laser chemical vapor deposition, electron beam deposition, ion beams, photolysis, and various focused energy sources.

Often, the primary heating means is a focused electromagnetic beam or other directed energy source, such as a laser, ion, or electron beam. However, other primary heating means can also be used, such as inductive or microwave coupling into the fiber material. The primary heating means can be modulated, shaped, or oriented to create specific geometries in the solid fibers as they are grown, rather than as an after-the-fact additional process that modifies existing fibers. In addition, more than one fiber can be grown at a time by using a multiplicity of primary heating means. For example, typical primary heating means could be an array of focused laser beams, an array of focused laser beams and a focused line of laser light, an array of high-pressure discharges, an array of electrodes that passes electric current through the precursors, an array of inductive primary heating means, and a set of resistively heated wires. And more than one primary heating means can be employed to provide additional processing flexibility.

This invention also provides for feedback control of the desired fiber characteristics, including shape, composition, and microstructure of the fiber materials, so that these characteristics can be controlled during the growth process (see FIG. 11 as one example). It provides for a method of obtaining precise fiber lengths without using cutting processes. Fibers can be grown to specific lengths, with specific diameters vs. length, and in curvilinear patterns, rather than as just straight cylinders. Several real-time feedback means and/or controlling means are used, including interferometric pattern feedback (e.g. a Fabry-Perot interferometer), adaptive optic focal-plane recognition, secondary laser beam attenuation, slit imaging/sensing of fiber lengths, knife-edge and chopper techniques (e.g. attenuation or shadowgraphy), ultrasonic measurements, and thermal measurements. This is not intended as a complete or exhaustive list.

Figure 26A:
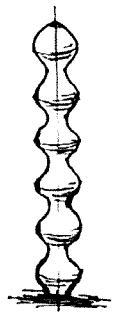
FIGS. 26(a)-(m) show a variety of different fiber shapes and configurations that can be manufactured using the disclosed systems and methods (modulated cross-sections/profiles).
Figure 26B:
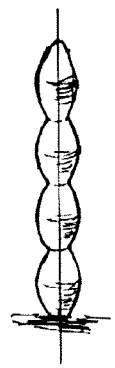
Figure 26C:
Figure 26D:
Figure 26E:
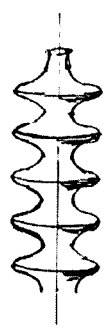
Figure 26F:
Figure 26G:
Figure 26H:
Figure 26I:
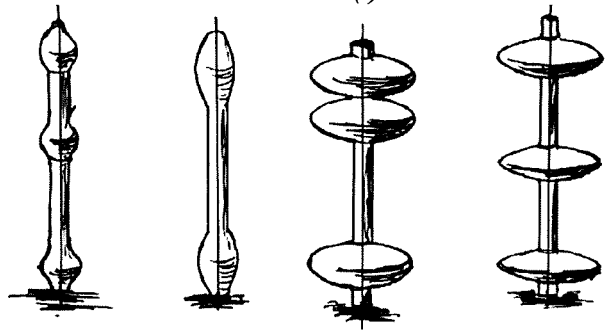
Figure 26J:
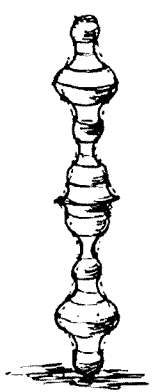
Figure 26K:
Figure 26L:
Figure 26M:
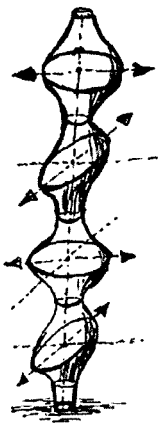
Figure 27A:
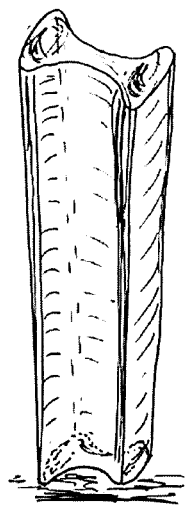
Figure 27B:
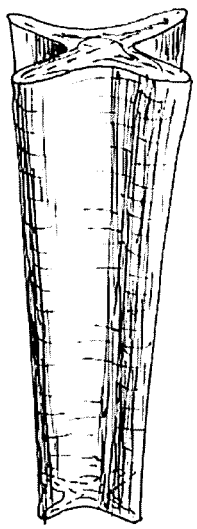
Figure 27C:
Figure 27D:
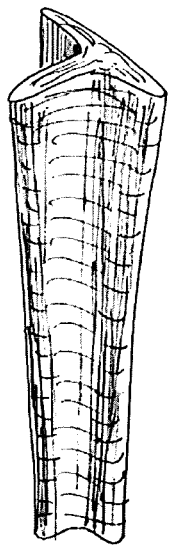
Figure 27E:
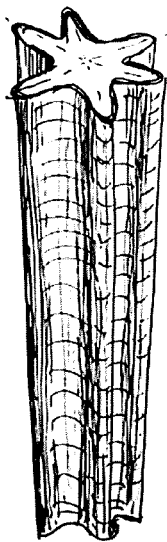
Figure 27F:

In addition to straight (cylindrical fibers), several specific fiber shapes versus length are also important for optimal composites, e.g. fibers that have sinusoidal diameter vs. length profiles (see FIG. 26(a)), or other more complex geometries. These profiles can be custom-designed for specific fiber-matrix combinations. Some periodic precision profiles that are of commercial interest are shown in FIG. 26, including (a) sinusoidal profiles vs. length (FIG. 26(a)), (b) elliptical profiles vs. length (FIG. 26(b)), (c) parabolic profiles vs. length (FIG. 26(c)), (d) hyperbolic profiles vs. length (FIG. 26(d)), (e) Gaussian profiles vs. length (FIG. 26(e)), (f) saw-toothed/ramp-like profiles vs. length (FIG. 26(f)), (g) dog-bone-like profiles v. length (FIG. 26(g)), and (h) bed-post-like profiles vs. length (FIG. 26(h)). Importantly, these profiles can be periodically added to straight fibers, such as the representative examples shown in FIG. 26(i) having periodic sinusoidal shapes, periodic elliptical shapes, periodic multi-frequency shapes, periodic parabolic shapes, etc. Or, one or more profile geometries can be modulated onto another profile, creating more complex profiles with additional functionality. For example, a sinusoidal variation can be superimposed on a hyperbolic profile—i.e. a sinusoidal hyperbolic geometry—to create a fiber such as that shown in FIG. 26(j); this fiber would have high pull-out strength due to the dog-bone shape (one would have to shear off the protrusions for it to slip) and at the same time have increased surface area due to the sinusoidal variations which creates additional adhesion at the interface. Lastly, arbitrary profiles, with randomized diameters can be created (FIG. 26(k)), which provide for statistical randomization of adhesion of a fiber within its matrix (or randomization of other properties). Even simple fractal profiles are possible, where at least one pattern repeats at different length scales (see FIG. 26(l)). Additional variable shapes can also be combined, as shown in FIG. 26(m).

In addition, the cross-sections of fibers need not be circular, but could be grown in a wide-variety of shapes shown in FIG. 27. For example, the cross-section could be that of an I-beam (FIG. 27(a)), X-beam (cross) (FIG. 27(b)), L-beam (FIG. 27(c)), T-beam (FIG. 27(d)), or a star-like shape (namely a multi-pointed star and/or a multi-pointed stars with T-like points) (FIG. 27(e)). Further, circular (FIG. 27(f)), elliptical, triangular (FIG. 27(g)), rectangular (FIG. 27(h)), hexagonal (FIG. 27(i)), polygonal, arbitrary (FIG. 27(j)) and/or modulated (FIG. 27(k)) cross sections can be grown. This is not intended as an exhaustive list of different cross sections that can be utilized. This can potentially increase the strength-to-mass ratio of the reinforcing fibers in desired directions.

Figure 28A:
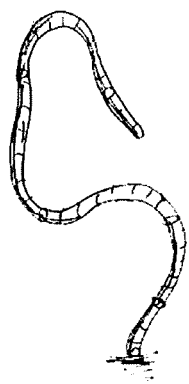
Figure 28B:
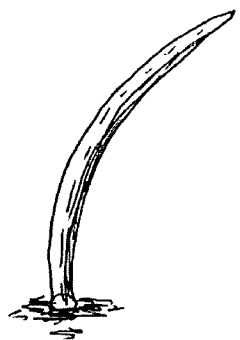
Figure 28C:
Figure 28D:
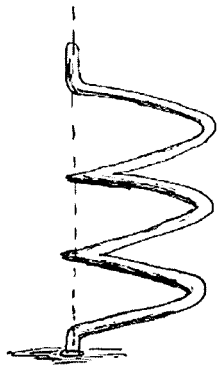
Figure 28E:
Figure 28F:
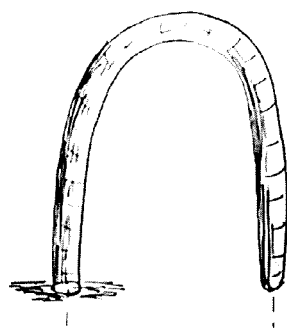
Figure 29:
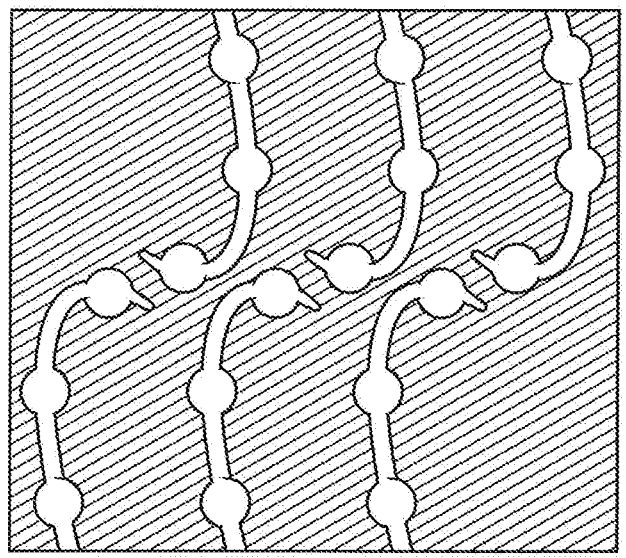
FIG. 29 shows an example of one embodiment showing a combination of profiles, shapes, and geometric orientations of a fiber within a matrix.
Figure 33A:
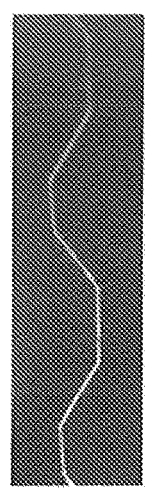
FIGS. 33(a)-(b) show zigzag-shaped fibers in accordance with one embodiment of the invention.
Figure 33B:

In addition, the growth direction of the fibers can be reoriented during deposition in a continuous fashion to create geometries not possible through any spinning or extrusion process. Just as examples, the position of the reaction zone can be altered (as described herein) or the substrate on which the fibers are being grown can be moved or reoriented. There are many possible shapes induced by reorientation and shown in FIG. 28: FIG. 28(a) shows a curvilinear shapes, FIG. 28(b) shows a gentle curves, FIG. 28 (c) shows sinusoidal shapes, FIG. 28(d) shows parabolic shapes, FIG. 28(e) hyperbolic shapes, FIG. 28(f) U-shapes, etc. These curvilinear shapes make for fibers that are grown without residual stresses in a desired shape, but that are very difficult to "pull-out" in any direction. As also shown in FIG. 28, it is possible to create fibers with "hooks" or "barbs" that will interlock with other fibers within a composite, transferring local stresses from one fiber to the next (see FIG. 28(g) for hooked shape & 28(h) for barbed shape). To further increase pull-out strength, zigzag fibers (FIG. 28(i)) and ramp-like fibers (FIG. 28(j)) can be grown. An example of zigzag fibers grown is shown in FIG. 33. In another embodiment, coiled fibers are generated that will be more flexible than a simple linear cylinder of given Young's Modulus in the same volume (and that have more surface area), potentially providing a route to stronger, tougher, and more flexible composite materials (see FIG. 28(k)). And finally, more than one pattern may be superimposed in the orientation geometry, thereby creating modulated orientations (FIG. 28(l)).

Even more complex shapes can be created by changing the intensity of the primary and/or secondary heating means, even as it is reoriented. For example, a complex curved fiber can be created with periodic undulations along its length (see FIG. 29). And it is possible to change the cross-sectional shape, even as cross-sectional size and orientation of the fiber is changed.

Figure 30:
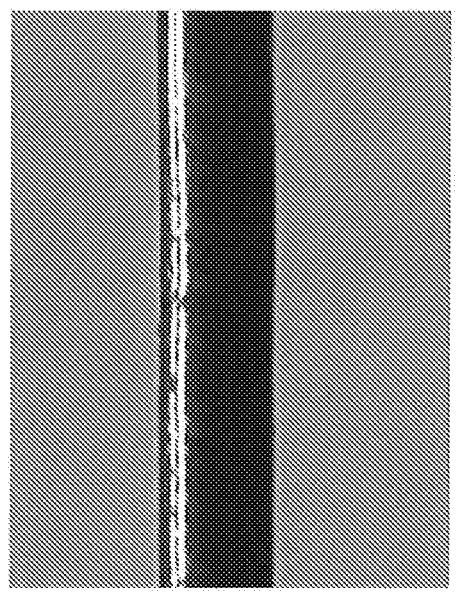
FIG. 30 shows a smooth fiber with local smoothness <100 nm per 5 microns.

Another aspect of this invention is that it inherently provides sub-100 nanometer local smoothness in the surfaces that are grown, allowing for improved bonding at the fiber-matrix interface (e.g. through Van Der Waals or Covalent bonding). This can be improved to even greater precision through feedback control of the primary and/or secondary heating means and other process parameters during the growth process as described above. The carbon fiber shown in FIG. 30 is an example of a fiber grown with sub-100 nanometer local surface smoothness. Because the fibers are not pulled through any mechanical spinning or drawing processes, they exhibit very few (if any) voids/cracks, and the material can be grown as a fully dense material. In addition, the material microstructure can be designed to be amorphous or glassy, which will give strong fibers that have more uniform properties. The material microstructure can also be that of single-crystal fibers/whiskers, which may have much greater strength than polycrystalline forms of the same material.

Figure 31A:
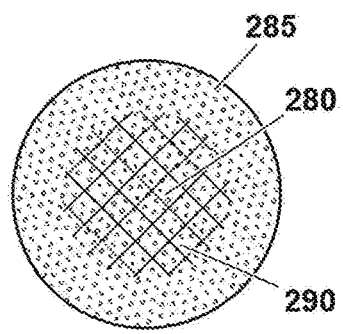
FIGS. 31(a)-(c) show material blends and anisotropic blends in accordance with one embodiment of the invention.

Another aspect of the invention is that multiple materials can be grown simultaneously to create a functionally-graded fiber. For instance, where two materials are deposited at the same time under a Gaussian laser focus, with different threshold deposition temperature and kinetics, one material will naturally be more highly concentrated in the core of the fiber, while the other tends to grow preferentially toward the outside of the fiber. However, rather than having a distinct step transition from one material to another, as would be present in a coating for example, they can be blended together with a gradual transition from core to outer material. This can create a stronger transition from core to outer material that will not separate. This permits a very strong material that might otherwise react or degrade in contact with the matrix material to be permanently protected by an exterior material that contacts the matrix material. This can potentially improve bonding between fiber and matrix materials, allow for flexible transitions between fiber and matrix, and prevent undesirable alloying or chemical reactions. There are many possible implementations of this multiple material approach, and the fibers can be functionally graded radially and axially. The method for applying the precursors can also vary. For example, they can be flowed pre-mixed or separately to create anisotropic variations in composition (see FIG. 31). FIG. 31(a) depicts a radial blend of the deposited materials, shown as a cross section of a fiber. In this embodiment, a first material 280 is concentrated at the fiber core, while a second material 285 is concentrated outside of the core. In most cases, there is a gradual transition portion 290, such that as you move away from the core, the deposited material transitions from the first material 280 to the second material 285. Additional materials could also be deposited in this fashion having a radial blend of multiple materials.

Figure 31B:
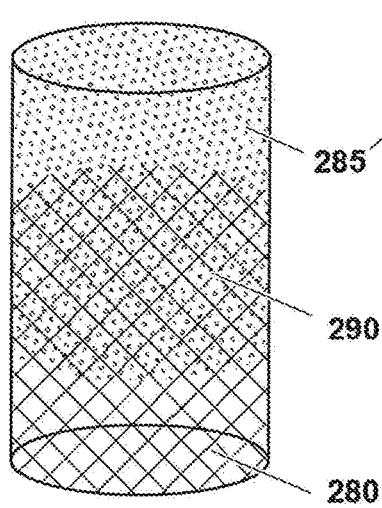
Figure 31C:
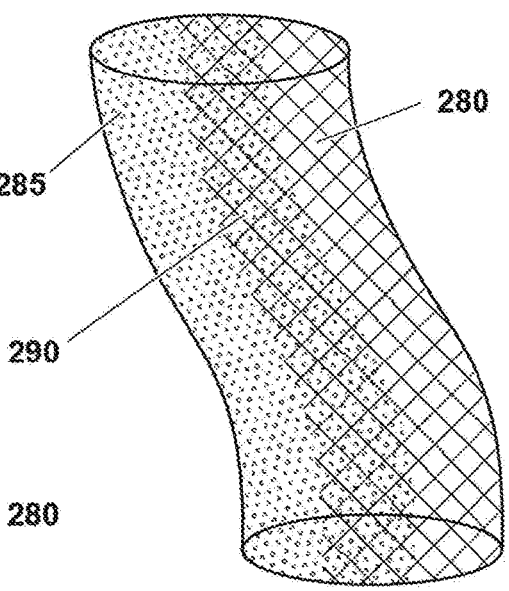

FIG. 31(b) depicts an axial blend of the deposited materials. In this embodiment, a first material 280 is deposited as the fiber. The fiber then has a transition portion 290, where the fiber transitions to a second material 285. Again, additional materials could be deposited. FIG. 31(c) depicts an anisotropic blend of the deposited materials. In this embodiment, a first material 280 is deposited in one portion of the cross section of the fiber, while a second material 285 is deposited on a separate portion of the cross section of the fiber, with a transition portion 290 separating the two materials. It should be noted that the transition portion 290 is optional, and may not be needed depending on the desired fiber characteristics, precursors used, heating conditions, etc.

Figure 32:
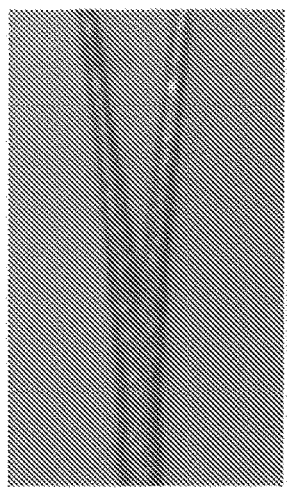
FIG. 32 shows a branched fiber in accordance with one embodiment of the invention.

Importantly, fibers can also be branched to create additional resistance to fiber pull-out. Fibers can form networks of connected strands, an example of which is shown in FIG. 32. The branched fiber shown in FIG. 32 was created using two primary heating means (laser beams) overlapping, and then moving them apart during growth to separate the reaction (or growth) zone into two reaction zones.

Figure 34A:
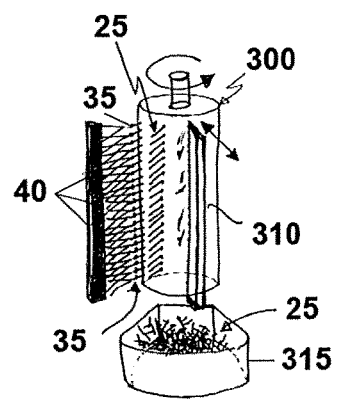
FIGS. 34(a)-(d) show various embodiments of a fiber manufacturing and collecting systems.

In some embodiments, the invention also provides for a means of collecting and removing the fibers following their growth, with optional recirculation or re-use of an initial substrate (see FIG. 34(a)-(d)). The term "substrate" is here used loosely, and includes wires, wire meshes, plates, wafers, flexible films, discs, drums, belts, coils, etc. For example, in one implementation, fibers can be grown on a substrate that has minimal adhesion to the growth material (i.e., the fibers), and a wiper blade can be used to "knock" the fibers from the substrate (FIG. 34(a)). In FIG. 34 (a), a spinning mandrel or drum 300 is shown on which the fibers are grown. The primary and secondary heating means can use the systems and methods described above to control the reaction zone 35 and other parameters of fiber growth. The embodiment shown in FIG. 34(a) shows a plurality of primary heating means 40 (lasers in this embodiment) growing a plurality of fibers. As the mandrel/drum 300 spins, the grown fibers 25 are rotated toward the wiper 310, detaching the fibers from the substrate, where they can be collected in a fiber bin 315. The movement of the mandrel/drum 300 can be controlled by the controlling means discussed above utilizing conventional industrial equipment.

Figure 34B:
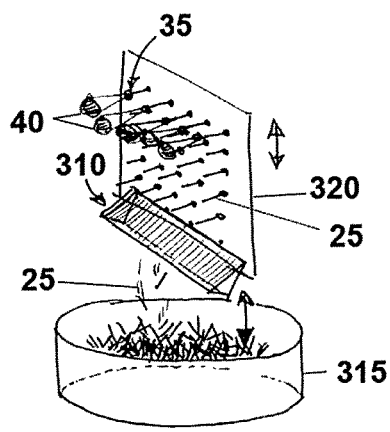

In another embodiment, shown in FIG. 34(b), fibers 25 can be grown on a moveable substrate 320, for example, one that moves vertically up and down, or that can vibrate, and with a wiper 310 or knife edge that "cleaves" them from the substrate 320. The moveable substrate 320 may be a drum or belt, or any other suitable configuration, including a standalone substrate as shown in FIG. 34(b) (for example, one that is not "continuous" like a belt or drum). Manufactured fibers 25 can also be collected in a fiber bin 315.

Figure 34C:
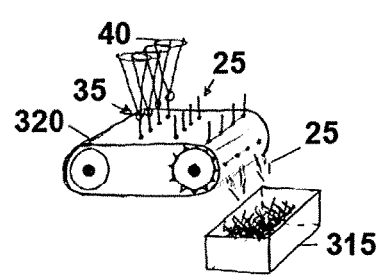
Figure 34D:
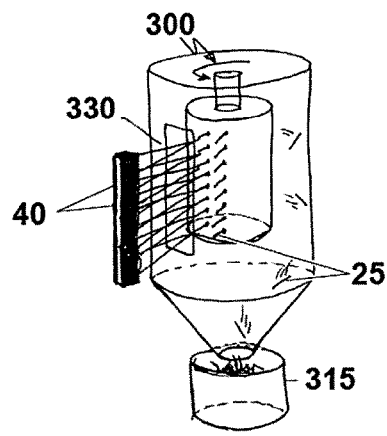

In another embodiment shown in FIG. 34(c), fibers 25 can be grown on a flexible substrate 320 configured as a belt that translates and rotates. The movement of the belt can be controlled by the controlling means discussed above utilizing conventional industrial equipment. The belt can be stopped (if needed) and fibers 25 grown in one or more reaction zones, and/or the heating means can also be moveable or redirected in a manner such that as the flexible substrate 320 moves, the heating means move or are redirected to maintain the appropriate reaction zone where the fiber is growing. When the desired growth is completed, the fibers 25 can be removed. In some embodiments, the rotation of the flexible substrate 320 around the end of the belt can drop the fibers 25 (as shown in FIG. 34(c)), or a wiper 310 or knife edge can be used (not shown).

In another embodiment, fibers can be grown on a wire, and the wire (ultrasonically) vibrated following growth to remove the fibers. In another embodiment, the fibers can be removed by flowing a fluid across the fibers. In another embodiment, electrostatic forces can be used to remove the fibers from the surface. Finally, in another embodiment, a temporary coating can be dissolved away from the substrate, removing the attachment point for the fibers.

In another embodiment, shown in FIG. 34 (d), fibers 25 can be removed by centrifugal forces. In FIG. 34(d), a spinning mandrel or drum 300 is shown on which the fibers are grown. The heating source, reaction zone and other parameters of fiber growth can be using the systems and methods described above. The embodiment shown in FIG. 34(d) shows a plurality of primary heating means 40 (lasers in this embodiment directed through a window 330 in the reaction vessel) growing a plurality of fibers 25. As the mandrel/drum 300 spins, the centrifugal forces remove the grown fibers, where they can be collected in a fiber bin 315. The movement of the mandrel/drum 300 can be controlled by the controlling means discussed above utilizing conventional industrial equipment. There are many possible implementations for removing fibers. It will be understood by those of skill in the art that the substrate on which the fibers are being grown can move or remain stationary during fiber growth. If the substrate is moving during fiber growth, the heating means can be moveable or redirectable as needed to maintain the reaction zone for fiber growth.

Following removal, the short fibers can be collected in a bin and then suctioned from the growth system with a vacuum or similar device. In another embodiment, fibers can pass through a vapor lock that prevents the precursor from leaving the reaction vessel, but moves the solid fibers through another fluid to the outside of the growth system. In another embodiment, fibers can be collected in a bin and removed through a traditional load-lock. There are many possible means of collecting and removing fibers in bulk; this is not intended as an exhaustive list.

Figure 35:
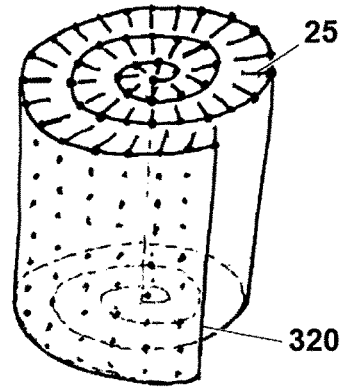
FIG. 35 shows a flexible substrate rolled up with fibers in accordance with one embodiment of the invention.

It is also possible to utilize a reusable substrate in the form of a tape, mesh, or lattice onto which the fibers are grown. This substrate may be flexible, which can be coiled up and stored for later use, as shown in FIG. 35. This roll could then be applied directly into a composite matrix material or cut/stacked and infiltrated with a matrix to create novel interwoven composite materials with fibers crossing the plane of the substrate.

Thus, in one embodiment of the invention, an engineered solid fiber material can be grown from fluid-based chemical precursors by a heating means that is less than 4 mm in cross-sectional extent/diameter, that is grown to a prescribed length, that has a prescribed cross-sectional fiber shape and size that can vary along its length, that has a prescribed composition versus radius, that has a prescribed geometric orientation versus its length, and that has a prescribed microstructure.

As described above, in some embodiments, the cross-section of the fiber can be circular, elliptical, triangular, X-shaped (cross), I-shaped, L-shaped, T-shaped, multi-pointed star, multi-pointed stars with T-like points, rectangular, hexagonal, polygonal, arbitrary, and/or modulated cross-sections. The cross-sectional fiber shape may vary along its length or it may be constant. In some embodiments, the cross-sectional fiber shape may vary along its length and repeat periodically. In some embodiments, the cross-sectional fiber shape varies along its length, and repeats periodically, and the cross-sectional fiber shape is a composite of two or more repeating profiles, and where at least one profile is modulating another. In some embodiments, the cross-sectional fiber size varies along its length while in others the fiber size is constant along its length. In some embodiments, the cross-sectional fiber size varies along its length, forming a profile that is selected from at least one of the following: (a) sinusoidal, (b) elliptical, (c) parabolic, (d) hyperbolic, (e) Gaussian, (f) saw-toothed/ramp-like, (g) dog-bone-like shapes, and (h) bed-post-like shapes. In some embodiments, the cross-sectional fiber size varies along its length and repeats periodically, forming a repeating profile that includes at least one of the following profiles: (a) sinusoidal, (b) elliptical, (c) parabolic, (d) hyperbolic, (e) Gaussian, (f) saw-toothed/ramp-like, (g) dog-bone-like shapes, and (h) bed-post-like shapes. In other embodiments, the cross-sectional fiber size varies along its length and repeats periodically, forming a repeating profile that includes linear sections with at least one of the following profiles: (a) sinusoidal, (b) elliptical, (c) parabolic, (d) hyperbolic, (e) Gaussian, (f) saw-toothed/ramp-like, (g) dog-bone-like shapes, and (h) bed-post-like shapes.

In some embodiments, the cross-sectional fiber size varies along its length and repeats periodically at more than one frequency, forming a complex multi-frequency repeating profile. In some embodiments, the cross-sectional fiber size varies along its length, forming a profile, and repeats periodically, and whose profile is a composite of two or more repeating profiles, and where at least one profile is modulating (or superimposed upon) another. In some embodiments, the cross-sectional fiber size varies randomly along its length, forming an arbitrary profile that does not repeat any particular pattern. In some embodiments, the cross-sectional fiber size varies along its length and repeats periodically, and whose profile has self-similar repeating profiles at different length scales (a fractal profile).

As described herein, the composition of the fibers can be varied depending on the desired characteristics. Thus, in some embodiments, the prescribed composition versus radius is a constant. In some embodiments, the prescribed composition versus radius varies from one or more core materials in the fiber center to one or more outer materials at the outer surface of the fiber. In some embodiments, the prescribed composition versus radius varies continuously from one or more core materials in the fiber center to one or more outer materials at the outer surface of the fiber, according to a prescribed concentration function. In some embodiments, the composition is a radial blend from core material(s) to outer material(s). In some embodiments, the composition is an axial blend from one material to another material. In some embodiments, the composition changes along a direction perpendicular to the axis of said solid fiber (e.g. a bi-morph).

As described herein, the microstructure of the fiber can be varied depending on the desired characteristics. Thus, in some embodiments, the prescribed microstructure of the fiber is amorphous or glassy. In some embodiments, the prescribed microstructure is a single crystal.

As also described herein, the orientation of the fiber can be varied depending on the desired characteristics. Thus, in some embodiments, the prescribed orientation changes along said fiber material's length. In some embodiments, the prescribed orientation changes along said fiber material's length according to at least one of the following patterns: a curvi-linear shape, a gentle curve, a sinusoid, a parabola, a hyperbola, a U-shape, hooked shapes, barbed shapes, zig-zag-like shapes, ramp-like shapes, coiled shapes, and modulated shapes. In some embodiments, the fiber material branches (or divides) from one fiber into two or more fibers during growth. In some embodiments, the fiber material is locally smooth to better than 500 nm RMS roughness over at least 5 microns of length. In some embodiments, the fiber material is grown to a pre-scribed length, to better than 5 microns accuracy.

In another embodiment, the invention relates to a method for growing one or more engineered solid fibers from a chemical precursor within a reaction zone. The fibers may be grown on a reusable substrate. The solid fibers may have a first end, and at least one second end, said first end being attached temporarily at the reusable substrate(s), said second end(s) being within said reaction zone(s). The reaction zone can be created by a primary heating means and optionally a secondary heating means. In some embodiments, the reaction zone can be modulated and controlled in real-time, thereby generating specific fiber cross-sections, profiles, and geometric orientations versus length. The specific fiber cross-sections, profiles and geometric orientations versus length can be monitored in real-time by a monitoring system (or feedback means), and used to control the manufacturing process and properties of the reaction zone(s). The length of said solid fibers may also be monitored in real-time by a monitoring system (or feedback means), and used to control the manufacturing process and properties of the reaction zone(s), thereby growing said solid fibers to predetermined terminal lengths. The fibers may be detached and collected after growth from the substrate(s) by a collecting mechanism and the substrate(s) may be recycled/reused for the growth of additional solid fibers, for example, by a recycling mechanism (e.g., a rotating drum or belt).

As described above, the precursor can be in various forms, including gaseous fluids, liquid fluids, critical-fluids, or supercritical-fluids. The substrate is preferably reusable, and preferably has a texture, composition, or surface coating that provides sufficient adhesion during growth to secure a first end to the reusable substrate, while having sufficiently limited adhesion to allow said first end to be removed by a collecting mechanism (e.g., a wiper or knife-blade). The substrate can be of various forms, including but not limited to a wire, wire mesh, plate, wafer, flexible film, disc, drum, belt, helical coil, etc.

As described herein, in some embodiments, the reaction zone(s) can be split, thereby creating additional second end(s) for each fiber, which are branched off each fiber. The primary heating means can be any of the heating means discussed above, including but not limited to an array of focused laser beams, an array of focused laser beams and a line of focused laser light, two or more arrays of focused laser beams, high-pressure discharges, electric current through said precursors, inductive heating, coupled electromagnetic radiation, and/or a resistively heated wire.

As described herein, in some embodiments, the properties of the reaction zone can be altered using the systems and methods discussed above, including but not limited to the shapes, sizes, positions, and geometric orientations of the reaction zone(s), as well as the reaction rates across said reaction zones. In some embodiments, the reaction zones are created, modulated, and controlled in real-time, by (1) a primary heating means, (2) the flow rate of said chemical precursor(s), and (3) the local concentration of said chemical precursor(s), thereby modulating the cross-sectional shape, size, composition, and microstructure of said second end(s) in real-time to achieve specific fiber cross-sections, profiles, geometric orientations, compositions, and microstructures versus length.

In some embodiments of the method for growing the fibers, the cross-sections of the fiber(s) are controlled to desired size with a tolerance of better than 500 nm over a 5 micron length, terminal length is accurate to 5 microns or less, and fibers can have any of the cross-section shapes, profiles, geometric orientations, compositions, and variations described above (e.g., varying along the fiber's length, or constant, repeating or arbitrary, etc.).

In some embodiments, the reaction zones are also modulated and controlled in real-time by a secondary heating means, as described above, which may be, but is not limited to, at least one heated wire, which is heated resistively, inductively, or through coupled electromagnetic radiation.

In some embodiments, the reaction zones may also be modulated and controlled in real-time by introducing at least one high molar mass precursor and at least one low molar mass precursor, where this mixture will at least partially separate in the presence of a thermal gradient within the reaction zone; thereby modulating the reaction rate across said reaction zone when either the thermal gradient or the concentration of either precursor is changed. It should be recognized that the use of high molar mass precursors and low molar mass precursors as described herein is not required to create the functionally shaped and engineered fiber described herein.

In some embodiments, the monitoring system (or feedback means) is selected from at least one of the following: interferometric pattern measurements (e.g. a Fabry-Perot interferometer), adaptive optic focal-plane recognition, secondary laser beam attenuation, slit imaging/sensing of fiber lengths, knife-edge and chopper techniques (e.g. attenuation or shadowgraphy), ultrasonic measurements, and thermal measurements (e.g. thermal conduction to sensors in the substrate).

In some embodiments, a collecting mechanism is used to detach the solid fibers from a reusable substrate. The collecting mechanism (or "collecting means") can take a variety of forms, including but not limited to: (1) translation and/or rotation of said reusable substrate, thereby driving said solid fibers against a wiper/blade, (2) moving a wiper/blade across said reusable substrate, (3) flexing a flexible substrate, (4) vibrating/shaking the substrate, (5) spinning the substrate to create centrifugal forces to remove said solid fibers, (6) flowing a fluid across said substrate which carries the solid fibers away, (7) using electrostatic/magnetic forces to remove the fibers, and (8) dissolution/etching of temporary coatings on said reusable substrate.

In some embodiments, a recycling mechanism can be used to cause the reusable substrate to be translated, rotated, or reoriented after a batch of said solid fibers are grown to bring said reusable substrate back into alignment with said reaction zone(s) to grow additional solid fibers. In some embodiments, the recycling mechanism causes the reusable substrate to be coated with a temporary coating after a batch of said solid fibers are grown, to grow additional solid fibers on said temporary coating. The recycling mechanism can take a variety of forms, including but not limited to: (1) collection in a bin and removal with a load-lock, (2) collection in a bin/tube and suction with a flowing fluid, (3) collection in a filter using a flowing fluid, (4) electrostatic collection on charged materials, (5) magnetic collection using magnetic materials/devices, and (5) using Van Der Waals forces and collection surfaces with high surface areas.

The substrate can be reusable in some embodiments. In some embodiments, the reusable substrate is a flexible tape or lattice that can be coiled in such a manner that said solid fibers remain on said flexible substrate and can be rolled up and stored for direct or indirect use in composite lay-ups.

Beam Intensity Profiling and Control of Fiber Internal Microstructure and Properties A means of controlling both the beam intensity profile and shape of the thermal diffusion region can be important for obtaining desired microstructures for high-quality fiber. This portion of the invention focuses on creating useful primary heating means intensity profiles that will give useful fiber properties.

There are many beneficial intensity profiles that can be generated. FIGS. 36, 38, 39, and 40 provide some examples. The simplest intensity profiles are those known to those practicing the art of beam shaping and holography: single and multimode Gaussian beams, inverse Gaussian beams, Bessel beams, Laguerre-Gaussian beams, flat-top beams, super-Gaussian beams, etc. In addition, these intensity profiles can be superimposed on overall beam focal-spot geometries, e.g. circular (donut-shaped) beams, line-shaped beams, rectangular-shaped beams, cross-shaped beams, etc.

There are many ways, some known to those skilled in the art, some less so, that can be used to generate desired beam intensity profiles for fiber growth. Methods included in this invention are: refractive and reflective field mappers that employ controlled phase-front manipulation, gratings and diffractive optics, vortex beam shapers, superposition of diode-laser beamlets, microlens diffusers, adaptive optics, spatial light modulators, liquid crystal modulators, etc. This is not intended as an exhaustive list.

Now, the incident (laser) beam intensity profile can, through heat transfer, influence the temperature rise at the fiber surface within the reaction zone 35, as well as the shape of the thermal diffusion region 10. For example, a circular laser intensity profile can heat a fiber tip at its periphery, yielding a reaction zone that is hotter at the periphery than in the center, and a thermal diffusion region that is hottest in a ring within the surrounding fluid near the fiber periphery. In contrast, a Gaussian beam intensity profile would yield the thermal diffusion region that is hottest in the center. By using a circular laser intensity profile, the thermal diffusion effect drives the by-products of reaction, not to the center of the fiber, but to its edges, allowing the fiber to grow more rapidly in the center. This removes the TDGS described previously.

Figure 36:
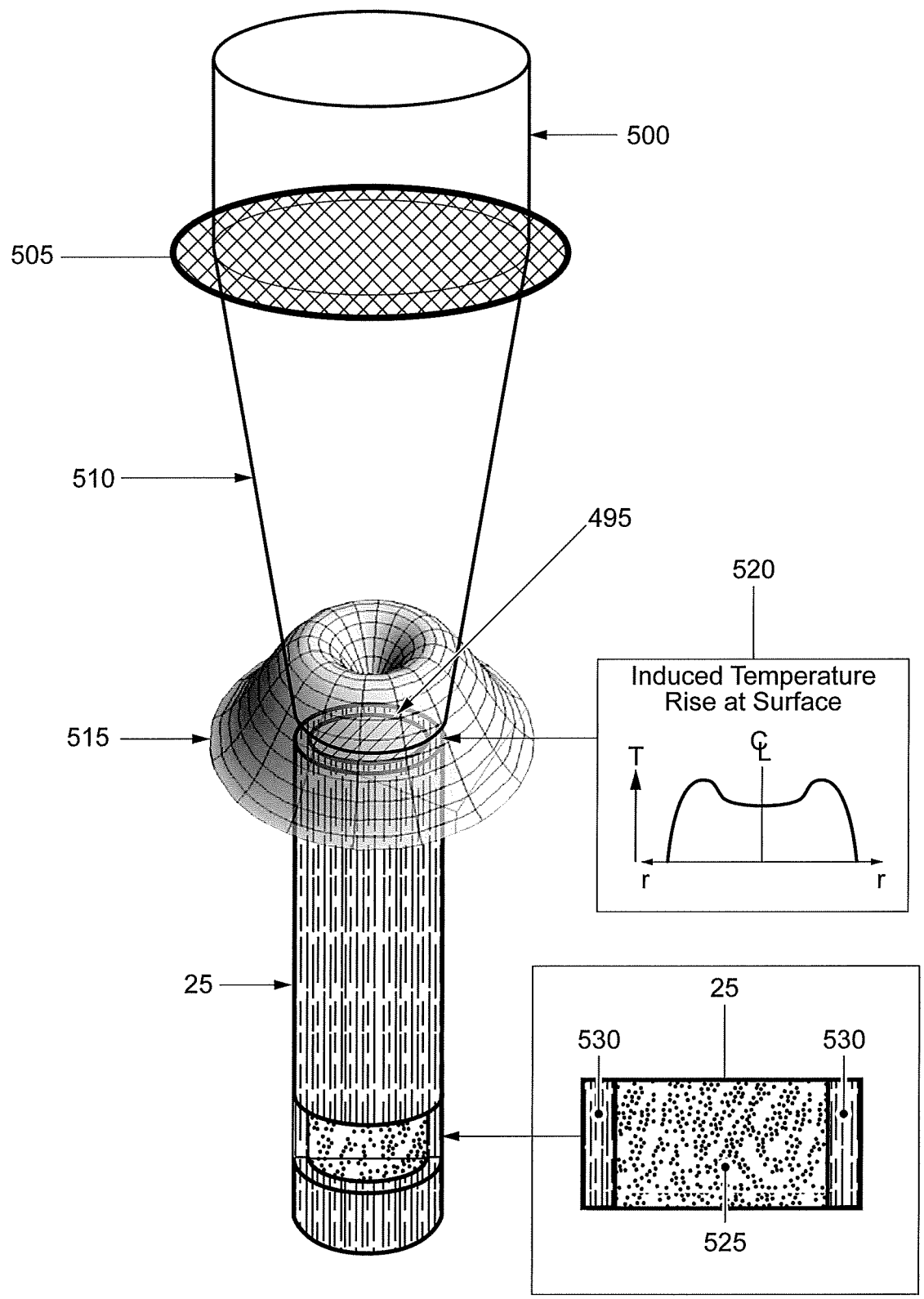
FIG. 36 shows an example of a circular beam profile (a circular profile).

For example, as shown in FIG. 36, a laser beam 500 can pass through focusing lens(es) 505 to create a focused profiled laser beam 510, resulting in a beam intensity profile 515 at its focal point. The beam intensity profile 515 has associated induced temperature rises at surface 520, where the most intense portions of the laser beam profile are associated with higher temperature rises at the surface. The beam intensity profile 515 shown in FIG. 36 is an example of a particularly useful beam profile (a circular profile), as it can change the locations where certain phases will occur in a fiber. In the example of carbon fiber growth shown in FIG. 36, the resulting fiber 25 may have amorphous carbon 525 in the core and graphitic carbon 530 around the edges (or periphery). As discussed herein, this is in contrast to the morphology of a fiber grown using a Gaussian beam profile, which would result in a graphitic core in its center, and more fined-grained phases on its periphery. Thus, one would expect the circular beam intensity profile to provide for stronger fiber material properties than that provided by a Gaussian beam intensity profile.

One subset of such a circular profile is a Bessel-shaped beam, which can be described by a Bessel function of the first kind. Only mode 1 is shown in FIG. 36, but additional modes could be used.

Most embodiments of the invention utilize such beam profiles/shapes for the first time to grow three-dimensional fibers by HP-LCVD, wherein the microstructure of the fibers are controlled to provide optimal material properties. It should be also noted that by varying the beam profile as a fiber grows, one can also induce phase and compositional changes that can be used for recording information (as discussed in another section of this application).

Figure 37A:
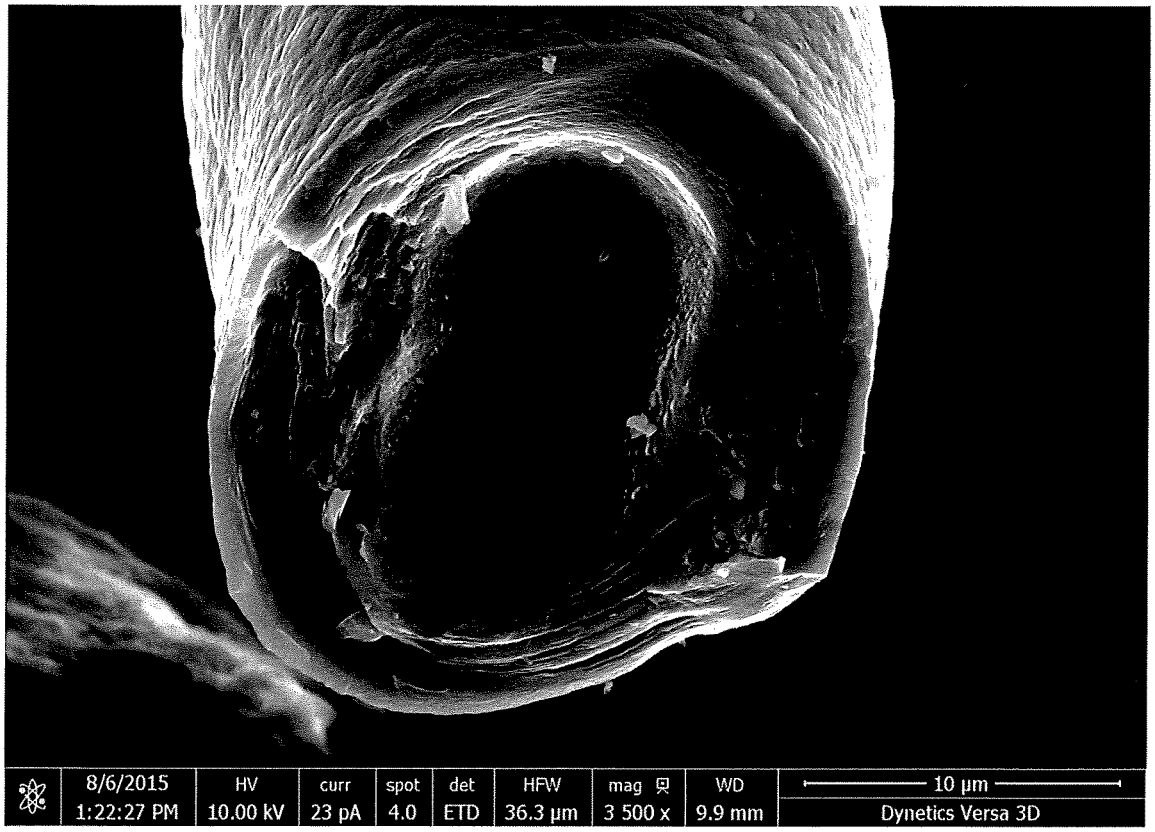
FIGS. 37 (a)-(c) show micrographs demonstrating how the microstructure of a fiber can be controlled by the beam intensity profile, and their resultant tensile test data.
Figure 37A:
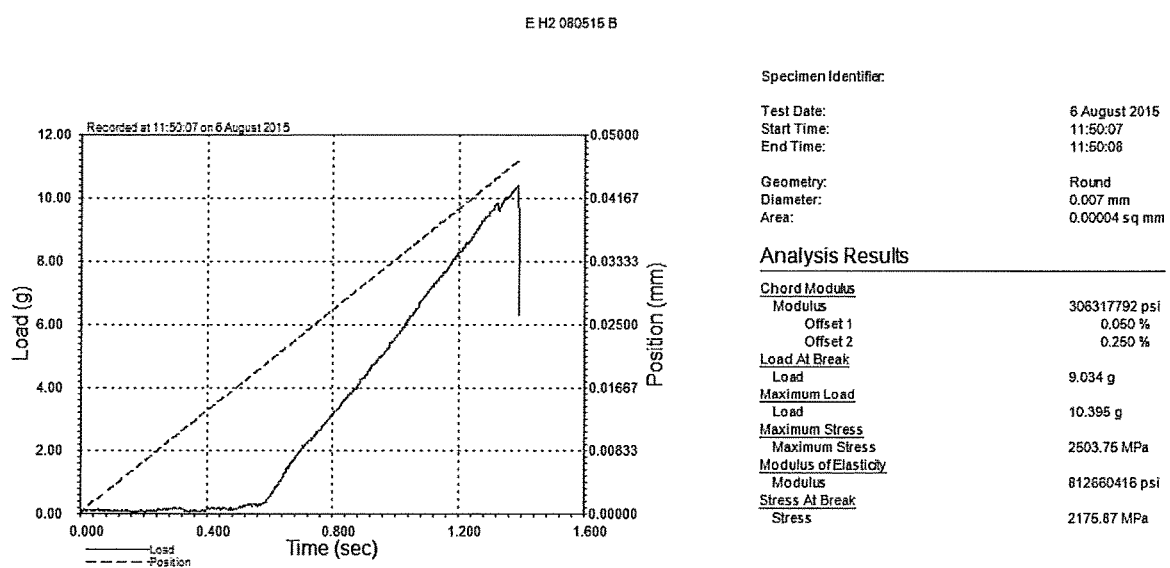
Figure 37B:
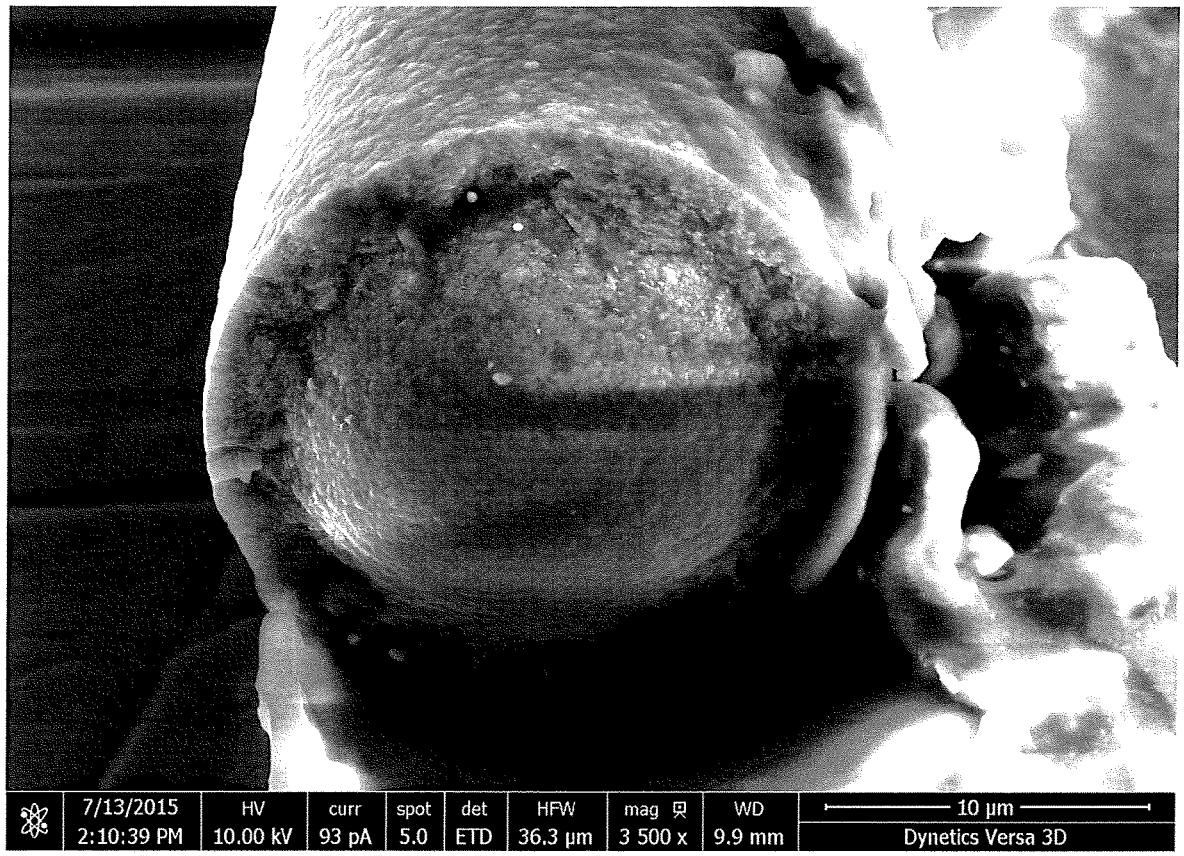
Figure 37B:
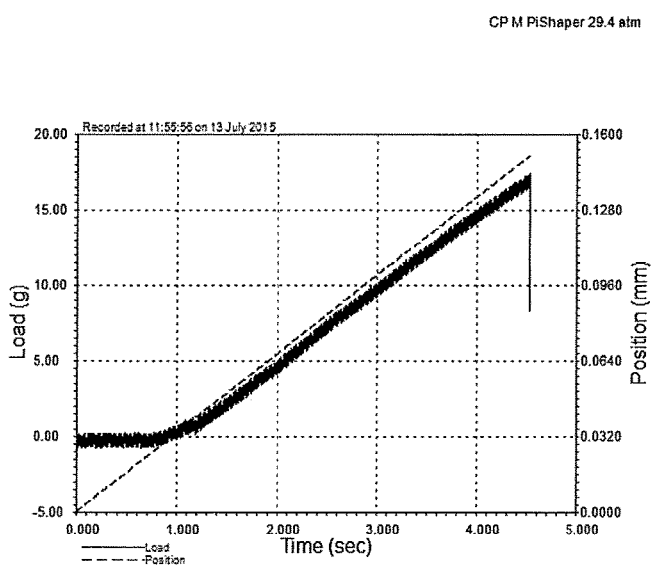
Figure 37C:
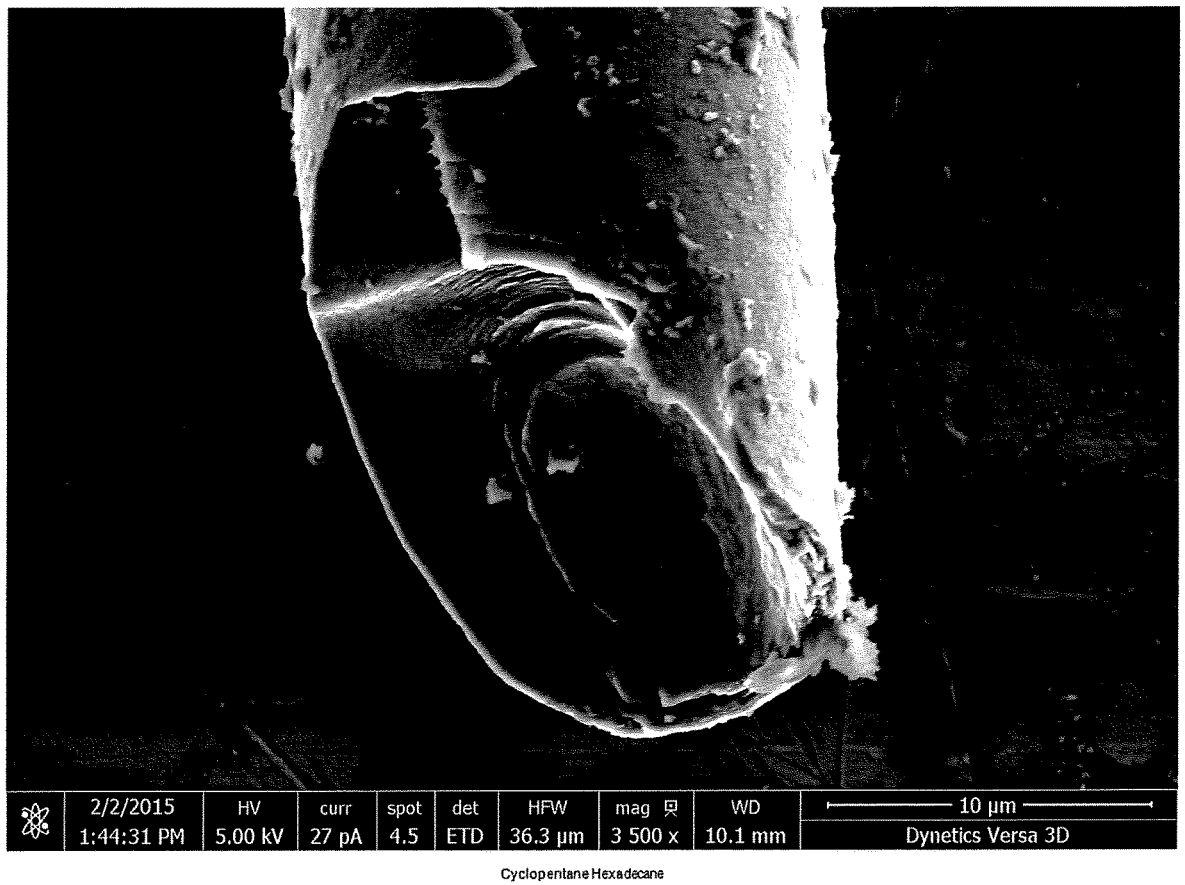
Figure 37C:
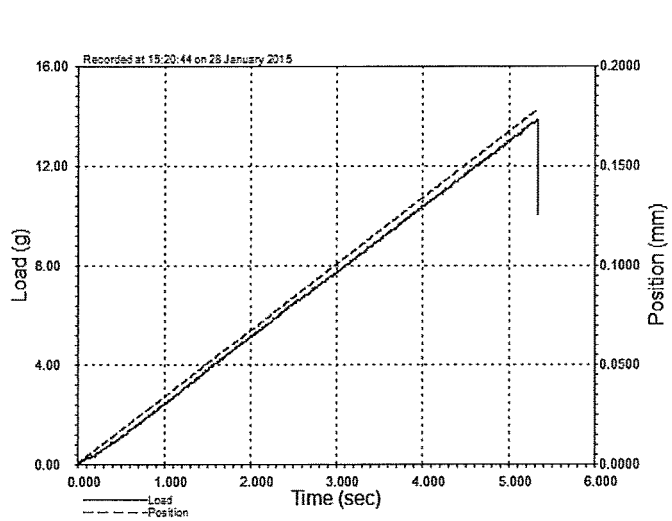

Consider the three fibers shown in FIGS. 37(a)-(c), which show scanning electron micrograph cross-sections of carbon fibers grown using three different axi-symmetric beam profiles: FIG. 37(a) shows a carbon fiber grown under a focused Gaussian beam intensity profile. This fiber has a graphitic central core and outer coating. The graphitic core is composed of parabolic sheets of graphite, whose central axes align parallel to the fiber axis. This provides little strength laterally or on axis, as the parabolic sheets can be sheared across the fiber axis from each other, or pulled apart along the axis. The outer coating is fine-grained carbon that has improved strength, but comprises little of the fiber cross-sectional area. The result is a fiber that has a poor tensile strength of only 0.598 GPa. FIG. 37(b) shows a carbon-fiber grown under a near-flat-top beam intensity profile. This also results in a core and outer fiber shell. However, now the graphitic planes are no longer extreme parabolas, but only slightly-bowed sheets that lie in planes perpendicular to the fiber axis. This orientation of the graphite also provides little strength along the fiber axis. The outer coating is fine-grained, but this again comprises little of the fiber cross-sectional area. The result is a less than optimal tensile strength of the fiber that is only 0.377 GPa. Finally, FIG. 37(c) shows the cross-section of a carbon fiber grown using a circular beam profile. This again results in a two-phase fiber, with an inner core and outer shell. However, now the graphite in the outer shell is lined-up co-axial to the fiber axis, and the fiber core is more fine-grained carbon. This provides a carbon fiber with greatly improved strength; we recently tested a carbon fiber with a tensile strength of 2.5 GPa, which is sufficient to find utility in the high-strength carbon fiber industry. This is 4-6-times the strength of the flat-top and Gaussian profiles. This demonstrates how the specific primary heating means intensity profiles can provide improved microstructural properties and phases of material within a fiber that makes the difference in the commercial utility of the fiber.

Similarly the strength of silicon carbide fibers grown by this technique can vary greatly depending on the beam intensity profile. This is because SiC can be grown in three phases: amorphous SiC, $\beta$-SiC, and $\alpha$-SiC, in order of increasing deposition temperature. Hence, where the induced temperature rises at the surface can cross phase boundaries, one will generate two or more phases in a SiC fiber. As the strength of these phases are not the same (nor even isotopic for the crystalline phases), the value of the SiC fiber for fiber reinforcement depends on how well the primary heating means is profiled. This is true not only of carbon and SiC fibers, but most materials, especially binary, ternary, quaternary, and more complex compounds/alloys.

In this invention, we offer several new methods of generating useful primary heating means intensity profiles/ geometries for fiber growth. Examples can be seen in FIG. 38-40.

Figure 38A:
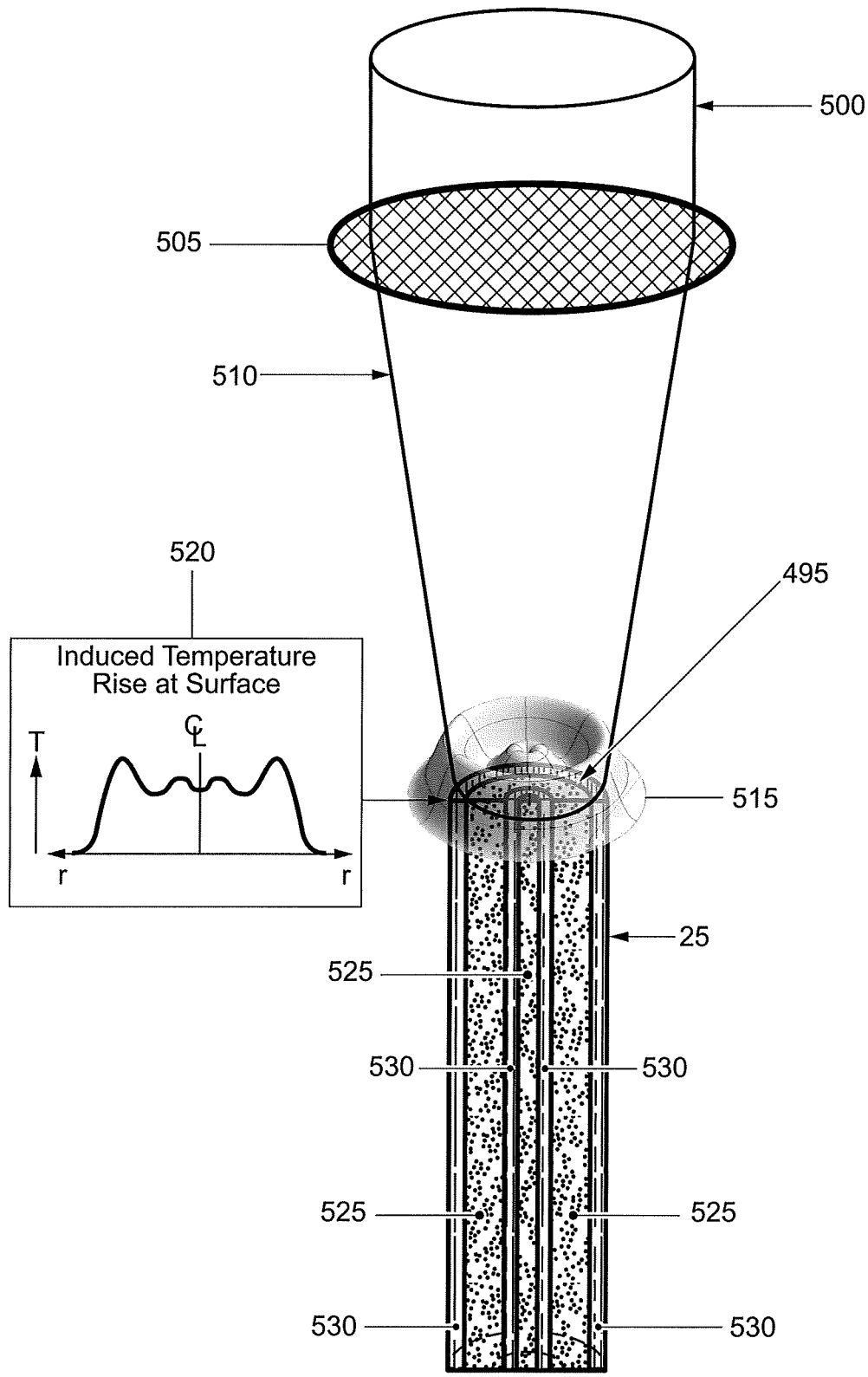
FIGS. 38(a)-(b) shows an example of beam profiles to generate a desired intensity profile at the laser focus.
Figure 38B:
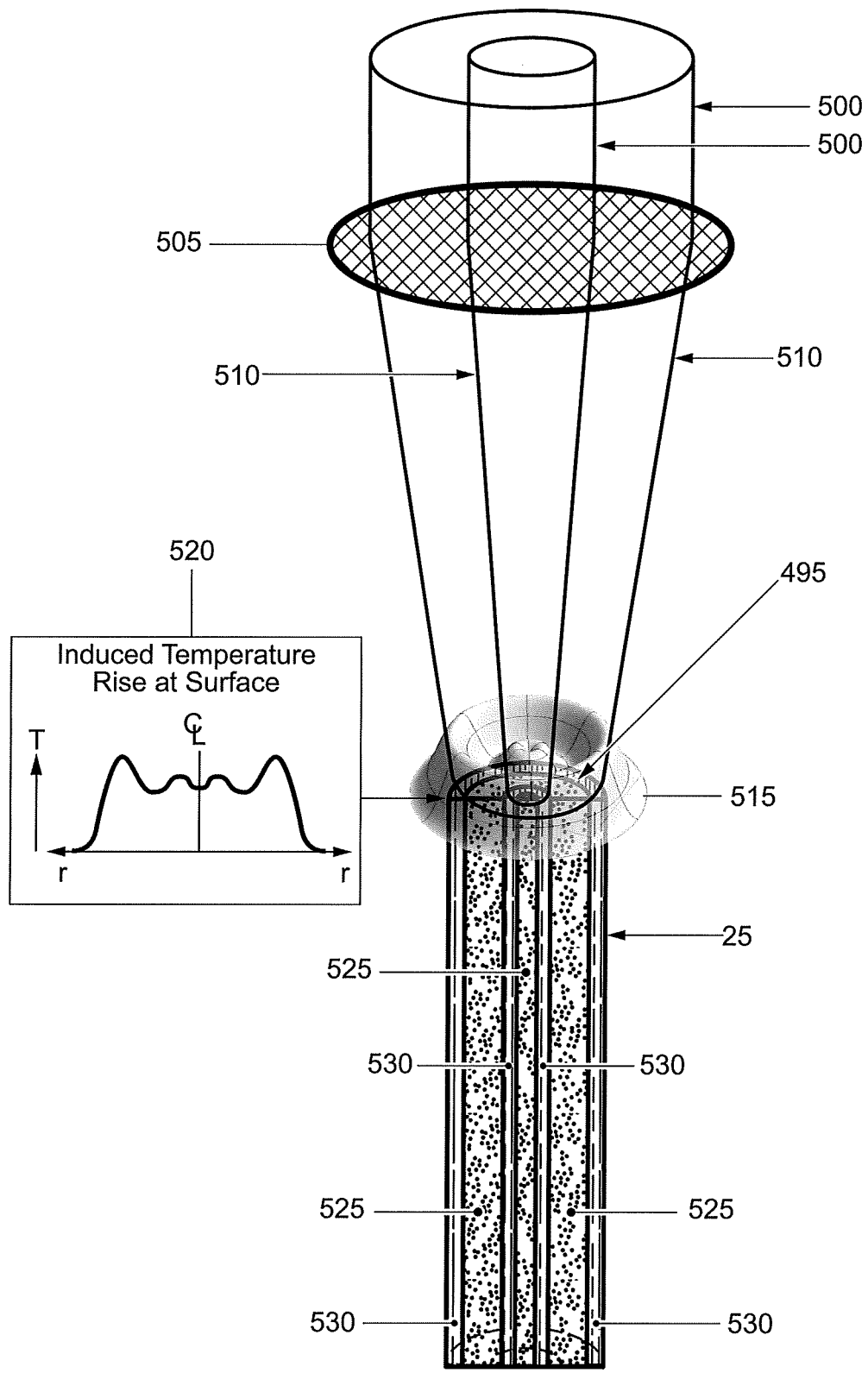

In the embodiment shown in FIG. 38(a), a Laguerre-Gaussian in the 2, 1 mode is focused by the focused profile laser beam 510 onto the fiber tip 495, generating the beam intensity profile 515 and induced temperature rises at surface 520 shown. This beam intensity profile 515 is useful for generating a multi-phase fiber with different phases aligned with the fiber axis. For instance, if a carbon fiber is grown, it could display graphitic carbon 530 layers on the outer layer and an inner layer, both aligned with the fiber axis, as shown, separated by amorphous carbon 525 or fine-grained carbon. This can provide additional strength to such a fiber. Alternatively, two or more beam modes can be combined from different beams to create a similar intensity profile. In the embodiment shown in FIG. 38(b), two means of superimposing two or more beams 500 with different beam intensity profiles 515, to create a similar beam intensity profile 515 to that in FIG. 38(a). In this case, beam #1 is a focused Laguerre-Gaussian (Mode 1, 0) beam, while beam #2 is a Laguerre-Gaussian (mode 2, 0) beam. By superimposing these two beam intensity profiles 515, we have created a dual-ring intensity profile at the focus (also referred to as a composite beam intensity profile), which can provide the multi-phase fiber described above.

Figure 39:
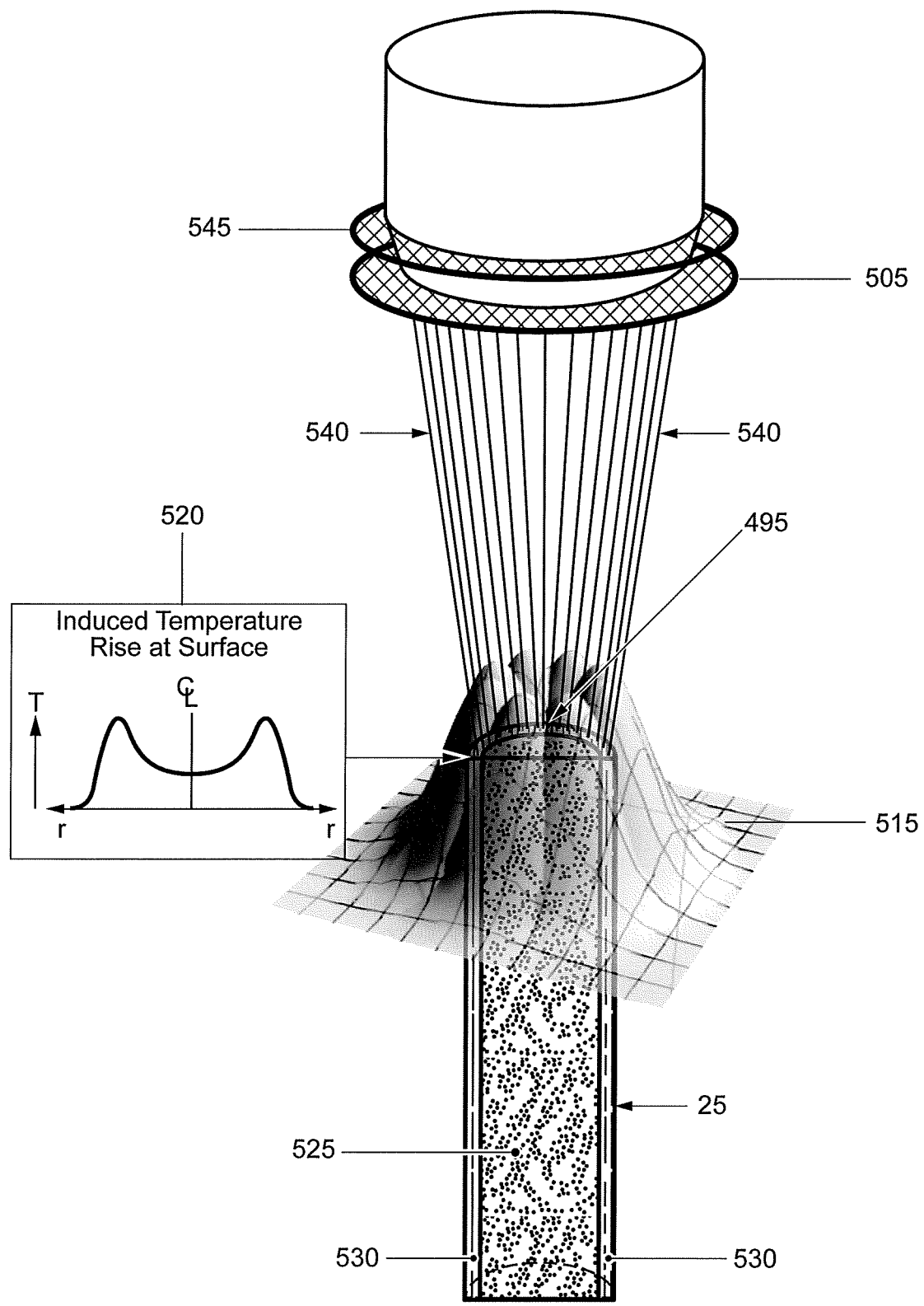
FIG. 39 shows an example of a superposition of laser beam spots that are generated by a diffractive optic to obtain an approximate intensity profile at the laser focus that is the sum of all beamlet intensity profiles generated by the diffractive optic element.

The embodiment shown in FIG. 39 depicts how superposition of many beamlets 540 can be used to approximate a more complex profile. While only 8 laser spots are created by the beamlets 540 as shown in this figure, the number of beamlets 540 can be increased until a nearly uniform "ring" is created. Heat transfer within the fiber tip 495 and in the reaction zone will tend to spread the energy deposited by each beamlet 540, which will tend to smooth the induced temperature rise at surface 520 (as shown). This technique is very amenable to the use of diffractive optics 545, microoptics, and spatial light modulators for generating the beamlets. As shown in FIG. 39, one or more lenses 505 or diffractive optics 545 can be used.

In addition, very rapid scanning of one or more "micro beamlets" onto a fiber surface can simulate a complex beam profile over an extended area. In this case, the time for the surface to cool below the deposition threshold should be much longer than the repetition rate of the micro beamlet pattern. A pulsed laser can also be used, so long as the repetition rate is sufficient.

Figure 40:
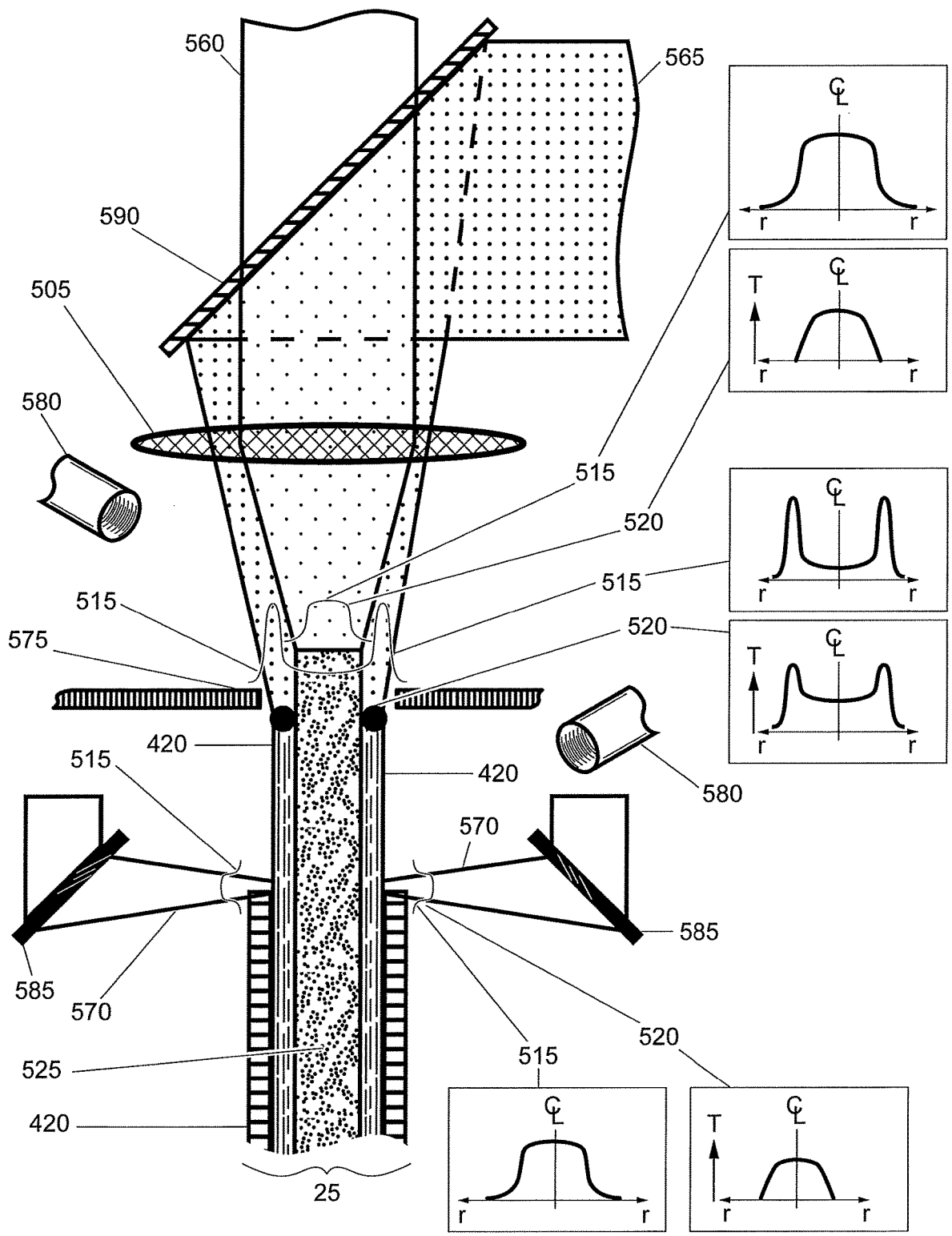
FIG. 40 shows an example of the use of multiple beams to obtain desired intensity and temperature profiles on the tip and sides of the fiber.

FIG. 40 shows one possible implementation with three examples of incident beams: (a) a first beam 560 incident at the fiber tip passing through a focusing lens 505, which generates a reaction zone and uses a flat-top beam intensity profile 515, (b) a second beam 565 incident on the fiber using a beam splitter 590, but with a beam intensity profile 515 that allows it to be focused on the sides of the fiber at some distance from the first beam 560. This second beam 565 can be co-axial with the first beam 560 or at some angle. A third beam 570 can be used that is incident on the sides of the fiber (using a circular beam intensity profile 515) at some distance from first beam 560 and/or second beam 565, that can modify the fiber material structure or add coatings 420 to the fiber surface, and can use focusing reflective or refractive optics 585. The third beam 570 can provide symmetric axial heating to create coatings 420 or surface modifications. The third beam 570 in this embodiment uses a flat-top beam intensity profile 515. In the case of coatings 420, an optional aperture 575 is provided, so that the gases in front of the aperture (for the first beam 560 and second beam 565 induced reaction zones) can be different than those behind the aperture 575, allowing a different material to coat the fiber than the original fiber material grown by the first beam 560 or second beam 565 (as FIG. 40 shows two different coatings 420). Optional nozzles 580 or gas delivery means are provided to supply precursors to the respective reaction zones. The optics 585 that provide the third beam 570 can be reflective (as shown), refractive, or diffractive. In all three cases of the first beam 560, second beam 565, and third beam 570, different beam intensity profiles 515 (each having an associated induced temperature rise at surface 520) can be used to obtain optical material phases, microstructures, and properties. This example is provided not to be exclusive of the various possible implementations, but to show how multiple beams, each profiled, when used in concert, can provide a deposition system sufficiently sophisticated to replace multi-step fiber extrusion/spinning, baking, and coating systems that are common in industry today. Within a few millimeters of the initial reaction zone of the first beam 560, the fiber has already reached its final structure and form. Other implementations could use alternative primary heating means (than a focusing laser beam), use a multiplicity of each of the various incident beams 560, 565, 570 discussed above, and use various orientations and profiles to obtain the desired surface topology, internal microstructure/phases, and fiber material properties. These profiled beam examples can also be used to modify the thermal diffusion region at each reaction zone, in order to obtain optimal growth rates, correct coating thicknesses, etc. And, of course, each of these can be modulated in real-time to obtain patterned and modulated fibers, as described elsewhere in this application. The embodiment shown in FIG. 40 has a core material of amorphous carbon 525.

Remember, a secondary heating means can also be used in conjunction with all of the profiled laser beam methods described herein. A secondary heating means can also, through heat transfer, potentially influence the temperature profile on the fiber surface. For example, a wire coil surrounding a fiber (as in FIG. 8(*b*)), if held closely to the fiber, can raise the overall temperature of the fiber, thereby reducing the power needed by the primary heating means to induce growth.

Thus any fiber deposition system is preferably designed to optimize the primary heating means profile/geometry (e.g. a focused beam) and secondary heating means geometry/profile (e.g. a conductive wire assembly). In addition, their placement on the fiber can be important. In many embodiments, these are used in concert to control both the reaction zone(s) and thermal diffusion region(s).

In some embodiments, a reaction zone is created within a reaction vessel to decompose at least one precursor, the decomposition resulting growth of a solid fiber in the reaction zone. The reaction zone is induced by a temperature rise at the surface being generated by a primary heating means and the temperature regions being controlled to have specific induced temperature rise at surface versus position and time at the surfaces of the solid fibers and within the solid fibers. As such, the fibers can be grown having specific microstructural properties by controlling the induced temperature rise at surface.

In some embodiments, the microstructural properties can be uniform across any cross section of the fibers. The cross section can also have two or more microstructural properties, and arranged to give desired physical and/or chemical properties, e.g., Young's moduli, Poisson's ratios, tensile strengths, compressive strengths, shear strengths, corrosive resistance, and/or oxidation resistance of the solid fiber.

In some embodiments, the fibers can be comprised of at least 60 atomic percent (at. %) carbon.

Various embodiments use specific beam intensity profiles versus radial position (to create induced temperature rises at the reaction zones), which can be approximately represented by functions with the following shapes: (a) flat top contours, (b) contours with central minima, (c) contours with a central depression and local central peak, (d) multiple-ring like shapes, and (e) toroidal shapes. The specific induced beam intensity profiles versus radial position can also be approximately represented by superpositions of the following functions: (a) Sinusoidal functions, (b) polynomials, (c) Bessel functions, (d) Laguerre-Gaussian functions, (e) associated Laguerre Polynomials, (f) and Hermite-Gaussian functions. Various modes of these above beams (functions) can be used solely or in concert to generate a desired intensity profile and temperature rise at the surface. For example, the beam intensity profiles can be generated from multiple Gaussian beam intensity profiles, superimposed to obtain a more globally-even temperature distribution.

The use of laser beam profiling to enhance fiber and microstructure fabrication can be implemented in any of the embodiments discussed herein, including use of LMM precursors, HMM precursors, and thermal diffusion regions. It can also be implemented for use in recording information on or in fibers and microstructures and the functionally shaped and engineered fibers. Thus, in one embodiment, a LMM precursor and a HMM precursor having substantially disparate molar masses are introduced into a reaction vessel, wherein the HMM precursor also has a thermal conductivity substantially lower than the LMM precursor. A thermal diffusion region is created at or near the reaction zone to partially or wholly separate the LMM precursor from the HMM precursor using the thermal diffusion effect, thereby concentrating the LMM precursor species at the reaction zone, and enhancing the growth of the solid fiber, and the HMM precursor species decreasing the flow of heat from the reaction zone relative to that which would occur using the LMM precursor alone. The thermal diffusion region can be at least partially created by an array of focused laser beam, with the focused laser beams are in the shape of a ring, with a maxima in a circle, and a local minimum in the center. Any of the laser beam profiles discussed herein can be used.

What is claimed is:
1. A method of fabricating fibers, comprising:
introducing a first precursor species comprising silicon and carbon into a reaction vessel;
introducing a second precursor species comprising hydrogen into said reaction vessel, said first precursor species having a molar mass at least 3 times more than the second precursor species;
creating a reaction zone within the reaction vessel and a thermal diffusion region at or near the reaction zone, wherein at least one of the thermal diffusion region and reaction zone is at least partially created by a primary heating means, and the thermal diffusion region at least partially separates the first precursor species from the second precursor species and concentrates at least one of the precursor species at the reaction zone; and
decomposing the first precursor species in the reaction zone to deposit a solid fiber.

2. The method of claim 1, further comprising decomposing the first precursor species to a derived precursor species having a lower molar mass than the first precursor species and decomposing the derived precursor species in the reaction zone to deposit a solid fiber.

3. The method of claim 2, wherein byproducts from the decomposition of the derived precursor species react with the second precursor species to form at least one intermediate byproduct species having a higher molar mass than at least one of the precursors, and wherein the intermediate byproduct species is concentrated away from the reaction zone.

4. The method of claim 1, wherein the decomposition results in a methane byproduct.

5. The method of claim 1, wherein the solid fiber comprises:
a first internal structure phase positioned at a fiber core; and
a second internal structure phase, different from the first internal structure phase, positioned outside of the fiber core.

6. The method of claim 5, wherein the first internal structure phase comprises a crystalline structure phase and the second internal structure phase comprises an amorphous structure phase.

7. The method of claim 6, wherein the first internal structure phase has grain sizes smaller than 100 nm.

8. The method of claim 1, wherein the solid fiber varies in structure phase across a cross section, wherein said cross section comprises an amorphous structure phase that transitions to a crystalline structure phase.

9. The method of claim 8, wherein the solid fiber is of uniform chemical composition.

10. The method of claim 8, wherein the solid fiber is of essentially circular cross section.

11. A method of fabricating fibers, comprising:
introducing a first precursor species into a reaction vessel;
introducing a second precursor species into said reaction vessel, said first precursor species having a molar mass at least 1.5 times greater than the second precursor species;
creating a reaction zone within the reaction vessel and a thermal diffusion region at or near the reaction zone, wherein the thermal diffusion region at least partially separates the first precursor species from the second precursor species and concentrates the second precursor species at the reaction zone;
decomposing the first precursor species to a first derived precursor species having a lower molar mass than the first precursor species and decomposing the first derived precursor species in the reaction zone, to deposit as a solid fiber in the reaction zone; and
modulating the reaction zone or flow of the first precursor species to the reaction zone.

12. The method of claim 11, wherein the solid fiber comprises a first internal structure phase positioned at a fiber core comprising a crystalline structure phase with grain sizes smaller than 100 nm and a second internal structure phase comprising an amorphous fiber structure phase positioned outside of the fiber core.

13. The method of claim 11, wherein byproducts from the decomposition of the first derived precursor species react with the second precursor species to form at least one intermediate byproduct species having a higher molar mass than at least one of the precursors.

14. The method of claim 11, wherein the decomposition results in a methane byproduct.

15. The method of claim 11, wherein modulating the reaction zone or flow of the first precursor species to the reaction zone causes a diameter of the solid fiber to vary along a lengthwise direction of the solid fiber.

16. The method of claim 15, wherein the diameter of the solid fiber varies along the length of the solid fiber and comprises one or more elongate portions of constant diameter and one or more enlarged portions.

17. The method of claim 15, wherein the diameter of the solid fiber varies at regularly occurring intervals along the length of the solid fiber.

18. A method of concentrating a precursor species in a reaction zone, comprising:
introducing a first precursor species into a reaction vessel;
introducing a second precursor species into said reaction vessel, said first precursor species having a molar mass at least 1.5 times greater than the second precursor species;
creating a reaction zone within the reaction vessel and a thermal diffusion region at or near the reaction zone, wherein the thermal diffusion region at least partially separates the first precursor species from the second precursor species and concentrates the second precursor species at the reaction zone; and
decomposing the first precursor species in the reaction zone to deposit as a solid.

19. The method of claim 18, further comprising modulating the reaction zone or flow of the first precursor species to the reaction zone.

20. The method of claim 18, wherein the first precursor species comprises silicon and carbon, and the second precursor species comprises hydrogen.

* * * * *